(12) United States Patent
Nakamura et al.

(10) Patent No.: US 8,624,379 B2
(45) Date of Patent: Jan. 7, 2014

(54) SEMICONDUCTOR DEVICE

(75) Inventors: Hiroyuki Nakamura, Kanagawa (JP); Yukihiro Sato, Kanagawa (JP); Atsushi Fujiki, Kanagawa (JP); Tatsuhiro Seki, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/610,935

(22) Filed: Sep. 12, 2012

(65) Prior Publication Data

US 2013/0082334 A1 Apr. 4, 2013

(30) Foreign Application Priority Data

Sep. 29, 2011 (JP) ................. 2011-214474

(51) Int. Cl.
*H01L 23/52* (2006.01)
(52) U.S. Cl.
USPC .............. 257/691; 257/401; 257/E23.079
(58) Field of Classification Search
USPC .................. 257/401, 691, E23.079
See application file for complete search history.

(56) References Cited

U.S. PATENT DOCUMENTS

| 6,180,966 B1 | 1/2001 | Kohno et al. |
| 2008/0054422 A1 | 3/2008 | Koike et al. |
| 2011/0215400 A1* | 9/2011 | Nakamura et al. ............ 257/334 |

FOREIGN PATENT DOCUMENTS

| JP | 10-326897 A | 12/1998 |
| JP | 2008-17620 A | 1/2008 |
| JP | 2008-60256 A | 3/2008 |

* cited by examiner

*Primary Examiner* — Hsin-Yi Hsieh
(74) *Attorney, Agent, or Firm* — Miles & Stockbridge P.C.

(57) ABSTRACT

A semiconductor device is improved in reliability. A switching power MOSFET and a sense MOSFET for sensing a current flowing in the power MOSFET, which is smaller in area than the power MOSFET, are formed in one semiconductor chip. The semiconductor chip is mounted over a chip mounting portion via a conductive bonding material, and sealed in a resin. Over the main surface of the semiconductor chip, a metal plate is bonded to a source pad electrode of the power MOSFET. In the plan view, the metal plate does not overlap a sense MOSFET region where the sense MOSFET is formed. The metal plate is bonded to the source pad electrode so as to surround three of the sides of the sense MOSFET region.

15 Claims, 29 Drawing Sheets

SEMICONDUCTOR DEVICE

CROSS-REFERENCE TO RELATED APPLICATIONS

The disclosure of Japanese Patent Application No. 2011-214474 filed on Sep. 29, 2011 including the specification, drawings and abstract is incorporated herein by reference in its entirety.

BACKGROUND

The present invention relates to a semiconductor device, and particularly to a technology which is effective when applied to a semiconductor device having a semiconductor chip in which a switching transistor and a current detection transistor are embedded.

A semiconductor chip is mounted over the chip mounting portion of a lead frame, the plurality of leads of the lead frame are coupled to the plurality of electrodes of the semiconductor chip with bonding wires or the like, a sealing resin portion is formed to seal therein the chip mounting portion, the semiconductor chip, the bonding wires, and the inner lead portions of the plurality of leads, the leads are cut from the lead frame, and the outer lead portions of the leads are subjected to bending to manufacture a semiconductor device in the form of a semiconductor package.

Japanese Unexamined Patent Publication No. Hei 10(1998)-326897 (Patent Document 1) describes a technique related to a semiconductor device in which a main cell having a trench gate to allow a main current to flow and a current detection cell having a trench gate to allow a detection current to flow are formed over the same semiconductor substrate.

Japanese Unexamined Patent Publication No. 2008-17620 (Patent Document 2) describes a technique which provides one semiconductor chip with a high-side MOSFET and a sense MOSFET which allows a current corresponding to 1/N of a current flowing in the high-side MOSFET to flow.

Japanese Unexamined Patent Publication No. 2008-60256 (Patent Document 3) describes a technique related to a semiconductor device in which a semiconductor chip having a power transistor and a semiconductor chip having a drive circuit for driving the power transistor are included in one package.

RELATED ART DOCUMENTS

Patent Documents

[Patent Document 1]
Japanese Unexamined Patent Publication No. Hei 10 (1998)-326897
[Patent Document 2]
Japanese Unexamined Patent Publication No. 2008-17620
[Patent Document 3]
Japanese Unexamined Patent Publication No. 2008-60256

SUMMARY

As a result of conducting study, the present inventors have made the following findings.

A power MOSFET capable of handling high power has been used as a switch element. By packaging a semiconductor chip formed with the power MOSFET, a switch semiconductor package can be obtained. For example, by coupling the power MOSFET as the switch element between a power source and a load and performing ON/OFF switching of the power MOSFET, it is possible to switch between a state in which an output (voltage) from the power source is supplied to the load and a state in which the output from the power source is not supplied to the load.

The present inventors have studied a semiconductor device manufactured by forming, in a semiconductor chip formed with the power MOSFET as the switch element, a sense MOSFET for sensing a current flowing in the power MOSFET which is smaller in area than the power MOSFET, mounting the semiconductor chip over a chip mounting portion via a conductive bonding material, and sealing them. The semiconductor device senses the current flowing in the power MOSFET by means of the sense MOSFET, and controls the power MOSFET in accordance with a current flowing in the sense MOSFET. For example, when it is determined that an excessive current is flowing in the power MOSFET based on the current flowing in the sense MOSFET, the power MOSFET is forcibly turned OFF to protect the semiconductor device and an electronic device using the semiconductor device.

However, when a thermal stress (such as, e.g., a thermal load during the use of the semiconductor device or a temperature cycle test) is applied to the semiconductor device, a crack or peel-off may occur in the conductive bonding material interposed between the semiconductor chip and the chip mounting portion. In the region of the conductive bonding material where a crack or peel-off has occurred, a current is unlikely to flow so that the region can hardly function as a current path. Between the current flowing in the power MOSFET and the current flowing in the sense MOSFET, a predetermined ratio exists. However, if a crack or peel-off occurs in the conductive bonding material interposed between the semiconductor chip and the chip mounting portion, the ratio varies to possibly degrade accuracy in sensing the current flowing in the power MOSFET by means of the sense MOSFET. This degrades the reliability of the semiconductor device.

An object of the present invention is to provide a technology which can improve the reliability of a semiconductor device.

The above and other objects and novel features of the present invention will become apparent from a statement in the present specification and the accompanying drawings.

The following is a brief description of the outline of a representative aspect of the invention disclosed in the present application.

A semiconductor device according to a representative embodiment is a semiconductor device in which a semiconductor chip is bonded to the upper surface of a chip mounting portion having electrical conductivity and sealed in a resin. The semiconductor chip is formed with a main MOSFET and a sense MOSFET for sensing a current flowing in the main MOSFET which is smaller in area than the main MOSFET. Over the main surface of the semiconductor chip, a conductor plate is bonded to a source pad of the main MOSFET. In a plan view, the foregoing conductor plate does not overlap a region where the sense MOSFET is formed. The foregoing conductor plate is bonded to the foregoing source pad so as to surround three of the sides of the region where the foregoing sense MOSFET is formed.

The following is a brief description of effects achievable by the representative aspect of the invention disclosed in the present application.

According to the representative embodiment, the reliability of the semiconductor device can be improved.

DETAILED DESCRIPTION

Figure 1:
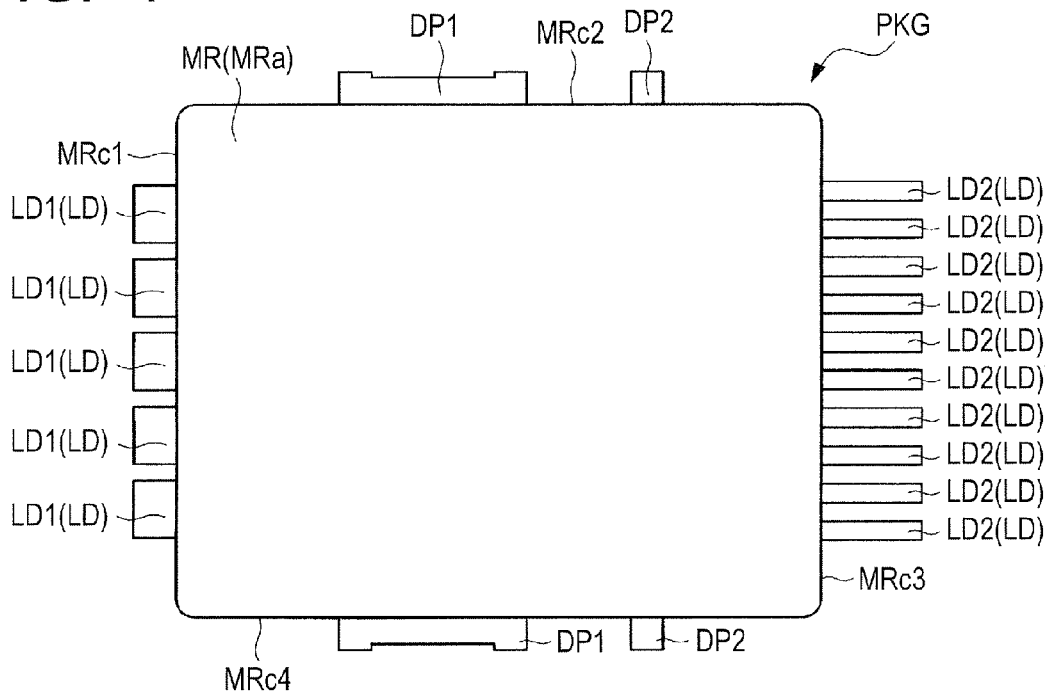
FIG. 1 is a top view of a semiconductor device as an embodiment of the present invention.

In each of the following embodiments, if necessary for the sake of convenience, the embodiment will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others. When the number and the like (including the number, numerical value, amount, range, and the like thereof) of elements are referred to in the following embodiments, they are not limited to specific numbers unless particularly explicitly described otherwise or unless they are obviously limited to specific numbers in principle. The number and the like of the elements may be not less than or not more than specific numbers. It will be appreciated that, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments of the present invention will be described with reference to the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

In the present invention, a field effect transistor is referred to as MOSFET (Metal Oxide Semiconductor Field Effect Transistor) or simply as MOS, but it is not intended to exclude a non-oxide film from examples of a gate insulating film. The MOSFET described above is not limited to a case where the gate insulating film is formed of an oxide film, but is assumed to include a MISFET (Metal Insulator Semiconductor Field Effect Transistor) in which the gate insulating film is formed of an insulating film taken in a broad category. That is, in the present specification, the term "MOSFET" is used for the sake of convenience, but the MOSFET is used also as a term intended to include even a MISFET. Therefore, in the following description, a MOSFET can also be replaced with a MISFET.

(First Embodiment)

A semiconductor device of an embodiment of the present invention will be described with reference to the drawings.

<About Structure of Semiconductor Device (Semiconductor Package)>

Figure 2:
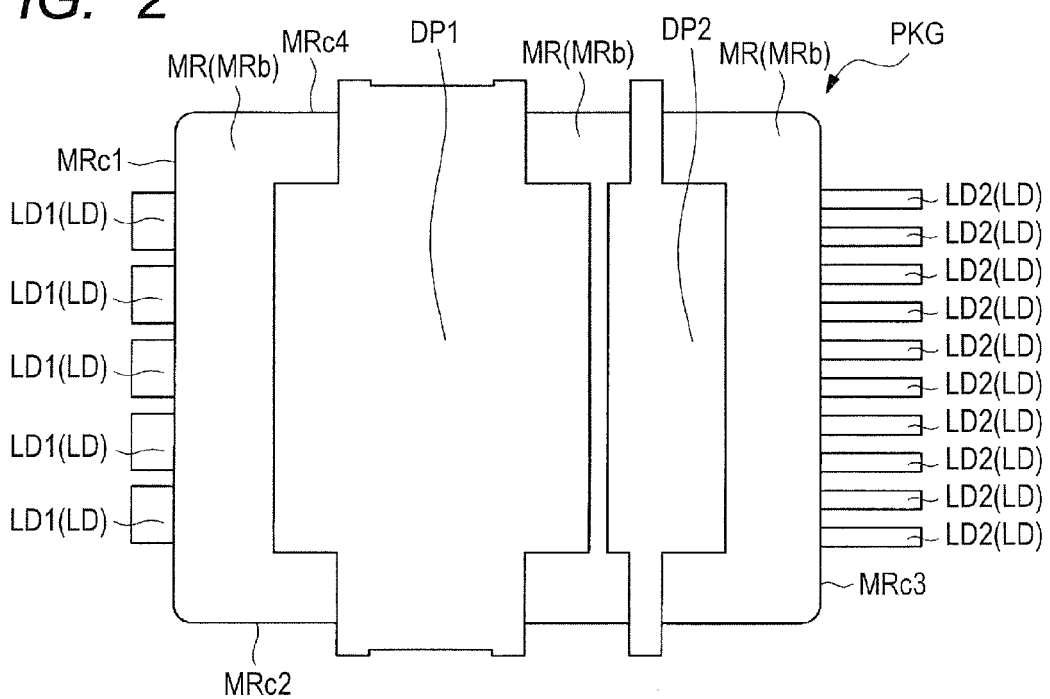
FIG. 2 is a bottom view of the semiconductor device as the embodiment of the present invention.
Figure 3:
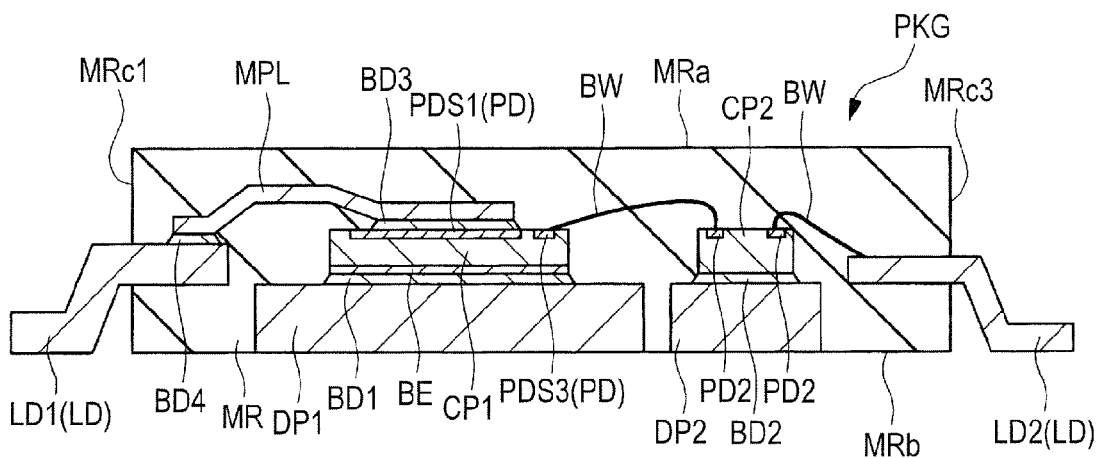
FIG. 3 is a cross-sectional view of the semiconductor device as the embodiment of the present invention.
Figure 4:
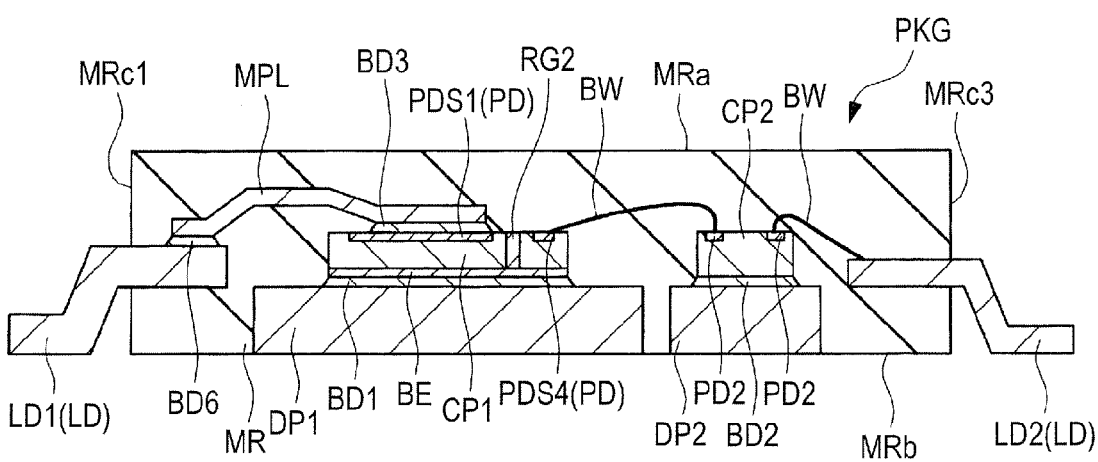
FIG. 4 is a cross-sectional view of the semiconductor device as the embodiment of the present invention.
Figure 5:
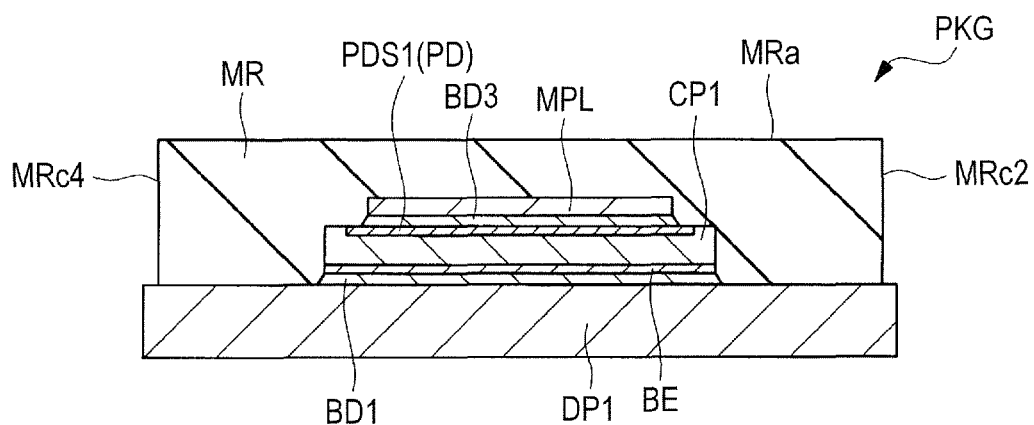
FIG. 5 is a cross-sectional view of the semiconductor device as the embodiment of the present invention.
Figure 6:
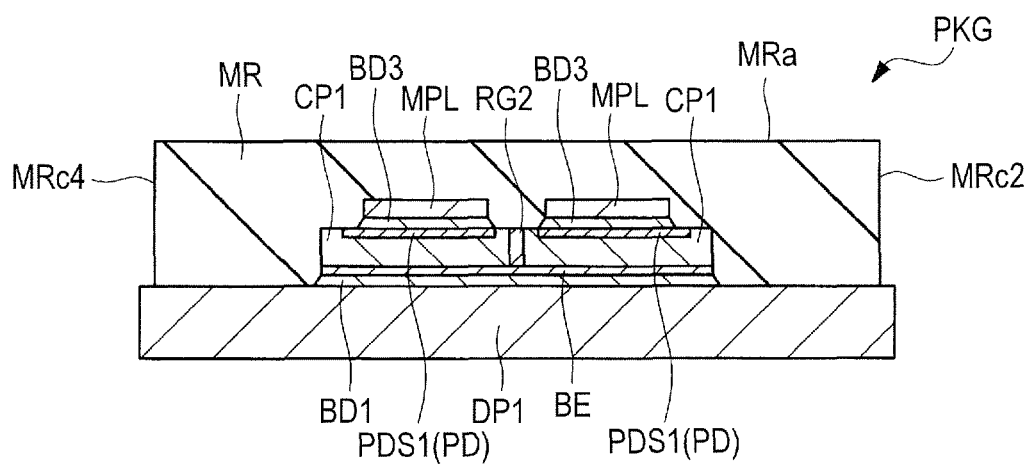
FIG. 6 is a cross-sectional view of the semiconductor device as the embodiment of the present invention.
Figure 7:
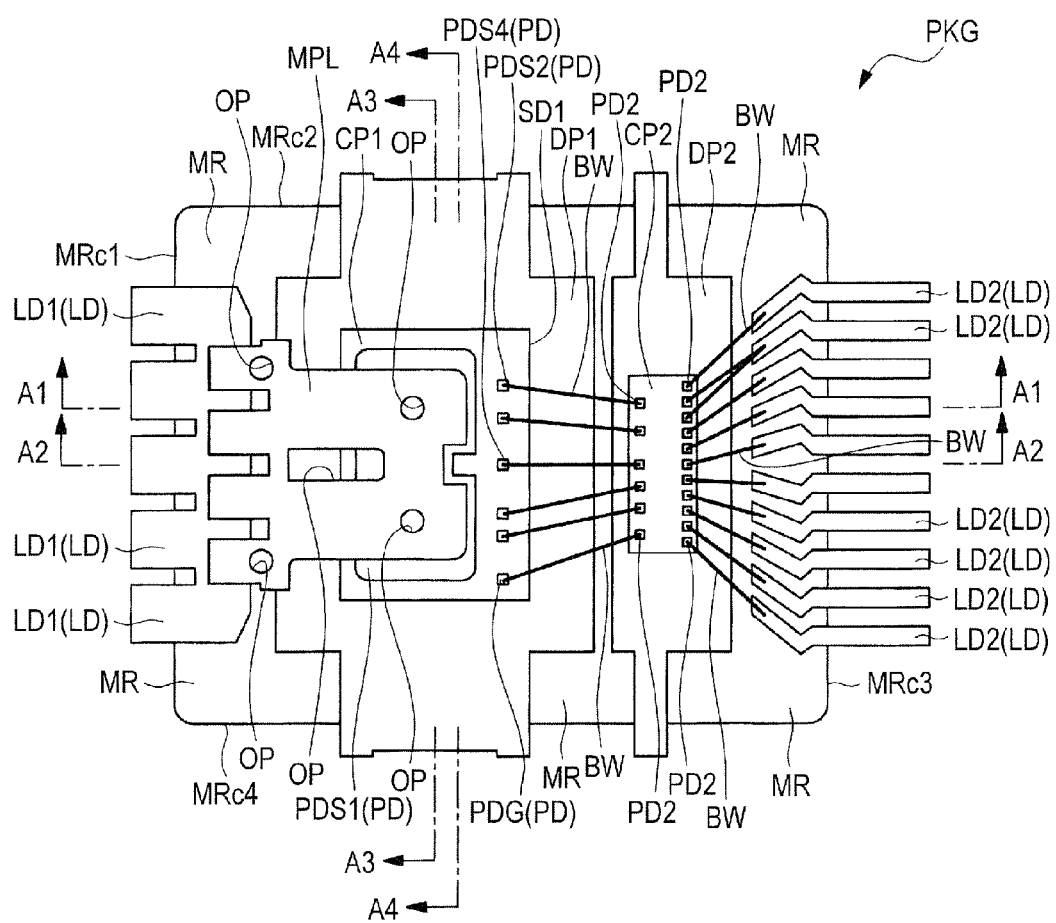
FIG. 7 is a perspective plan view of the semiconductor device as the embodiment of the present invention.
Figure 8:
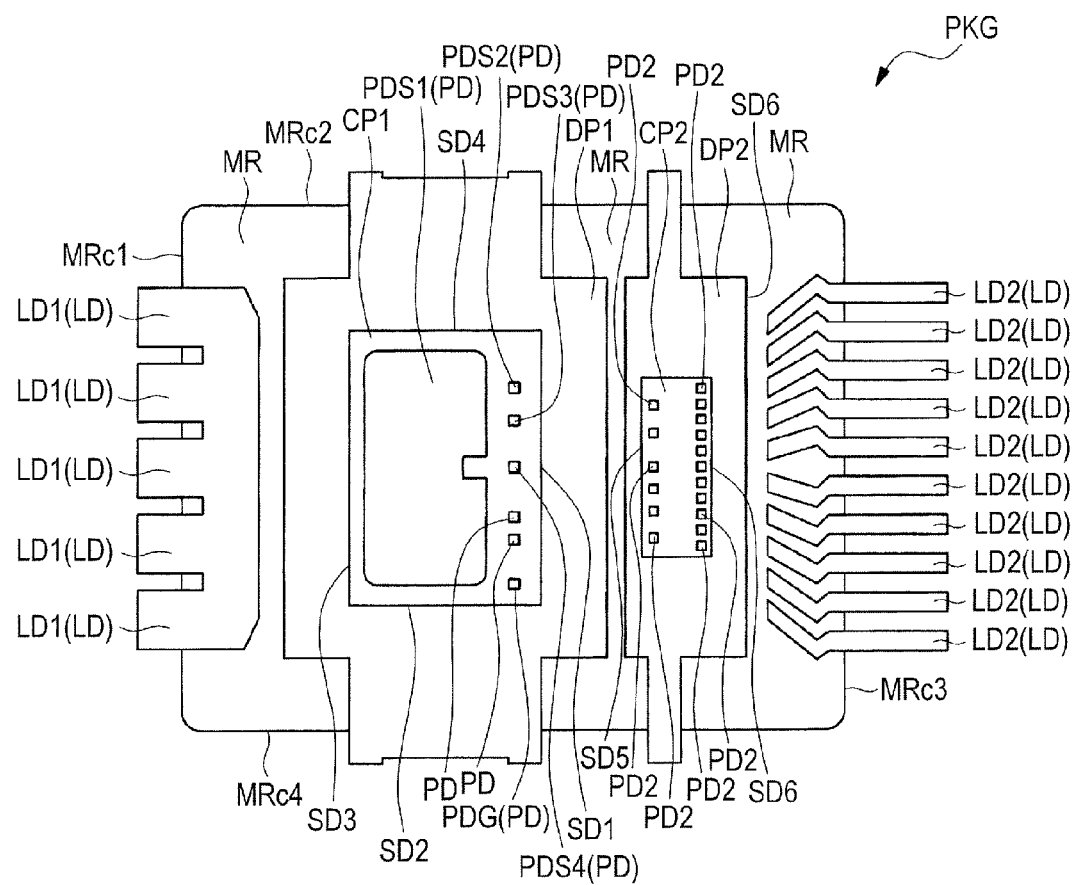
FIG. 8 is a perspective plan view of the semiconductor device as the embodiment of the present invention.
Figure 9:
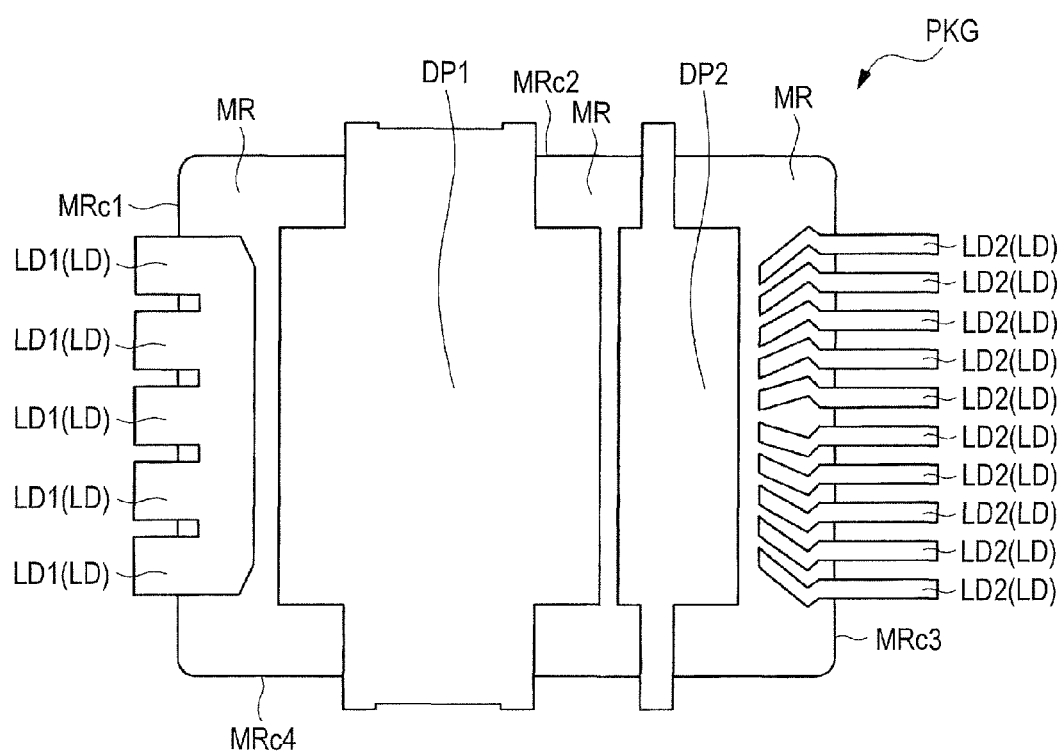
FIG. 9 is a perspective plan view of the semiconductor device as the embodiment of the present invention.

FIG. 1 is a top view (plan view) of a semiconductor device PKG as the embodiment of the present invention. FIG. 2 is a bottom view (plan view) of the semiconductor device PKG. FIGS. 3 to 6 are cross-sectional views of the semiconductor device PKG. FIGS. 7 to 9 are perspective plan views (top views) of the semiconductor device PKG. A cross section of the semiconductor device PKG at a position along the line A1-A1 of FIG. 7 substantially corresponds to FIG. 3. A cross section of the semiconductor device PKG at a position along the line A2-A2 of FIG. 7 substantially corresponds to FIG. 4. A cross section of the semiconductor device PKG at a position along the line A3-A3 of FIG. 7 substantially corresponds to FIG. 5. A cross section of the semiconductor device PKG at a position along the line A4-A4 of FIG. 7 substantially corresponds to FIG. 6. FIG. 7 shows a perspective plan view of the top side of the semiconductor device PKG when the semiconductor device PKG is viewed through a sealing portion MR. FIG. 8 is a perspective plan view (top view) of the semiconductor device PKG when the semiconductor device PKG is viewed without a metal plate MPL and bonding wires BW (which are omitted) in FIG. 7. FIG. 9 is a perspective plan view (top view) of the semiconductor device PKG when the semiconductor device PKG is viewed without semiconductor chips CP1 and CP2 (which are omitted) in FIG. 8. Note that, since FIGS. 4 and 6 are cross sections each passing through a sense MOSFET region RG2 described later, the sense MOSFET region RG2 in the semiconductor chip CP1 is also shown in FIGS. 4 and 6.

In the semiconductor device PKG of the present embodiment, the semiconductor chip CP1 formed with a power MOSFET (corresponding to a power MOSFET QH described later) as a switch field effect transistor, and the control semiconductor chip CP2 are integrated in one semiconductor package (packaged) to provide the one semiconductor device (semiconductor package) PKG.

The semiconductor device PKG of the present embodiment shown in FIGS. 1 to 9 has the semiconductor chips CP1 and CP2, die pads (chip mounting portions or tabs) DP1 and DP2 for mounting the respective semiconductor chips CP1 and CP2, a plurality of leads LD each formed of a conductor, and the sealing portion MR sealing therein the foregoing members.

The sealing portion (sealing resin portion) MR is comprised of a resin material such as, e.g., a thermosetting resin material, and can also contain a filler or the like. For example, the sealing portion MR can be formed using an epoxy resin containing a filler or the like. Besides the epoxy resin, for the purpose of reducing a stress or the like, it may also be possible to use, e.g., a phenol curing agent, a biphenyl thermosetting resin to which silicone rubber, filler, or the like is added as the material of the sealing portion MR.

The sealing portion MR has an upper surface (top surface) MRa as one main surface, a lower surface (back surface or bottom surface) MRb as a main surface opposite to the upper surface MRa, and side surfaces MRc1, MRc2, MRc3, and MRc4 each intersecting the upper surface MRa and the lower surface MRb. That is, the outer appearance of the sealing portion MR is in the form of a thin plate defined by the upper surface MRa, the lower surface MRb, and the side surfaces MRc1, MRc2, MRc3, and MRc4. Each of the upper surface MRa and the lower surface MRb of the sealing portion MR is formed to have, e.g., a rectangular two-dimensional shape. It is also possible to round the corners of the rectangular shape (two-dimensional rectangular shape). When the upper surface MRa and the lower surface MRb of the sealing portion MR are designed to have rectangular two-dimensional shapes, the two-dimensional shape (outer shape) of the sealing portion MR which intersects the thickness thereof is a rectangle (quadrilateral). Of the side surfaces MRc1, MRc2, MRc3, and MRc4, the side surfaces MRc1 and MRc3 oppose each other and the side surfaces MRc2 and MRc4 oppose each other, while the side surface MRc1 and the side surfaces Mrc2 and MRc4 intersect each other, and the side surface MRc3 and the side surfaces Mrc2 and MRc4 intersect each other.

The plurality of leads (lead portions) LD are each formed of a conductor, and preferably comprised of a metal material such as copper (Cu) or a copper alloy. Each of the plurality of leads. LD has a part thereof sealed in the sealing portion MR, and another part thereof protruding from the side surface of the sealing portion MR to the outside of the sealing portion MR. Hereinafter, the part of the lead LD located in the sealing portion MR will be referred to as an inner lead portion, and the part of the lead LD located outside the sealing portion MR will be referred to as an outer lead portion.

Note that the semiconductor device PKG of the present embodiment is a structure in which the part (outer lead portion) of each of the leads LD protrudes from the side surface of the sealing portion MR. Hereinbelow, a description will be given based on the structure, but the present invention is not limited thereto. For example, it is also possible to adopt a configuration (QFN-type configuration) in which each of the leads LD barely protrudes from the side surface of the sealing portion MR, and a part of each of the leads LD is exposed at the lower surface MRb of the sealing portion MR or the like.

The plurality of leads LD include a plurality of leads LD1 and a plurality of leads LD2. The plurality of leads LD1 included in the plurality of leads LD are disposed on the side surface MRc1 side of the sealing portion MR. The respective outer lead portions of the plurality of leads LD1 protrude from the side surface MRc1 of the sealing portion MR to the outside of the sealing portion MR. On the other hand, the plurality of leads LD2 included in the plurality of leads LD are disposed on the side surface MRc3 side of the sealing portion MR. The respective outer lead portions of the plurality of leads LD2 protrude from the side surface MRc3 of the sealing portion MR to the outside of the sealing portion MR. The outer lead portion of each of the leads LD (LD1 and LD2) is bent such that the lower surface of the outer lead portion located in the vicinity of the end portion thereof is located in substantially the same plane as the lower surface MRb of the sealing portion MR. The outer lead portion of the lead LD (LD1 or LD2) functions as the external coupling terminal portion (external terminal) of the semiconductor device PKG. As shown in FIGS. 7 to 9, the plurality of leads LD1 (inner lead portions thereof) disposed on the side surface MRc1 side of the sealing portion MR are coupled to each other to be integrated in the sealing portion MR.

As can be also seen from FIGS. 3, 4, and 7 to 9, the die pad DP1 and the die pad DP2 are disposed adjacent to each other in a separated state with a predetermined interval kept therebetween such that one of the sides of the die pad DP1 extends along one of the sides of the die pad DP2. The die pad DP1 is disposed closer to the side surface MRc1 of the sealing portion MR, while the die pad DP2 is disposed closer to the side surface MRc3 of the sealing portion MR. The die pad DP1 is a chip mounting portion for mounting the semiconductor chip CP1, while the die pad DP2 is a chip mounting portion for mounting the semiconductor chip CP2. Of the semiconductor chips CP1 and CP2, the semiconductor chip CP1 is the larger one (having a larger two-dimensional size (area)). Accordingly, of the die pads DP1 and DP2, the die pad DP1 for mounting the semiconductor chip CP1 is the larger one (having a larger two-dimensional size (area)).

The space between the die pad DP1 and the die pad DP2 is filled with a resin material forming the sealing portion MR. The die pads DP1 and DP2 are electrically insulated from each other. Between the die pads DP1 and DP2, no lead LD is disposed. Along the side of the die pad DP1 (side opposite to the side thereof opposing the die pad DP2) closer to the side surface MRc1 of the sealing portion MR, the plurality of leads LD1 are disposed (arranged). Along the side of the die pad DP2 (side opposite to the side thereof opposing the die pad DP1) closer to the side surface MRc3 of the sealing portion MR, the plurality of leads LD2 are disposed (arranged). That is, between the die pad DP1 and the side surface MRc1 of the sealing portion MR and along the side surface MRc1 of the sealing portion MR, the plurality of leads LD1 are disposed (arranged) while, between the die pad DP2 and the side surface MRc3 of the sealing portion MR and along the side surface MRc3 of the sealing portion MR, the plurality of leads LD2 are disposed (arranged).

At the lower surface MRb of the sealing portion MR, the respective lower surfaces (back surfaces) of the die pads DP1 and DP2 are exposed. On the other hand, at the upper surface MRa of the sealing portion MR, the die pads DP1 and DP2 are not exposed. Because the die pads DP1 and DP2 were coupled to a lead frame (frame body thereof) or the like when the semiconductor device PKG was manufactured, parts of the die pads DP1 and DP2 are exposed at the side surfaces MRc2 and MRc4 of the sealing portion MR.

The die pads DP1 and DP2 are each formed of a conductor, and are preferably comprised of a metal material such as copper (Cu) or a copper alloy. More preferably, the die pads DP1 and DP2 and the plurality of leads LD each forming the semiconductor device PKG are formed of the same material (the same metal material). This allows easy production of the lead frame to which the die pads DP1 and DP2 and the plurality of leads LD are coupled, and allows easy manufacturing of the semiconductor device PKG using the lead frame.

Over the upper surface (main surface) of the die pad DP1, the semiconductor chip CP1 is mounted with the top surface (main surface or upper surface) thereof facing upward and with the back surface (lower surface) thereof facing the die pad DP1. Over the upper surface (main surface) of the die pad DP2, the semiconductor chip CP2 is mounted with the top surface (main surface or upper surface) thereof facing upward and with the back surface (lower surface) thereof facing the die pad DP2. The semiconductor chip CP1 (back surface thereof) is adhesively bonded and fixed to the die pad DP1 (upper surface thereof) via an adhesive layer (bonding material) BD1. The semiconductor chip CP2 (back surface thereof) is adhesively bonded and fixed to the die pad DP2 (upper surface thereof) via an adhesive layer (bonding material) BD2. The semiconductor chips CP1 and CP2 are sealed in the sealing portion MR, and are not exposed from the sealing portion MR.

The semiconductor chip CP1 has a back-side electrode BE formed over the back surface (main surface to be adhesively bonded to the die pad DP1) thereof. Accordingly, the adhesive layer BD1 for adhesively bonding the semiconductor chip CP1 has electrical conductivity and, via the conductive adhesive layer BD1, the back-side electrode BE of the semiconductor chip CP1 is bonded and fixed to the die pad DP1, and is also electrically coupled thereto. The back-side electrode BE of the semiconductor chip CP1 is electrically coupled to the drain of the power MOSFET (corresponding to the power MOSFET QH described later) formed in the semiconductor chip CP1. The adhesive layer BD1 is comprised of a conductive paste-type adhesive such as, e.g., a silver (Ag) paste, a solder, or the like.

On the other hand, the semiconductor chip CP2 does not have a back-side electrode formed over the back surface thereof. Accordingly, the adhesive layer BD2 for adhesively bonding the semiconductor chip CP2 may be either electrically conductive or insulating. If the adhesive layer BD2 is formed of the same material as that of the adhesive layer BD1, the steps of assembling the semiconductor device PKG can be simplified.

The semiconductor chips CP1 and CP2 are manufactured by forming various semiconductor elements or semiconductor integrated circuits in a main surface of a semiconductor substrate (semiconductor wafer) comprised of, e.g., single-crystal silicon or the like, and then dividing the semiconductor substrate into individual semiconductor chips by dicing or the like. Each of the semiconductor chips CP1 and CP2 has a rectangular (quadrilateral) two-dimensional shape intersecting the thickness thereof. The semiconductor chip CP1 has a two-dimensional area larger than that of the semiconductor chip CP2, and the following is a reason for the different two-dimensional areas. That is, the semiconductor chip CP2 is formed with a control circuit for controlling the gate of the semiconductor chip CP1 and the like. In consideration of the size of the entire semiconductor device PKG, the outer size of the semiconductor chip CP2 is desired to be minimized. On the other hand, the semiconductor chip CP1 is formed with the power MOSFET (corresponding to the power MOSFET QH described later). In the power MOSFET, an ON resistance produced in the transistor is desired to be minimized. A reduced ON resistance can be achieved by increasing a channel width per unit transistor cell area. For this reason, the semiconductor chip CP1 is formed to have an outer size larger than that of the semiconductor chip CP2.

Over the top surface (main surface or upper surface) of the semiconductor chip CP1, a plurality of pad electrodes (pads, bonding pads, or terminals) PD are formed. Note that, hereinafter, the "pad electrodes" may also be simply referred to as "pads". As for the types of the pad electrodes PD of the semiconductor chip CP1, they will be described later. Over the top surface (main surface or upper surface) of the semiconductor chip CP2, a plurality of pad electrodes (pads, bonding pads, or terminals) PD2 are formed. It is assumed here that, of the two main surfaces of the semiconductor chip CP1 located on the sides opposite to each other, the main surface over which the plurality of pad electrodes PD are formed will be referred to as the top surface of the semiconductor chip CP1, and the main surface opposite to the top surface and opposing the die pad DP1 will be referred to as the back surface of the semiconductor chip CP1. Likewise, it is assumed that, of the two main surfaces of the semiconductor chip CP2 located on the sides opposite to each other, the main surface over which the plurality of pad electrodes PD2 are formed will be referred to as the top surface of the semiconductor chip CP2, and the main surface opposite to the top surface and opposing the die pad DP2 will be referred to as the back surface of the semiconductor chip CP2.

The top surface of the semiconductor chip CP2 has a rectangular two-dimensional shape having two long sides and two short sides shorter than the two long sides. The plurality of pad electrodes PD2 are disposed over the top surface of the semiconductor chip CP2 and along the two long sides. Of the two long sides of the semiconductor chip CP2, one long side opposes the semiconductor chip CP1, and the other long side opposes the plurality of leads LD2.

The plurality of pad electrodes PD of the semiconductor chip CP1 include a pad electrode (bonding pad) PDS1 having a large area. Each of the pad electrodes PD other than the pad electrode PDS1 has an area smaller than that of the pad electrode PDS1. The pad electrode PDS1 is a source pad electrode (bonding pad), and is electrically coupled to the source (source S1 described later) of the power MOSFET (corresponding to the power MOSFET QH described later) formed in the semiconductor chip CP1.

The top surface of the semiconductor chip CP1 has a rectangular two-dimensional shape having sides (chip sides) SD1, SD2, SD3, and SD4. Over the top surface of the semiconductor chip CP1 and along the side SD1 opposing the semiconductor chip CP2, the pad electrodes PD other than the pad electrode PDS1 are disposed. The side SD3 of the semiconductor chip CP1 (here, the side SD3 of the semiconductor chip CP1 opposes the foregoing side SD1) opposes the plurality of leads LD1. Note that, of the top surfaces of the semiconductor chip CP1, the sides SD1 and SD3 oppose each other, the sides SD2 and SD4 oppose each other, the sides SD1 and SD3 are parallel with each other, the sides SD2 and SD4 are parallel with each other, the side SD1 is orthogonal to the sides SD2 and SD4, and the side SD3 is orthogonal to the sides SD2 and SD4.

The plurality of pads PD of the semiconductor chip CP1 other than the pad electrode PDS1 are electrically coupled to the plurality of pads PD2 of the semiconductor chip CP2 via the plurality of bonding wires BW each as a conductive coupling member. The plurality of leads LD2 (inner lead portions thereof) are electrically coupled to the plurality of pad electrodes PD2 of the semiconductor chip CP2 via the plurality of bonding wires BW each as the conductive coupling member. The bonding wires BW are the conductive coupling members, and are more specifically conductive wires. Preferably, the bonding wires BW are comprised of metal thin wires such as gold (Au) wires, copper (Cu) wires, or aluminum (Al) wires. The bonding wires BW are sealed in the sealing portion MR, and are not exposed from the sealing portion MR.

A more specific description will be given below. Of the plurality of pad electrodes PD2 of the semiconductor chip CP2, those disposed over the top surface of the semiconductor chip CP2 and along a side SD5 thereof opposing the semiconductor chip CP1 are electrically coupled to those of the plurality of pad electrodes PD of the semiconductor chip CP1 other than the pad electrode PDS1 via the bonding wires BW. Of the plurality of pad electrodes PD2 of the semiconductor chip CP2, those disposed over the top surface of the semiconductor chip CP and along a side SD6 thereof opposing the plurality of leads LD2 are electrically coupled to the plurality of leads LD2 (inner lead portions thereof) via the bonding wires BW. That is, of the both ends of each of the bonding wires BW, one end portion is coupled to the pad electrode PD2 of the semiconductor chip CP2, and the other end portion is coupled to the pad electrode PD of the semiconductor chip CP1 or the inner lead portion of the lead LD2. Note that the spaces between the inner lead portions of the adjacent leads LD2 and between the inner lead portions of the leads LD2 and the die pad DP2 are filled with the material forming the sealing portion MR.

The pad electrode PDS1 of the semiconductor chip CP1 is electrically coupled to the leads LD1 via the metal plate MPL. That is, of the pad electrodes PD and PD2 of the semiconductor chips CP1 and CP2, the pad electrode PDS1 is not coupled to the bonding wire BW, but is coupled to the metal plate MPL, and the pad electrodes PD and PD2 other than the pad electrode PDS1 are coupled to the bonding wires BW. The metal plate MPL is sealed in the sealing portion MR, and is not exposed from the sealing portion MR.

A more specific description will be given below. As also shown in FIGS. 3 to 6, one end portion of the metal plate MPL is bonded to the pad electrode PDS1 of the semiconductor chip CP1 via the conductive adhesive layer (bonding material) BD3 to be electrically coupled thereto, while the other end portion of the metal plate MPL is bonded to the leads LD1 (inner lead portions thereof) via the conductive adhesive layer (bonding material) BD4 to be electrically coupled thereto.

The adhesive layers (bonding materials) BD3 and BD4 used to bond the metal plate MPL are each required to have electrical conductivity, and a conductive paste-type adhesive material such as, e.g., a silver paste, a solder, or the like can be used. If the adhesive layers (bonding materials) BD3 and BD4 are each formed of the same material, the steps of assembling the semiconductor device PKG can be simplified.

The metal plate MPL is formed of a metal (metal material) having a high electrical conductivity and a high thermal conductivity such as, e.g., copper (Cu), a copper (Cu) alloy, aluminum (Al), or an aluminum (Al) alloy. Preferably, the metal plate MPL is formed of copper (Cu) or a copper (Cu) alloy in terms of its excellent workability, high thermal conductivity, and relatively low price. The width of the metal plate MPL is larger (wider) than the width (diameter) of each of the bonding wires BW. Since the source pad electrode PDS1 of the semiconductor chip CP1 is electrically coupled to the lead LD1 through the metal plate MPL, compared to the case where the source pad electrode PDS1 of the semiconductor chip CP1 is coupled to the lead LD1 with a wire, the ON resistance of a power MOSFET (corresponding to the power MOSFET QH described later) formed in the semiconductor chip CP1 can be reduced. This allows a reduction in package resistance and a reduction in conduction loss. Moreover, by using the metal plate MPL formed of a metal material less costly than gold instead of a wire formed of gold (Au), the cost of the semiconductor device PKG can be reduced.

Also, as shown in FIG. 7, it is also possible to provide openings OP in each metal plate MPL. The openings OP are provided to allow the state and amount of the adhesive layer BD3 bonding the metal plate MPL to the pad electrode PDS1 of the semiconductor chip CP1 to be observed through the openings OP or reduce a stress produced in each of the metal plates MPL during manufacturing steps (assembling steps) of the semiconductor device PKG.

Over the side surface MRc1 of the sealing portion MR, the plurality of leads LD1 are disposed. The inner lead portions of the plurality of leads LD1 are integrally coupled to each other in the sealing portion MR, and the metal plate MPL is coupled (bonded) thereto via the foregoing adhesive layer BD4. In the case of FIGS. 7 to 9, the five leads LD1 are disposed over the side surface MRc1 of the sealing portion MR. The inner lead portions of the five leads LD1 are integrally coupled to each other in the sealing portion MR, and the metal plate MPL is coupled (bonded) thereto via the foregoing adhesive layer BD4. The inner lead portions of the plurality of leads LD1 are coupled to each other because each of the plurality of leads LD1 is used as a terminal electrically coupled to the source pad PDS1 of the semiconductor chip CP1, i.e., as a terminal electrically coupled to the source of the power MOSFET QH formed in the semiconductor chip CP1, which will be described later. By coupling the inner lead portions of the plurality of leads LD1 to each other, the volume can be increased to be larger than in the case where the plurality of leads LD1 are separately provided. This allows a reduction in package resistance and a reduction in conduction loss. Note that the spaces between the inner lead portions of the leads LD1 and the die pad DP1 are filled with the material forming the sealing portion MR so that they are electrically insulated from each other. In another form, the inner lead portions of the plurality of leads LD1 can also be separately provided instead of being coupled to each other. In this case, the metal plate MPL may be coupled (bonded) appropriately to the plurality of inner lead portions (inner lead portions of the leads LD1) separately provided.

The respective lower surfaces (back surfaces) of the die pads DP1 and DP2 are exposed from the lower surface MRb of the sealing portion MR. The heat generated during the operation of the semiconductor chips CP1 and CP2 is radiated mainly from the back surfaces of the semiconductor chips CP1 and CP2 through the die pads DP1 and DP2 to the outside. Therefore, the die pads DP1 and DP2 are formed to have respective areas larger than those of the semiconductor chips CP1 and CP2 mounted thereover. This allows an improvement in heat radiation property. Of the semiconductor chips CP1 and CP2, the semiconductor chip CP1 generates a larger amount of heat. Accordingly, by designing the die pad DP1 for mounting the semiconductor chip CP1 such that the two-dimensional area thereof is larger than the two-dimensional area of the die pad DP2 for mounting the semiconductor chip CP2, it is possible to efficiently release heat generated from the semiconductor chip CP1 to allow a further improvement in heat radiation property.

Figure 10:
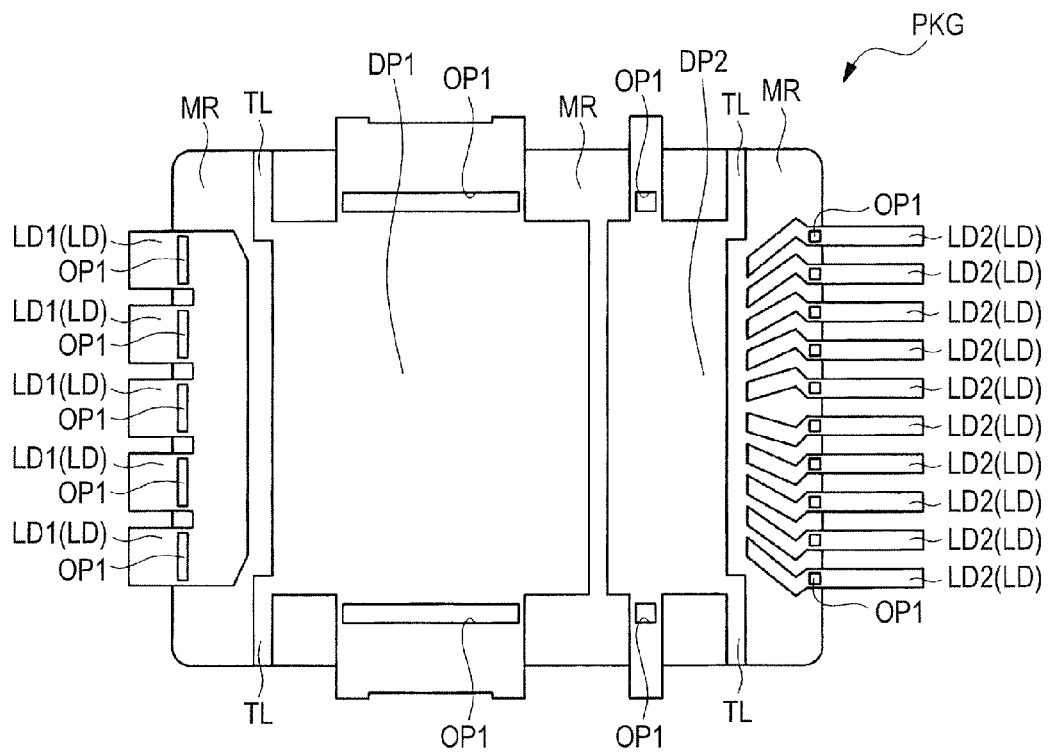
FIG. 10 is a perspective plan view showing a modification of the semiconductor device as the embodiment of the present invention.

FIG. 10 is a perspective plan view (top view) showing a modification of the semiconductor device PKG of the present embodiment, which corresponds to FIG. 9 described above.

Similarly to FIG. 9 described above, FIG. 10 also shows a perspective plan view of the top side of the semiconductor device PKG when the semiconductor device PKG is viewed through the sealing portion MR without the metal MPL, the bonding wires BW, and the semiconductor chips CP1 and CP2.

The following is the difference between the semiconductor device PKG of the modification shown in FIG. 10 and the semiconductor device PKG of FIGS. 1 to 9 described above. In the semiconductor device PKG of the modification shown in FIG. 10, the die pads DP1 and DP2, the plurality of leads LD1 (inner lead portions thereof), and the plurality of leads LD2 (inner lead portions thereof) are formed with respective openings OP1. Each of the openings OP1 is filled with the material forming the sealing portion MR. By providing the openings OP1, the die pads DP1 and DP2 and the leads LD1 and LD2 can be made less likely to come off the sealing portion MR. When the semiconductor device PKG is manufactured, a lead frame to which the die pads DP1 and DP2 and the plurality of leads LD are coupled can be used and, in this case, to stably couple the die pads DP1 and DP2 to the frame body of the lead frame, a suspension lead TL can also be added. Of the suspension lead TL, the portions protruding from the sealing portion MR after the formation of the sealing portion MR are cut away and removed, while the suspension lead TL in the sealing portion MR remains therein. FIG. 10 shows the suspension lead TL remaining in the sealing portion MR. The configuration of the semiconductor device PKG of the modification shown in FIG. 10 is otherwise the same as the semiconductor device PKG of FIGS. 1 to 9 described above so that a description thereof is omitted herein.

<About Example of Mounting of Semiconductor Device>

Figure 11:
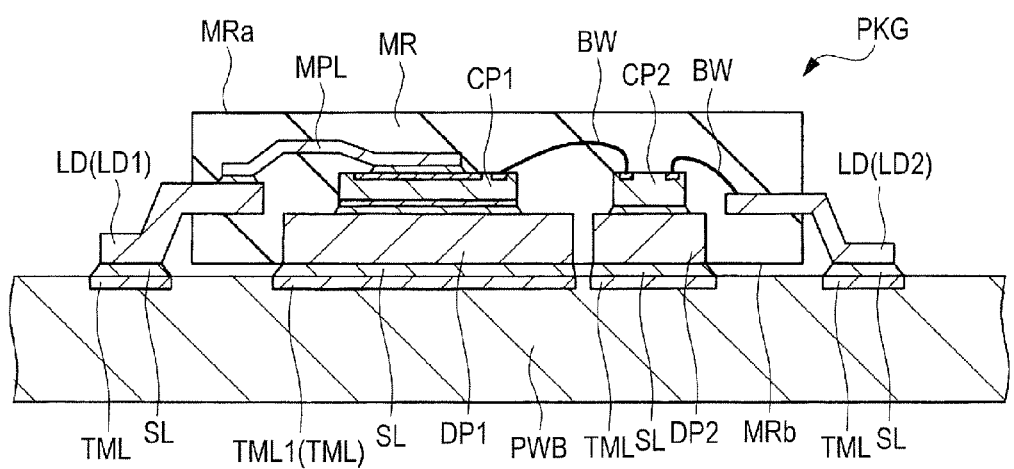
FIG. 11 is a cross-sectional view showing an example of the mounting of the semiconductor device as the embodiment of the present invention.

FIG. 11 is a cross-sectional view showing an example of the mounting of the semiconductor device PKG. FIG. 11 shows a cross section corresponding to FIG. 3 described above.

In the upper surface of a mounting substrate (wiring substrate) PWB for mounting the semiconductor device PKG, a plurality of terminals TML are formed. To mount the semiconductor device PKG over the mounting substrate PWB, as shown in FIG. 11, the outer lead portions of the respective leads LD of the semiconductor device PKG are bonded to the individual terminals TML in the upper surface of the mounting substrate PWB via a conductive bonding material such as a solder SL to be electrically coupled thereto. At this time, the respective lower surfaces of the die pads DP1 and DP2 exposed at the lower surface MRb of the sealing portion MR of the semiconductor device PKG are also bonded to the terminals TML in the upper surface of the mounting substrate PWB via a conductive bonding material such as the solder SL to be electrically coupled thereto. The lower surface of the die pad DP2 having the semiconductor chip CP2 mounted thereover need not be coupled to the terminal TML of the mounting substrate PWB but, in the case where the lower surface of the die pad DP2 is coupled to the terminal TML of the mounting substrate PWB, heat generated from the semiconductor chip CP2 can be released to the mounting substrate PWB via the die pad DP2. On the other hand, since the back-side electrode BE of the semiconductor chip CP1 is electrically coupled to the die pad DP1 via the foregoing conductive adhesive layer BD1 as described above, terminals TML1 to be coupled to the back-side electrode BE of the semiconductor chip CP1, which are among the plurality of terminals TML of the mounting substrate PWB, are coupled to the die pad DP1 (lower surface thereof) exposed at the lower surface MRb of the sealing portion MR via a conductive bonding material such as the solder SL. This allows the plurality of terminals TML1 of the mounting substrate PWB to be electrically coupled to the back-side electrode BE of the semiconductor chip CP1 through the die pad DP1. This also allows heat generated from the semiconductor chip CP1 to be released to the mounting substrate PWB through the die pad DP1.

Thus, in the semiconductor device PKG, the outer lead portions of the individual leads LD (LD1 and LD2) and the die pad DP1 exposed at the lower surface MRb of the sealing portion MR are allowed to function as the external coupling terminal portions (external terminals) of the semiconductor device PKG.

To manufacture the semiconductor device PKG of the present embodiment, it is possible to use, e.g., a method shown below. That is, the lead frame to which the foregoing die pads DP1 and DP2 and the plurality of leads LD are integrally coupled is prepared first, and then a die bonding step is performed to mount the semiconductor chips CP1 and CP2 over the foregoing die pads PD1 and PD2 of the lead frame via the bonding material (which will serve as the foregoing adhesive layers BD1 and BD2) and bond the semiconductor chips CP1 and CP2 thereto. Then, a wire bonding step is performed to provide coupling between the pad electrodes PD of the semiconductor chip CP1 and the pad electrodes PD2 of the semiconductor chip CP2 and between the pad electrodes PD2 of the semiconductor chip CP2 and the foregoing leads LD2 via the foregoing bonding wires BW. Then, coupling is provided between the source pad electrode PDS1 of the semiconductor chip CP1 and the foregoing leads LD1 via the foregoing metal plate MPL. Subsequently, a mold step is performed to form the foregoing sealing portion MR. Then, by cutting (disconnecting) the foregoing die pads DP1 and DP2 and the leads LD from the lead frame and bending the outer lead portions of the leads LD, the semiconductor device PKG can be manufactured.

<About Circuit Configuration of Semiconductor Device>

Figure 12:
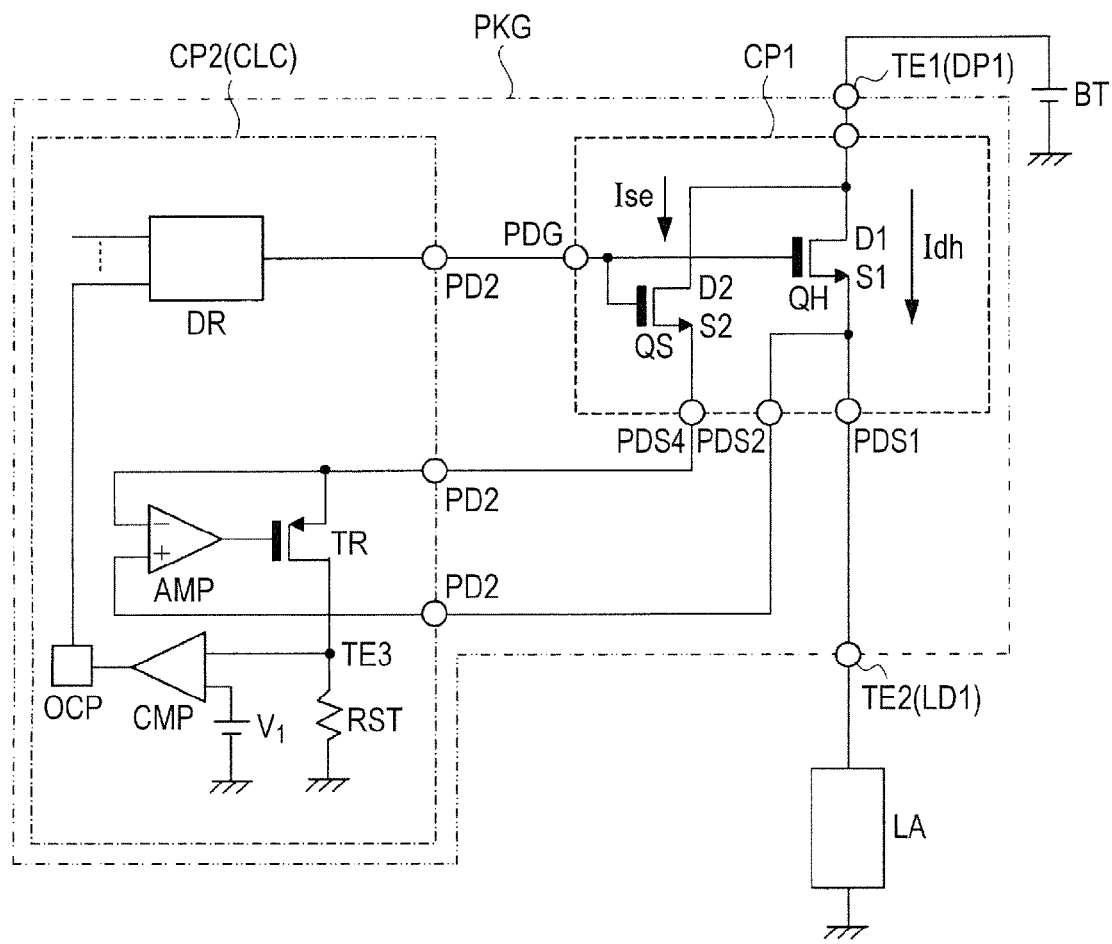
FIG. 12 is a circuit block diagram showing an example of the use of the semiconductor device as the embodiment of the present invention.

Next, a circuit configuration of the semiconductor device PKG will be described. FIG. 12 is a circuit diagram (circuit block diagram) of the semiconductor device PKG. In FIG. 12, the portion enclosed by the dotted line is formed of the semiconductor chip CP1, the portion enclosed by the dot-dash line is formed of the semiconductor chip CP2, and the portion enclosed by the two-dot dash line is formed of the semiconductor device PKG.

As shown in FIG. 12, the semiconductor device PKG has one switch power MOSFET (Metal Oxide Semiconductor Field Effect Transistor) QH, a sense MOSFET QS for sensing a current flowing in the power MOSFET QH, and a control circuit CLC. The control circuit CLC is formed in the foregoing semiconductor chip CP2. The power MOSFET QH and the sense MOSFET QS are formed in the semiconductor chip CP1.

The control circuit CLC has a driver circuit (drive circuit) DR as a drive circuit. The driver circuit DR controls a potential at the gate terminal of the power MOSFET QH in response to a Pulse Width Modulation (PWM) signal supplied from (a control circuit) outside the semiconductor device PKG or the like to control the operation of the power MOSFET QH. In another form, a circuit for generating the pulse width modulation (PWM) signal can also be provided in the control circuit CLC.

The output of the driver circuit DR is electrically coupled to the gate terminal of the power MOSFET QH. The driver circuit DR can be regarded as the driver circuit (drive circuit) of the power MOSFET QH.

The gate of the power MOSFET QH is coupled to the driver circuit DR. By supplying an ON signal (gate voltage for bringing the power MOSFET QH into an ON state) from the driver circuit DR to the gate of the power MOSFET QH, the power MOSFET QH can be brought into the ON state.

When the power MOSFET QH is brought into the ON state by supplying the ON signal from the driver circuit DR to the gate of the power MOSFET QH, the voltage of a power source BT is outputted from the power MOSFET QH to a load LA. When the power MOSFET QH is brought into an OFF state by supplying an OFF signal from the driver circuit DR to the gate of the power MOSFET QH (or stopping the supply of the ON signal), the supply of the voltage from the power source BT to the load LA is stopped. Such ON/OFF control of the power MOSFET QH of the semiconductor chip CP1 is performed by the control, circuit CLC (driver circuit DR) of the semiconductor chip CP2.

Thus, the semiconductor device PKG can function as a switch semiconductor device which performs ON/OFF switching of the application of the voltage from the power source BT to the load LA. Also, the power MOSFET QH of the semiconductor chip CP1 can function as a switch element (switching element). Since the output of the power MOSFET QH is supplied to the load LA, the power MOSFET QH can also be regarded as an output circuit. As the load LA, any electronic device (or electronic component) desired to be coupled to the power source BT via the switch semiconductor device PKG can be used appropriately.

In the semiconductor chip CP1 of the semiconductor device PKG, the sense MOSFET QS for current sensing is provided. The current flowing in the power MOSFET QH is sensed by the sense MOSFET QS and, in accordance with a current flowing in the sense MOSFET QS, the power MOSFET QH is controlled. For example, when it is determined (sensed) that an excessive current is flowing (a current of a value not less than a prescribed value is flowing) in the power MOSFET QH based on the current flowing in the sense MOSFET, the gate voltage of the power MOSFET QH is controlled to limit the current of the power MOSFET QH to a value of not more than the prescribed value or the power MOSFET QH is forcibly turned OFF to allow the semiconductor device PKG and an electronic device using the semiconductor device PKG to be protected.

The sense MOSFET QS has a drain and a gate which are common to those of the power MOSFET QH. That is, the drain of the power MOSFET QH and the drain of the sense MOSFET QS are electrically coupled to the foregoing back-side electrode BE of the semiconductor chip CP1, and therefore electrically coupled to each other. Accordingly, the foregoing back-side electrode BE of the semiconductor chip CP1 is the drain back-side electrode of each of the power MOSFET QH and the sense MOSFET QS. The drain (common drain) of the power MOSFET QH and the sense MOSFET QS is coupled to the terminal TE1 (the foregoing die pad DP1 corresponds to the terminal TE1) such that the same potential is supplied to the drain of the sense MOSFET QS and to the drain of the power MOSFET QH. The terminal TE1 is coupled to the power source (battery) BT disposed outside the semiconductor device PKG.

Also, the gate of the sense MOSFET QS and the gate of the power MOSFET QH are electrically coupled to each other to provide a common gate. The common gate is coupled to the driver circuit DR such that the same gate signal (gate voltage) is inputted from the driver circuit DR to the gate of the sense MOSFET QS and to the gate of the power MOSFET QH.

On the other hand, the source of the sense MOSFET QS is not common to the source of the power MOSFET QH, and there is no short circuit between the source of the power MOSFET QH and the source of the sense MOSFET QS.

The source of the power MOSFET QH is coupled to a terminal TE2 (the foregoing lead LD1 corresponds to the terminal TE2). To the terminal TE2, the load LA disposed outside the semiconductor device PKG is coupled. That is, the source of the power MOSFET QH is coupled to the load LA. On the other hand, the source of the sense MOSFET QS is coupled to the control circuit CLC. Specifically, the source of the sense MOSFET QS is coupled to the source of a transistor (p-channel MOSFET) TR formed in the control circuit CLC, and the drain of the transistor TR is coupled to a comparator circuit CMP and a resistor (reference resistor) RST. Note that, in FIG. 12, the mark D1 denotes the drain of the power MOSFET QH, the mark S1 denotes the source of the power MOSFET QH, the mark D2 denotes the drain of the sense MOSFET QS, and the mark S2 denotes the source of the sense MOSFET QS.

The sense MOSFET QS is formed together with the power MOSFET QH in the semiconductor chip CP1. The sense MOSFET QS is formed so as to configure, in conjunction with the power MOSFET QH, a current mirror circuit in the semiconductor chip CP1. For example, the sense MOSFET QS has a size corresponding to $\frac{1}{20000}$ of the size of the power MOSFET QH. The size ratio therebetween can be changed as necessary, but, here, a description will be given below on the assumption that the size ratio is 1/20000.

The control circuit DLC has an amplifier circuit AMP and the transistor TR. To the two input nodes of the amplifier circuit AMP, the source of the power MOSFET QH and the source of the sense MOSFET QS are coupled. By the output node of the amplifier circuit AMP, the gate of the transistor TR is driven. The sense MOSFET QS is an element for detecting a current Idh flowing in the power MOSFET QH. In the sense MOSFET QS, a current corresponding to a predetermined proportion (which is 1/20000 here) of the current Idh flows due to the current mirror configuration described above when the source voltage of the sense MOSFET QS is equal to that of the power MOSFET QH. That is, the size ratio between the power MOSFET QH and the sense MOSFET QS is set such that, when the current Idh flows in the power MOSFET QH, a current Ise flowing in the sense MOSFET QS corresponds to 1/20000 of the current Idh (i.e., Ise=Idh/20000 is satisfied). To equalize the source voltages of the sense MOSFET QS and the power MOSFET QH and detect the current Idh in the power MOSFET QH with high accuracy, the amplifier circuit AMP and the transistor TR are provided.

The drain of the transistor TR is coupled to the resistor RST. The resistor RST is a resistive element for current-voltage conversion. Specifically, one end of the resistor RST is coupled the drain of the transistor TR, while the other end of the resistor RST is coupled to a ground potential (0 V). By coupling the source of the sense MOSFET QS to the source of the transistor TR and coupling the resistor RST to the drain of the transistor TR, the value of the current flowing in the sense MOSFET QS can be converted to the value of a voltage at a terminal TE3 (as the current Ise flowing in the sense MOSFET QS increases, the voltage value at the terminal TE3 increases and, specifically, the voltage value at the terminal TE3 is substantially proportional to the current Ise flowing in the sense MOSFET QS). Here, the terminal TE3 is located between the drain of the transistor TR and the resistor RST. The drain of the transistor TR is coupled to the terminal TE3, and the terminal TE3 is coupled to one end of the resistor RST (the other end of the resistor RST is coupled to the ground potential). The resistor RST can be formed in the control circuit CLC (i.e., in the semiconductor chip CP2). However, in another form, it is also possible to provide the resistor RST outside the semiconductor chip CP2 (i.e., outside the semiconductor device PKG) (i.e., to provide the resistor RST as an external resistor).

The voltage at the terminal TE3 is compared to a predetermined comparison voltage $V_1$ by the comparator circuit CMP in the control circuit CLC. When it is detected by the comparator circuit CMP that the voltage value at the terminal TE3 is larger than the comparison voltage $V_1$, an overcurrent protection circuit OCP in the control circuit CLC operates to control the driver circuit DR and bring the power MOSFET QH into the OFF state (i.e., turn OFF the gate signal inputted to the gate of the power MOSFET QH). Alternatively, the current in the power MOSFET QH is reduced to be not more than a predetermined value (i.e., the gate voltage inputted to the gate of the power MOSFET QH is reduced).

That is, the current Idh flowing in the power MOSFET QH is sensed (as the current Ise flowing in the sense MOSFET QS) by means of the sense MOSFET QS. When it is determined (detected) that the voltage value at the terminal TE3 is larger than the comparison voltage $V_1$ (i.e., when it is determined (detected) that the current Ise flowing in the sense MOSFET QS is excessively large), the control circuit CLC turns OFF (OFF state or non-conductive state) the power MOSFET QH or reduces the current in the power MOSFET QH. In this manner, when an excessive current flows in the power MOSFET QH, it is possible to forcibly turn OFF the power MOSFET QH or reduce the current in the power MOSFET QH.

Specifically, the resistance value of the resistor RST is set such that, when a current corresponding to 1/20000 of an allowable upper-limit value Ilm of the current Idh in the power MOSFET QH flows in the sense MOSFET QS (i.e., when Ise=Ilm/20000 is satisfied), the voltage at the terminal TE3 becomes the foregoing comparison voltage $V_1$. As a result, when a current of not less than the allowable upper-limit value Ilm flows in the power MOSFET QH, a current of not less than Ilm/20000 flows in the sense MOSFET QS and the voltage at the terminal TE3 becomes not less than the foregoing comparison voltage so that the control circuit CLC forcibly turns OFF the power MOSFET QH or reduces the current in the power MOSFET QH. This can prevent a current of not less than the allowable upper-limit value Ilm from flowing in the power MOSFET QH and improve the reliability of the semiconductor device PKG and the electronic device using the semiconductor device PKG.

<About Configuration of Semiconductor Chip>

Next, a description will be given to a configuration of the semiconductor chip CP1 formed with the foregoing power MOSFET QH and sense MOSFET QS.

Figure 13:
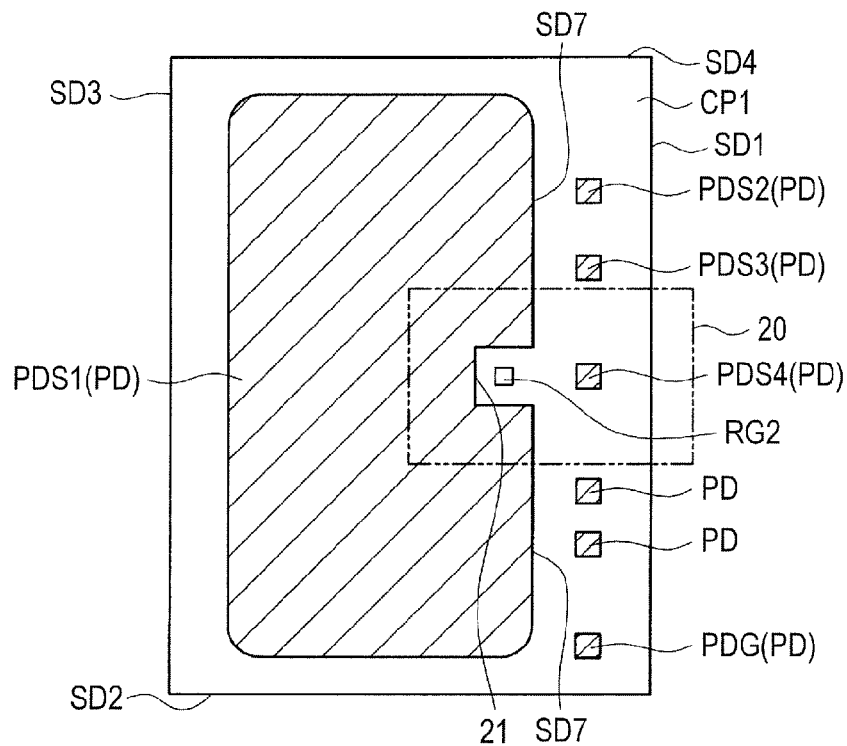
FIG. 13 is a plan view showing a chip layout of a semiconductor chip used in the semiconductor device as the embodiment of the present invention.
Figure 14:
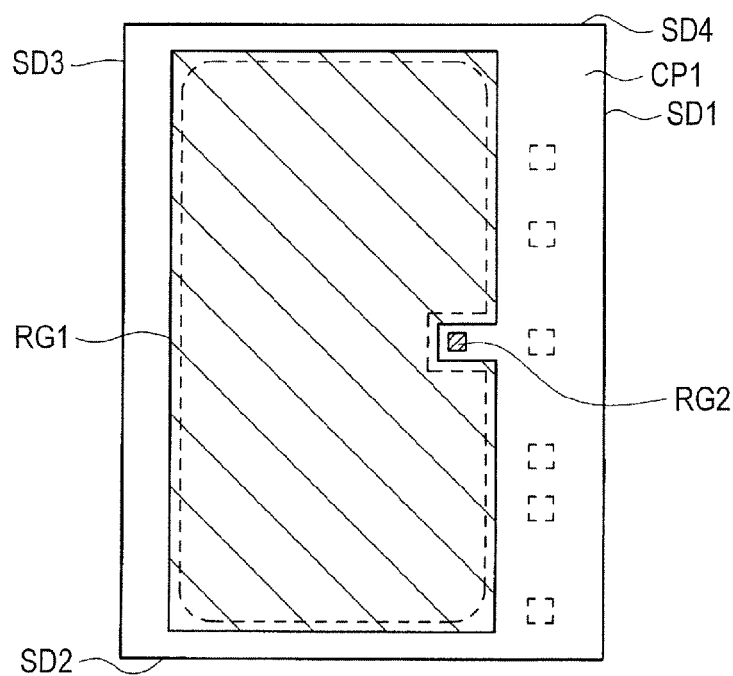
FIG. 14 is a plan view showing the chip layout of the semiconductor chip used in the semiconductor device as the embodiment of the present invention.
Figure 15:
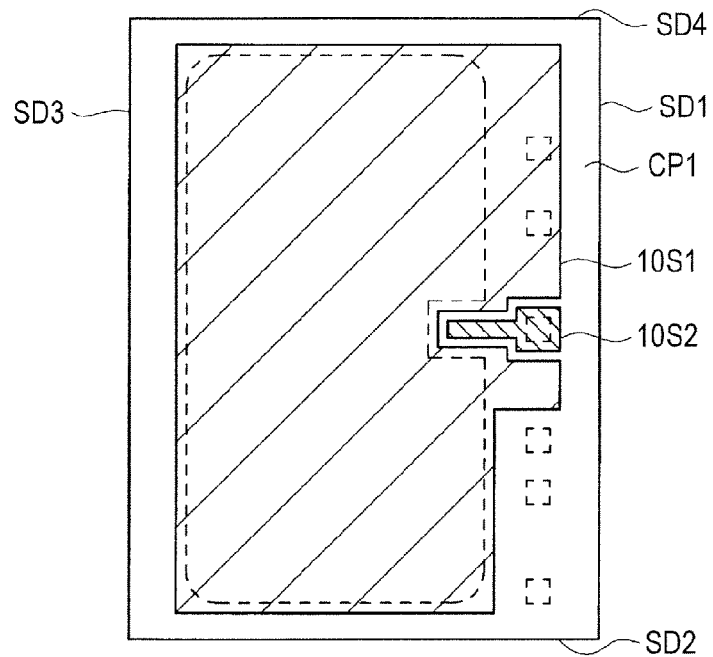
FIG. 15 is a plan view showing the chip layout of the semiconductor chip used in the semiconductor device as the embodiment of the present invention.
Figure 16:
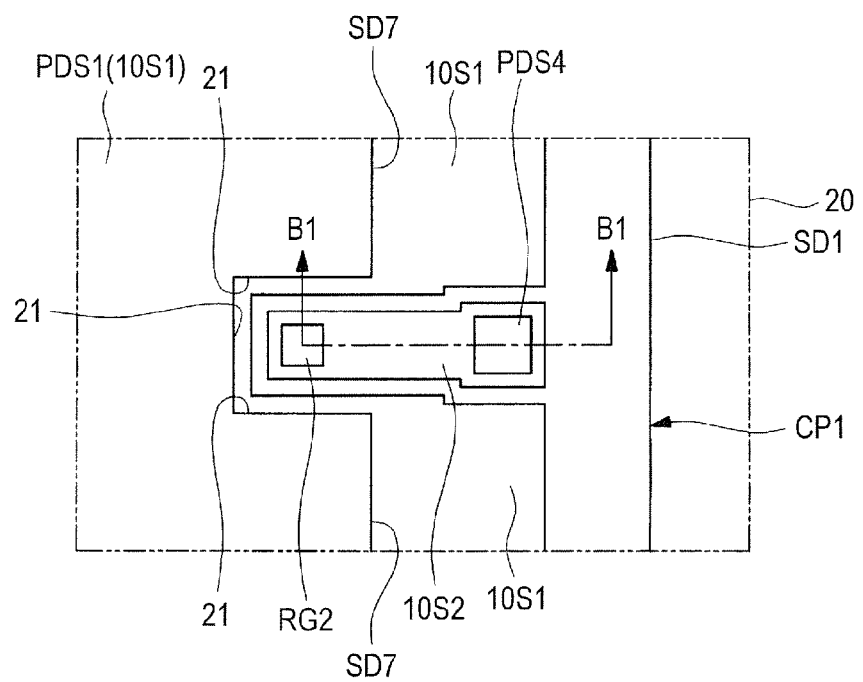
FIG. 16 is a main-portion plan view of the semiconductor chip used in the semiconductor device as the embodiment of the present invention.
Figure 17:
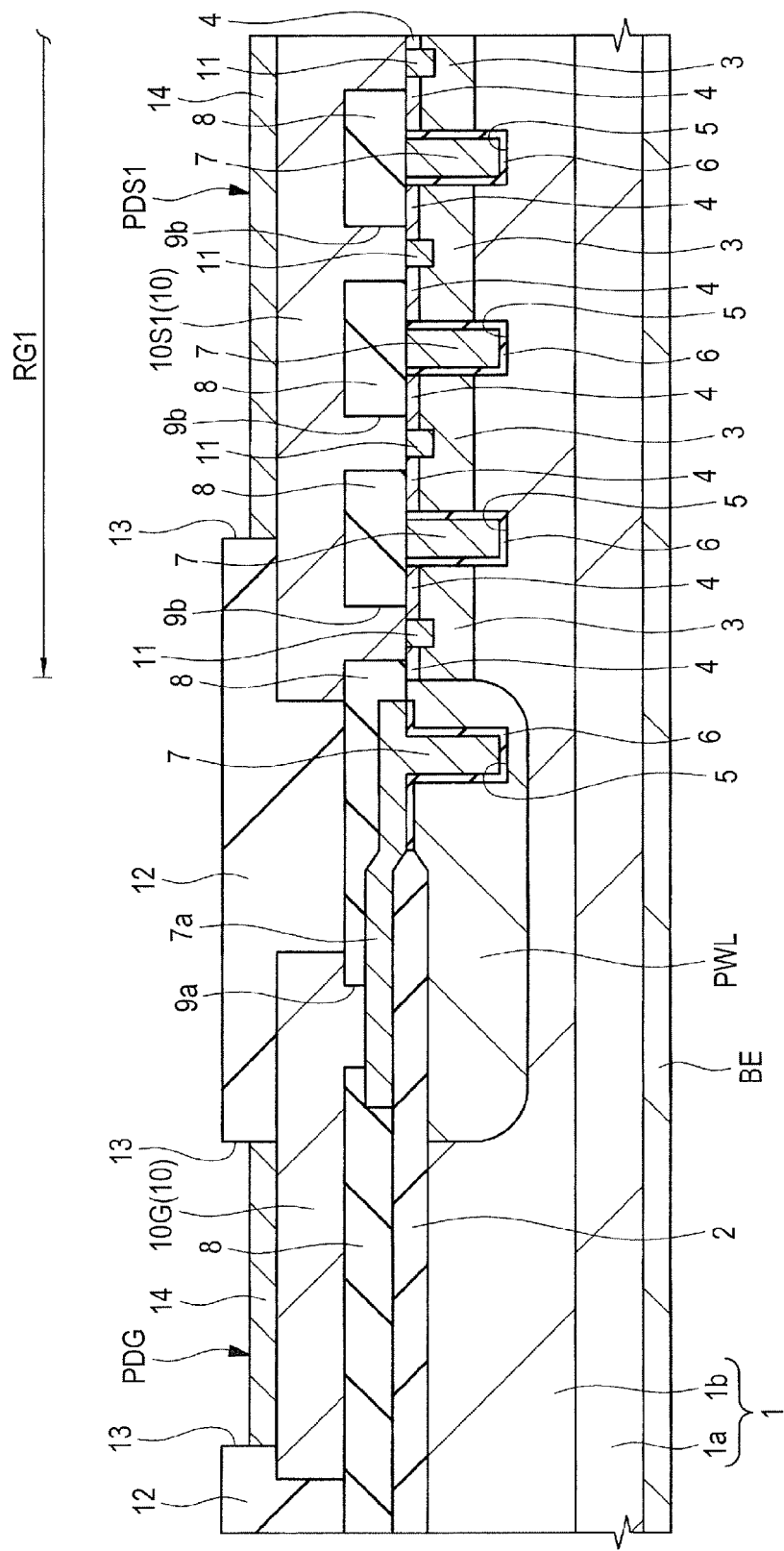
FIG. 17 is a main-portion cross-sectional view of the semiconductor chip used in the semiconductor device as the embodiment of the present invention.
Figure 18:
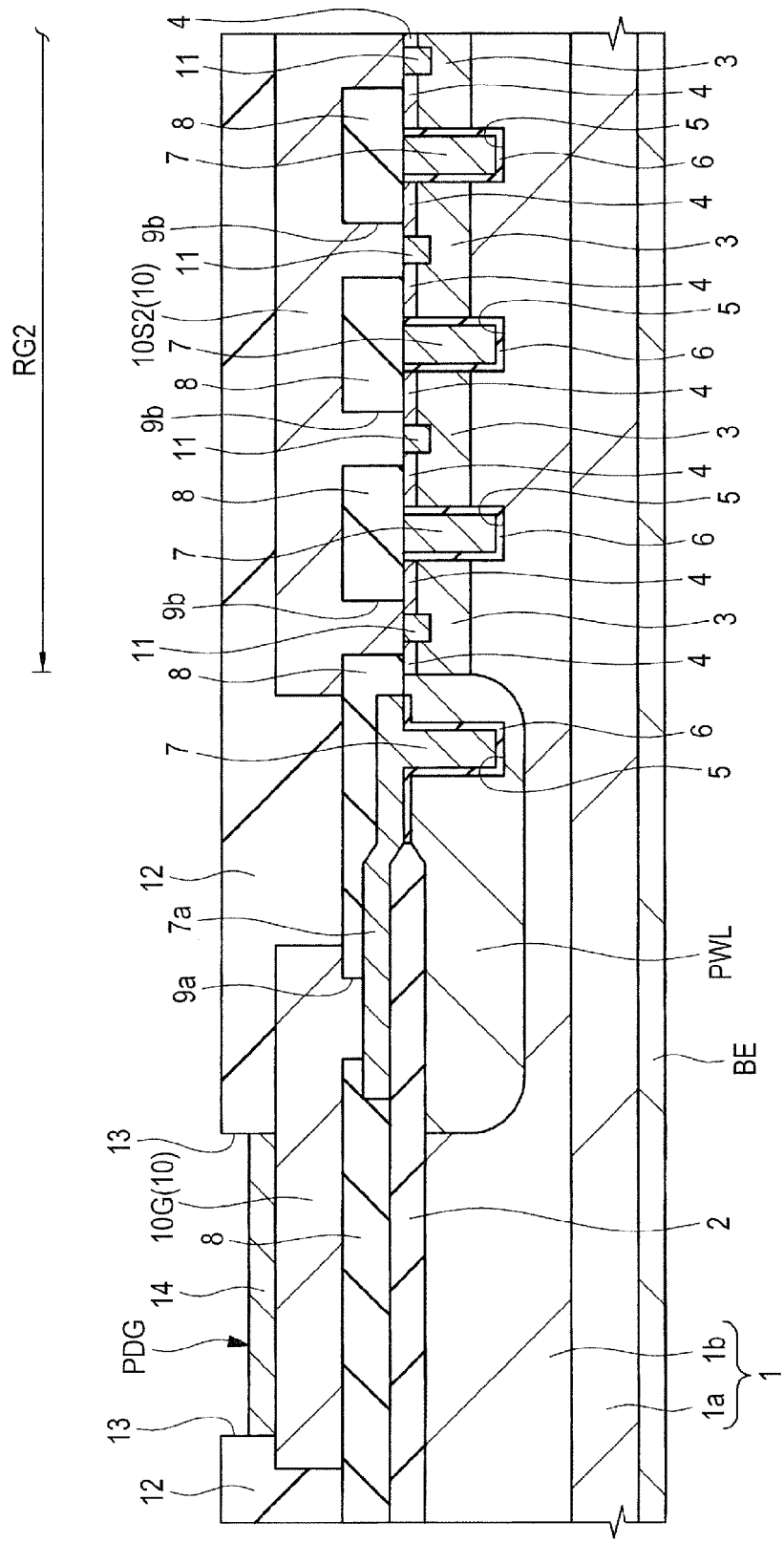
FIG. 18 is a main-portion cross-sectional view of the semiconductor chip used in the semiconductor device as the embodiment of the present invention.
Figure 19:
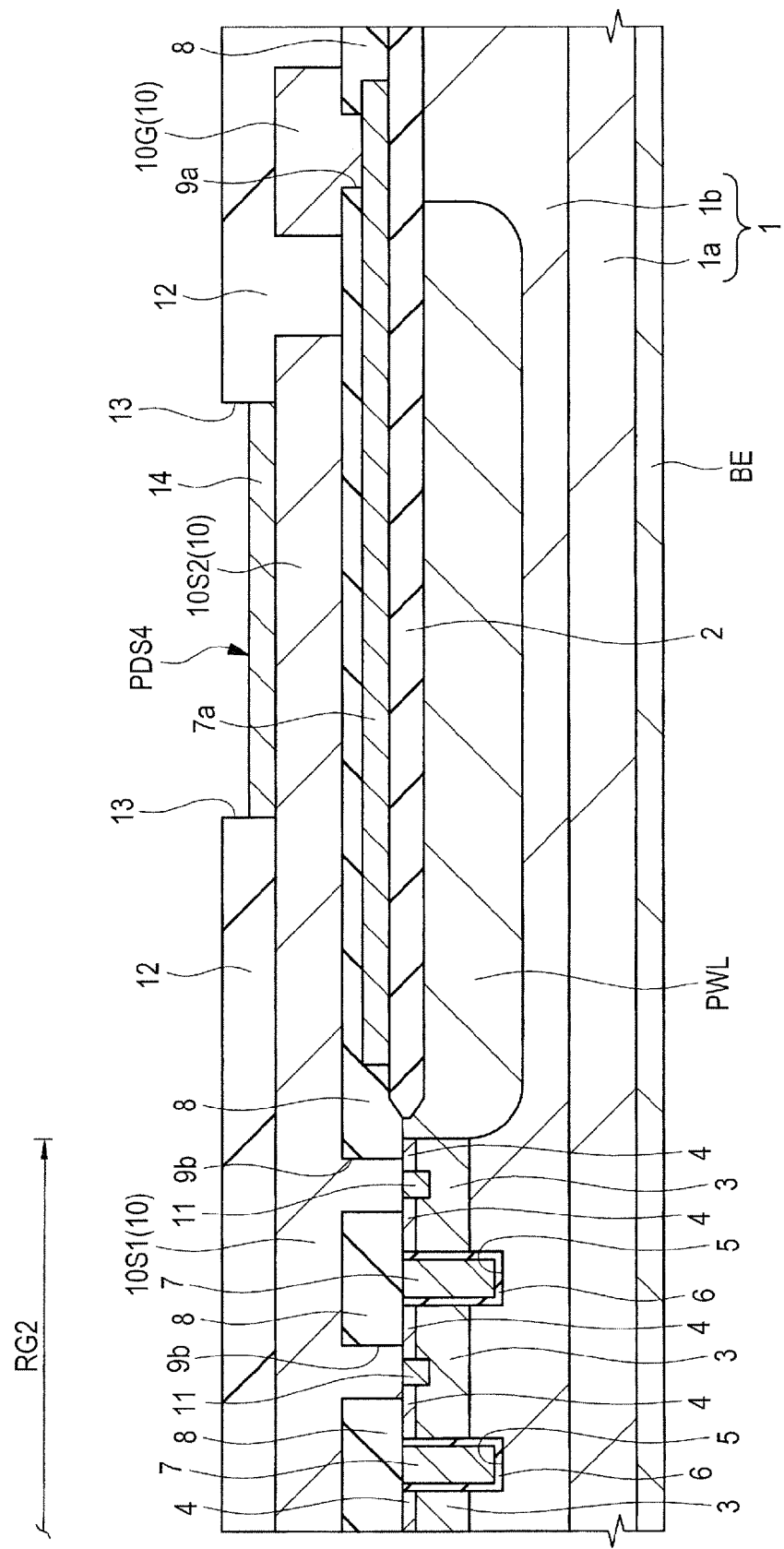
FIG. 19 is a main-portion cross-sectional view of the semiconductor chip used in the semiconductor device as the embodiment of the present invention.

FIGS. 13 to 15 are plan views showing the chip layout of the semiconductor chip CP1. FIG. 16 is a partially enlarged plan view (main-portion plan view) of the semiconductor chip CP1. FIGS. 17 to 19 are main-portion cross-sectional views of the semiconductor chip CP1. Among them, FIG. 13 corresponds to the top view of the semiconductor chip CP1, and shows the top surface side (i.e., main surface having the pad electrodes PD formed thereover) of the semiconductor chip CP1. FIG. 13 is a plan view but, for easier understanding, the bonding pads (pad electrodes PD including the pad electrodes PDG, PDS1, PDS2, PDS3, and PDS4) are hatched therein. In FIG. 13, the sense MOSFET region RF2 is also shown for easier understanding, but the sense MOSFET region RG2 is actually covered with the uppermost-layer protective film (corresponding to the foregoing protective film 12) of the semiconductor chip CP1. FIG. 14 is a plan view, but shows the main MOSFET region RG1 and the sense MOSFET region RG2 in the semiconductor chip CP1 by hatching, and shows the positions of the bonding pads (pad electrodes PD including the pad electrodes PDG, PDS1, PDS2, PDS3, and PDS4) by the dotted lines. FIG. 15 is a plan view, but shows the layout of source wires 10S1 and 10S2 in the semiconductor chip CP1 by the hatched regions, and shows the positions of the bonding pads (pad electrodes PD including the pad electrodes PDG, PDS1, PDS2, PDS3, and PDS4) by the dotted lines. Note that the positions of the bonding pads (pad electrodes PD including the pad electrodes PDG, PDS1, PDS2, PDS3, and PDS4) shown by the dotted lines in FIGS. 14 and 15 correspond to the regions shown by hatching in FIG. 13. FIG. 16 is a partially enlarged plan view obtained by enlarging a region 20 enclosed by the two-dot-dash line in FIG. 13, and shows the layout of the main MOSFET region RG1, the sense MOSFET region RG2, the pad electrodes PDS1 and PDS4, and the source wires 10S1 and 10S2. In FIG. 17, the portion (range) denoted by the mark RG1 corresponds to the main-portion cross-sectional view of the main MOSFET region RG1. In FIG. 18, the portion (range) denoted by the mark RG2 corresponds to the main-portion cross-sectional view of the sense MOSFET region RG2. FIG. 19 substantially corresponds to a cross-sectional view along the line B1-B1 of FIG. 16.

The foregoing power MOSFET QH is formed in the main surface of a semiconductor substrate (hereinafter simply referred to as a substrate) 1 forming the semiconductor chip CP1. As shown in FIGS. 17 to 19, the substrate 1 has a substrate main body (semiconductor substrate or semiconductor wafer) 1a comprised of, e.g., $n^+$-type single-crystal silicon into which arsenic (As) has been introduced or the like, and an epitaxial layer (semiconductor layer) 1b comprised of, e.g., $n^-$-type single-crystal silicon and formed over the main surface of the substrate main body 1a. Accordingly, the substrate 1 is a so-called epitaxial wafer. In the main surface of the epitaxial layer 1b, a field insulating film (isolation region) 2 comprised of, e.g., a silicon oxide or the like is formed. The field insulating film 2 is formed of an insulator such as a silicon oxide, and can function as the isolation region for delimiting (defining) active regions.

In the main MOSFET region RG1, in the active region surrounded by the field insulating film 2 and a p-type well PWL in a layer located thereunder, a plurality of unit transistor cells forming the power MOSFET QH are formed. The power MOSFET QH is formed of the plurality of unit transistor cells provided in the main MOSFET region RG1 and coupled in parallel to each other. In the sense MOSFET region RG2, in the active region surrounded by the field insulating film 2 and the p-type well PWL in the layer located thereunder, a plurality of unit transistor cells forming the sense MOSFET QS are formed. The sense MOSFET QS is formed of the plurality of unit transistor cells provided in the sense MOSFET region RG2 and coupled in parallel to each other. The individual unit transistor cells formed in the main MOSFET region RG1 and the individual unit transistor cells formed in the sense MOSFET region RG2 have basically the same structures (configurations). However, the main MOSFET region RG1 is different in area from the sense MOSFET region RG2, and the area of the main MOSFET region RG1 is larger than that of the sense MOSFET region RG2. In other words, the area of the sense MOSFET region RG2 is smaller than that of the main MOSFET region RG1. Accordingly, the number of the coupled unit transistor cells in the power MOSFET QH is different from the number of the coupled unit transistor cells in the sense MOSFET QS. The number of the unit transistor cells forming the sense MOSFET QS and coupled in parallel to each other is smaller than the number of the unit transistor cells forming the power MOSFET QH and coupled in parallel to each other. As a result, as long as the source potential in the sense MOSFET QS is the same as the source potential in the power MOSFET QH, in the sense MOSFET QS, a current smaller than the current flowing in the power MOSFET QH flows. Each of the unit transistor cells in the main MOSFET region RG1 and the sense MOSFET region RG2 is formed of, e.g., an n-channel MOSFET having a trench gate structure.

The foregoing substrate main body 1a and the epitaxial layer 1b have the function of the drain region of each of the foregoing unit transistor cells. Over the back surface (entire back surface) of the substrate 1 (semiconductor chip CP1), the drain back-side electrode (back-side drain electrode or drain electrode) BE is formed. The back-side electrode BE is formed by successively stacking, e.g., a titanium (Ti) layer, a nickel (Ni) layer, and a gold (Au) layer in an ascending order from the back surface of the substrate 1. In the foregoing semiconductor device PKG, the back-side electrode BE of the semiconductor chip CP1 is bonded to the foregoing die pad DP1 via the foregoing adhesive layer BD1 to be electrically coupled thereto.

In the main MOSFET region RG1 and the sense MOSFET region RG2, a p-type semiconductor region 3 formed in the epitaxial layer 1b has the function of the channel formation region of each of the foregoing unit transistor cells. In addition, an $n^+$-type semiconductor region 4 formed over the p-type semiconductor region 3 has the function of the source region of each of the foregoing unit transistor cells. Accordingly, the semiconductor region 4 is a source semiconductor region.

In the main MOSFET region RG1 and the sense MOSFET region RG2, trenches 5 are formed in the substrate 1 to extend from the main surface thereof in the thickness direction of the substrate 1. The trenches 5 are formed to extend from the upper surface of the $n^+$-type semiconductor region 4 through the $n^+$-type semiconductor region 4 and the p-type semiconductor region 3 and terminate in the epitaxial layer 1b in a layer located thereunder. Over the bottom surfaces and side surfaces of the trenches 5, gate insulating films 6 each comprised of a silicon oxide or the like are formed. In the trenches 5, gate electrodes 7 are embedded via the foregoing gate insulating films 6. The gate electrodes 7 are each comprised of a polysilicon film into which, e.g., an n-type impurity (e.g., phosphorus) has been introduced. Each of the gate electrodes 7 has the function of the gate electrode of each of the foregoing unit transistor cells.

Over a part of the field insulating film 2 also, wiring portions 7a for gate extraction each comprised of a conductive film in the same layer as those of the gate electrodes 7 are formed. The gate electrodes 7 and the wiring portions 7a for gate extraction are integrally formed and electrically coupled to each other. Each of the wiring portions 7a for gate extraction is electrically coupled to a gate wire 10G through a contact hole (opening or through hole) 9a formed in an insulating film 8 covering the wiring portions 7a for gate extraction.

The gate wire 10G is electrically coupled to the plurality of gate electrodes 7 formed in the main MOSFET region RG1 through the wiring portions 7a for gate extraction, and also electrically coupled to the plurality of gate electrodes 7 formed in the sense MOSFET region RG2 through the wiring portions 7a for gate extraction. Accordingly, the gate wire 10G is electrically coupled to the gate electrodes 7 (i.e., the gate electrodes 7 for the foregoing power MOSFET QH) in the main MOSFET region RG1 and to the gate electrodes 7 (i.e., the gate electrodes 7 for the foregoing sense MOSFET QS) in the sense MOSFET region RG2.

On the other hand, the source wire 10S1 is electrically coupled to the $n^+$-type source semiconductor region 4 formed in the main MOSFET region RG1 through contact holes (openings or through holes) 9b formed in the insulating film 8 in the main MOSFET region RG1. The source wire 10S1 is also electrically coupled to a $p^+$-type semiconductor region 11 formed in the upper portions of the p-type semiconductor region 3 and between the portions of the $n^+$-type semiconductor region 4 adjacent to each other in the main MOSFET region RG1. Through the $p^+$-type semiconductor region 11, the source wire 10S1 is electrically coupled to the p-type semiconductor region 3 for channel formation in the main MOSFET region RG1.

The source wire 10S2 is electrically coupled to the $n^+$-type source semiconductor region 4 formed in the sense MOSFET region RG2 through the contact holes (openings or through holes) 9b formed in the insulating film 8 in the sense MOSFET region RG2. The source wire 10S2 is electrically coupled to the $p^+$-type semiconductor region 11 formed in the upper portions of the p-type semiconductor region 3 and between the portions of the $n^+$-type semiconductor region 4 adjacent to each other in the sense MOSFET region RG2. Through the $p^+$-type semiconductor region 11, the source wire 10S2 is electrically coupled to the p-type semiconductor region 3 for channel formation in the sense MOSFET region RG2.

The gate wire 10G and the source wires 10S1 and 10S2 are formed by forming a conductor film 10 over the insulating film 8 formed with the contact holes 9a and 9b so as to fill the contact holes 9a and 9b, and patterning the conductor film 10. That is, the gate wire 10G and the source wires 10S1 and 10S2 are each formed of the patterned conductor film 10. It is also possible to regard the patterned conductor film 10 as a wire. The conductor film 10 is comprised of a metal film, and preferably comprised of an aluminum film or an aluminum alloy film. Accordingly, the gate wire 10G and the source wires 10S1 and 10S2 are each formed of the conductor film 10 in the same layer, but are isolated from each other.

The conductor film 10 (including the gate wire 10G and the source wires 10S1 and 10S2) is covered with the insulating protective film (insulating film) 12 comprised of a polyimide resin or the like. That is, over the insulating film 8, the protective film 12 is formed so as to cover the conductor film 10 (including the gate wire 10G and the source wires 10S1 and 10S2). The protective film 12 is the uppermost-layer film (insulating film) of the semiconductor chip CP1. In the protective film 12, a plurality of openings 13 are formed and, from each of the openings 13, a part of the conductor film 10 is exposed. The conductor film 10 exposed from the openings 13 serves as the pad electrodes (bonding pads). The foregoing pad electrodes PDG, PDS1, PDS2, PDS3, and PDS4 are each formed of the conductor film 10 exposed from the openings 13.

That is, the gate wire 10G exposed from the opening 13 forms the gate pad (pad electrode or bonding pad) PDG of the foregoing power MOSFET QH and sense MOSFET QS. Also, the source wire 10S1 exposed from the openings 13 forms the source pads (pad electrodes or bonding pads) PDS1, PDS2, and PDS3 of the foregoing power MOSFET QH. Also, the source wire 10S2 exposed from the opening 13 forms the source pad (pad electrode or bonding pad) PDS4 of the foregoing sense MOSFET QS. As described above, the source pad electrodes PDS1, PDS2, and PDS3 of the foregoing power MOSFET QH are separated by the uppermost-layer protective film 12, but are electrically coupled to each other through the source wire 10S1. On the other hand, the source wire 10S2 is separated from the source wire 10S1 so that the source pad PDS4 of the sense MOSFET QS is electrically isolated from the source pad electrodes PDS1, PDS2, and PDS3 of the power MOSFET QH without being short-circuited thereto.

Over the surface of each of the pad electrodes PDS1, PDS2, PDS3, PDS4, and PDG (i.e., over each of the portions of the conductor film 10 exposed at the bottom portions of the openings 13), a metal layer 14 may also be formed by a plating method or the like. The metal layer 14 is comprised of, e.g., a laminate film of a copper (Cu) film, a nickel (Ni) film, and a gold (Au) film which are formed successively in an ascending order, a laminate film of a titanium (Ti) film, a nickel (Ni) film, and a gold (Au) film formed successively in an ascending order, or the like. By forming the metal layer 14, it is possible to inhibit or prevent the surface of aluminum of the conductor film 10 from being oxidized.

In the semiconductor device PKG, as can be also seen from FIGS. 3 to 7 described above, the metal plate MPL is bonded to the pad electrode PDS1 included in the plurality of pad electrodes PD of the semiconductor chip CP1. To the other pad electrodes PD (including the pad electrodes PDG, PDS2, PDS3, and PDS4), the bonding wires BW are coupled. That is, the pad electrode PDS1 of the semiconductor chip CP1 is electrically coupled to the leads LD1 via the metal plate MPL. The pad electrode PDG of the semiconductor chip CP1 is electrically coupled to the pad electrode PD2 of the semiconductor chip CP2 via the bonding wire BW. The pad electrode PDS2 of the semiconductor chip CP1 is electrically coupled to the pad electrode PD2 of the semiconductor chip CP2 via the bonding wire BW. The pad electrode PDS3 of the semiconductor chip CP1 is electrically coupled to the pad electrode PD2 of the semiconductor chip CP2 via the bonding wire BW. The pad electrode PDS4 of the semiconductor chip CP1 is electrically coupled to the pad electrode PD2 of the semiconductor chip CP2 via the bonding wire BW.

In the semiconductor chip CP1 having such a configuration, the operating currents of the unit transistor cells of the foregoing power MOSFET QH and sense MOSFET QS flow in the thickness direction of the substrate 1 between the drain epitaxial layer 1b and the $n^+$-type source semiconductor region 4 and along the side surfaces of the gate electrodes 7 (i.e., the side surfaces of the trenches 5). That is, the channels are formed along the thickness direction of the semiconductor chip CP1.

Thus, in the semiconductor chip CP1, the vertical MOSFETs each having a trench-gate structure are formed, and each of the foregoing power MOSFET QH and sense MOSFET QS is formed of a trench-gate MISFET. Here, the vertical MOSFET corresponds to a MOSFET in which a current between the source and the drain flows in the thickness direction (direction generally perpendicular to the main surface of a semiconductor substrate) of the semiconductor substrate (substrate 1).

<About Problem to be Solved>

In the semiconductor chip CP1, not only the power MOSFET QH, but also the sense MOSFET QS for sensing a current flowing in the power MOSFET QH is formed. By bonding the semiconductor chip CP1 to the upper surface of the conductive die pad DP1 as the chip mounting portion via the conductive bonding material (adhesive layer BD1), performing the coupling of the bonding wires BW and the coupling of the metal plate MPL, and sealing them in a resin, the semiconductor device PKG is formed. A configuration is provided in which, over the entire back surface of the semiconductor chip CP1, the back-side electrode BE is formed, and a current flows between the back-side electrode BE of the semiconductor chip CP1 and the die pad DP1 via the conductive bonding material (adhesive layer BD1).

However, the present inventors have found that, when a thermal stress (such as, e.g., a thermal load during the use of such a semiconductor device or a temperature cycle test) is applied to the semiconductor device, a crack or peel-off may occur in the bonding material bonding the die pad DP1 to the semiconductor chip CP1 to possibly degrade the accuracy of sensing the current flowing in the power MOSFET QH by means of the sense MOSFET QS. This will be described below with reference to FIGS. 20 and 21.

Figure 20:
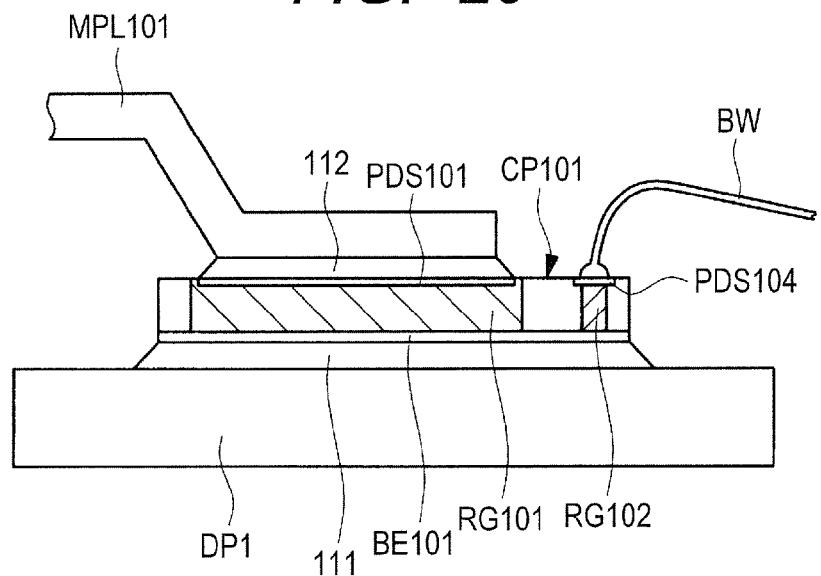
FIG. 20 is an illustrative view of a problem to be solved.
Figure 21:
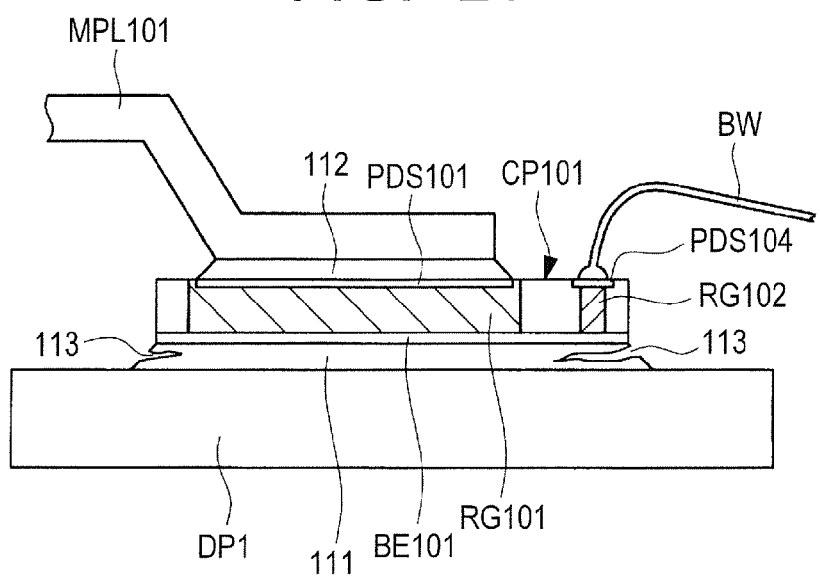
FIG. 21 is an illustrative view of the problem to be solved.

FIGS. 20 and 21 are illustrative views of the problem found by the present inventors, and show a state in which a semiconductor chip CP101 corresponding to the semiconductor chip CP1 is mounted over the die pad DP1 and bonded thereto via a solder 111 and, in addition, the bonding wires BW and a metal plate MPL101 have been coupled to the semiconductor chip CP101. Actually, resin sealing has been performed, and a semiconductor device (semiconductor package) such as the foregoing semiconductor device PKG has been formed. However, in FIGS. 20 and 21, illustration of the foregoing sealing portion MR is omitted. Note that FIGS. 20 and 21 are cross-sectional views but, for improved clarity of illustration, hatching of the regions other than a main MOSFET region RG101 and a sense MOSFET region RG102 is omitted.

In FIG. 20, a back-side electrode BE101 is formed over the entire back surface of the semiconductor chip CP101. The back-side electrode BE101 of the semiconductor chip CP101 is bonded to the die pad DP1 via the solder 111. Over the top surface of the semiconductor chip CP101, a source pad electrode PDS101 for the foregoing power MOSFET QH and a source pad electrode PDS104 for the foregoing sense MOSFET QS are formed. To the pad electrode PDS101, the metal plate MPL101 is bonded via a solder 112. To the pad electrode PDS104, the bonding wire BW is coupled. The semiconductor chip CP101 is provided with the main MOSFET region RG101 (corresponding to the foregoing main MOSFET region RG1) where the foregoing power MOSFET QH is formed and with the sense MOSFET region RG102 where the foregoing sense MOSFET QS is formed. Here, the back-side electrode BE101 corresponds to the foregoing back-side electrode BE, the pad electrode PDS101 corresponds to the foregoing pad electrode PDS1, the pad electrode PDS104 corresponds to the foregoing pad electrode PDS4, and the metal plate MPL101 corresponds to the foregoing metal plate MPL. Also, the main MOSFET region RG101 corresponds to the foregoing main MOSFET region RG1, the sense MOSFET region RG102 corresponds to the foregoing sense MOSFET region RG2, the solder 111 corresponds to the foregoing adhesive layer BD1, and the solder 112 corresponds to the foregoing adhesive layer BD3. In the semiconductor chip CP101, the sense MOSFET region RG102 is formed at a position two-dimensionally overlapping the pad electrode PDS104 (i.e., position overlapping the pad electrode PDS104 when viewed in a plane parallel with the main surface of the semiconductor chip CP101). Note that in the semiconductor chip CP101 of FIGS. 20 and 21 and the foregoing semiconductor chip CP1, the positions of the sense MOSFET regions RG1 and RG102 are different.

In the configuration of FIG. 20, a current flowing in the foregoing power MOSFET QH flows from the die pad DP1 to the metal plate MPL101 via the solder 111, the back-side electrode BE101, the main MOSFET region RG101 (the foregoing power MOSFET QH formed therein) of the semiconductor chip CP101, the pad electrode PDS101, and the solder 112. In the configuration of FIG. 20, a current flowing in the foregoing sense MOSFET QS flows from the die pad DP1 to the bonding wires BW via the solder 111, the back-side electrode BE101, the sense MOSFET region RG102 (the foregoing sense MOSFET QS formed therein) of the semiconductor chip CP101, and the pad electrode PDS104.

However, when a thermal stress (such as, e.g., a thermal load during the use of the semiconductor device or a temperature cycle test) is applied to the semiconductor device, a crack (hereinafter denoted by the mark 113 and referred to as the crack 113) may occur in the solder 111. Instead, a peel-off may occur but, in the present embodiment, a description will be given on the assumption that the peel-off is included in the crack.

FIG. 21 shows a state in which, in FIG. 20, a thermal stress has caused the crack 113 in the solder 111. The solder 111 is interposed between the entire back surface of the semiconductor chip CP101 and the upper surface of the die pad DP1, and the crack 113 that has occurred first in the peripheral portion (outer peripheral portion) of the solder 111 extends therefrom in an inward direction (inner direction). The region where the crack 113 has occurred is unlikely to allow a current to pass therethrough, and can no longer function as the path of the current.

Therefore, when the crack 113 occurs in the solder 111 to reach a position under the sense MOSFET region RG102, a resistive component resulting from the crack 113 is undesirably added to the path of the current flowing in the foregoing sense MOSFET QS. This may degrade the accuracy in sensing the current flowing in the power MOSFET QH by means of the sense MOSFET QS, which will be described below.

In the foregoing semiconductor chip CP1 and the semiconductor chip CP101 shown in FIGS. 20 and 21, the main MOSFET regions (RG1 and RG101) where MOSFETs forming the power MOSFETs QH are formed and the sense MOSFET regions (RG2 and RG102) where MOSFETs forming the sense MOSFETs QS are formed are present. The main MOSFET regions (RG1 and RG101) and the sense MOSFET regions (RG2 and RG102) are different in area (the areas of the main MOSFET regions are larger than those of the sense MOSFET regions). It is assumed that the area ratios between the main MOSFET regions (RG1 and RG101) and the sense MOSFET regions (RG2 and RG102) in the semiconductor chips CP1 and CP101 are set so as to provide predetermined ratios, e.g., 20000:1 between currents flowing in the power MOSFETs QH and currents flowing in the sense MOSFETs QS.

When the crack 113 occurs in the solder 111 and a current flows so as to avoid the crack 113, since the area of the main MOSFET region RG101 is larger than that of the sense MOSFET region RG102 and accounts for a considerable proportion of the area of the semiconductor chip CP101, the resistance of a path in which the current flows from the die pad DP1 into the main MOSFET region RG101 (into the transistors thereof) through the solder 111 is not greatly affected by the presence or absence of the crack 113. However, the area of the sense MOSFET region RG102 is considerably smaller than that of the main MOSFET region RG101 and, if the crack 113 extends under the sense MOSFET region RG102 as shown in FIG. 21, a path in which the current flows from the die pad DP1 into the sense MOSFET region RG102 (into the transistors thereof) through the solder 111 becomes accordingly circuitous due to the current flowing while bypassing the crack 113. Consequently, the resistance of the path increases to have a rather large value.

When the crack 113 is not formed as shown in FIG. 20, the current flowing in the sense MOSFET QS is $1/20000$ of the current flowing in the power MOSFET QH. However, when the crack 113 extends under the sense MOSFET region RG102 as shown in FIG. 21, the current ratio changes and, consequently, the current flowing in the sense MOSFET QS undesirably becomes smaller than $1/20000$ of the current flowing in the power MOSFET QH.

Accordingly, even when the semiconductor chip CPH101 is designed such that the current flowing in the sense MOSFET QS is originally $1/20000$ of the current flowing in the power MOSFET QH, if the crack 113 that has occurred in the solder 111 extends to a position under the sense MOSFET region RG102 as shown in FIG. 21, the current flowing in the sense MOSFET QS becomes far smaller than $1/20000$ of the current flowing in the power MOSFET QH. As a result, even if the current flowing in the power MOSFET QH is to be sensed by means of the sense MOSFET QS, the accuracy thereof is degraded, and the current flowing in the power MOSFET QH is sensed as a current lower than the actually flowing current.

Therefore, when whether or not the current flowing in the power MOSFET QH has exceeded a given limit value is to be sensed by means of the sense MOSFET QS, if the crack 113 has not occurred, accurate sensing can be performed by means of the sense MOSFET QS. However, if the crack 113 has occurred so as to extend to a position under the sense MOSFET region RG2, sensing cannot be performed properly by means of the sense MOSFET QS, and a moment at which the current flowing in the power MOSFET QH has exceeded the given limit value may be missed. For example, in the case where the current flowing in the sense MOSFET QS, which is 1/20000 of the current flowing in the power MOSFET QH in the absence of the crack 113, becomes 1/22000 of the current flowing in the power MOSFET QH due to the occurrence of the crack 113, when the current in the power MOSFET QH no longer has the limit value and exceeds 1.1 times the limit value, the sense MOSFET QS senses the value exceeding the limit value.

A phenomenon in which the accuracy of sensing the current flowing in the power MOSFET QH by means of the sense MOSFET QH is thus degraded by the crack 113 is accelerated by the occurrence of the crack 113 under the sense MOSFET region RG2. To prevent this, in the present embodiment, the positional relationship between the sense MOSFET region RG2 and the metal plate MPL and the like are adjusted so as not to cause the crack 113 under the sense MOSFET region RG2, as will be described later.

Note that the problem resulting from the crack 113 described above with reference to FIGS. 20 and 21 occurs particularly remarkably when a bonding material (die bonding material) for die-bonding the semiconductor chip CP101 to the die pad DP1 is a solder, but may also occur when a conductive bonding material (die bonding material) other than a solder is used. Accordingly, the present embodiment is particularly effective when the bonding material (i.e., the foregoing adhesive layer BD1) for die-bonding the semiconductor chip CP1 to the die pad DP1 is a solder, but is also effective when a conductive bonding material other than a solder, e.g., a paste-type conductive bonding material such as a silver paste is used.

<About Layout of Semiconductor Chip>

Next, the chip layout of the semiconductor chip CP1 will be described with reference to FIGS. 22 to 25 and FIGS. 13 to 16 described above.

Figure 22:
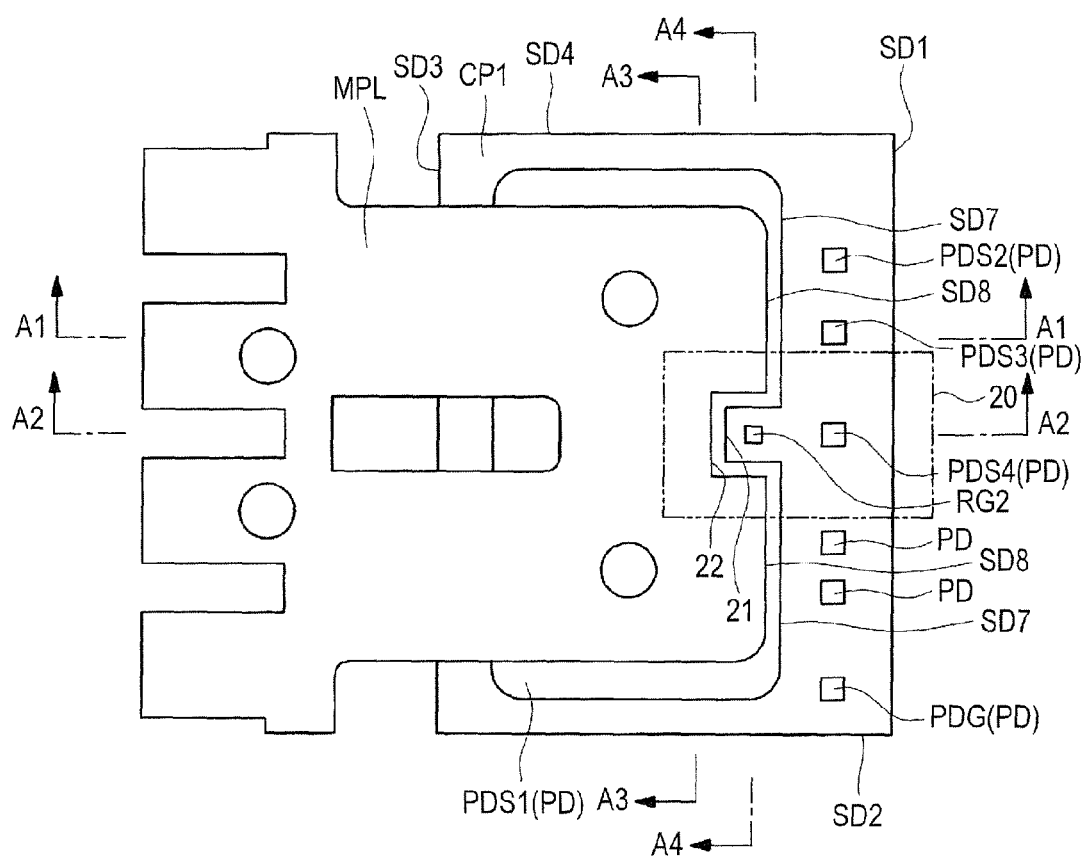
FIG. 22 is an illustrative view of the semiconductor device as the embodiment of the present invention.
Figure 23:
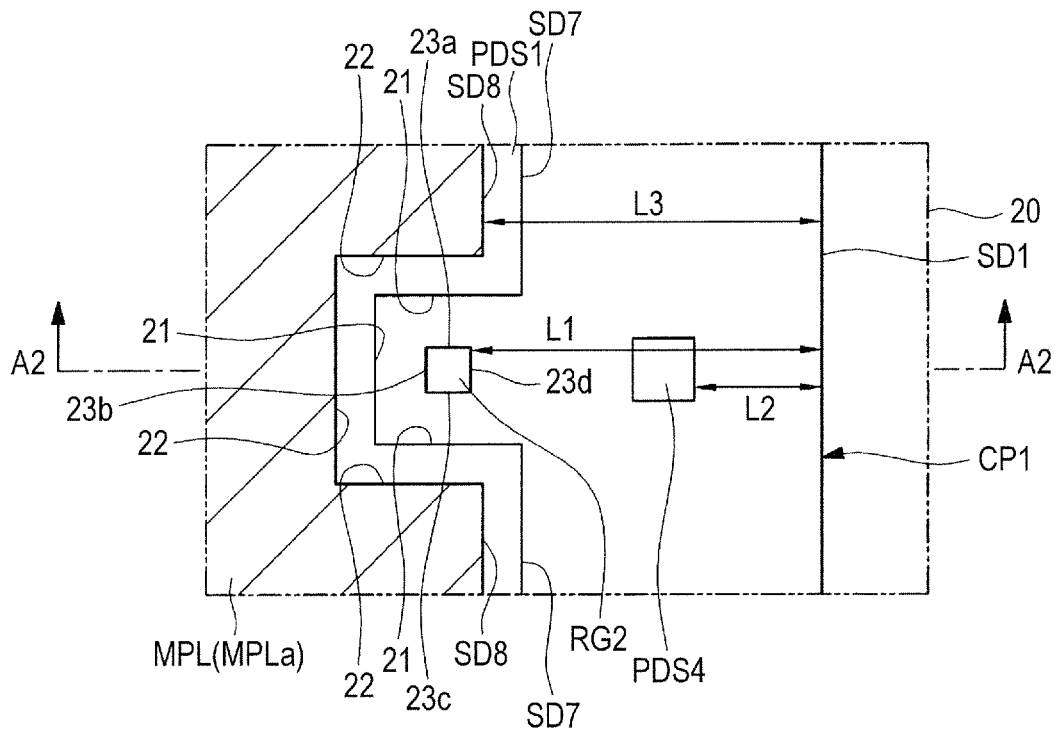
FIG. 23 is a partially enlarged plan view of FIG. 22.
Figure 24:
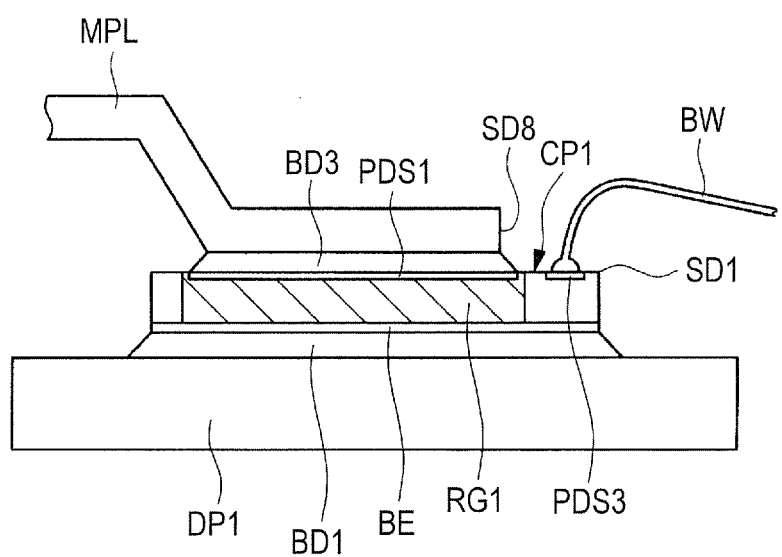
FIG. 24 is an illustrative view of the semiconductor device as the embodiment of the present invention.
Figure 25:
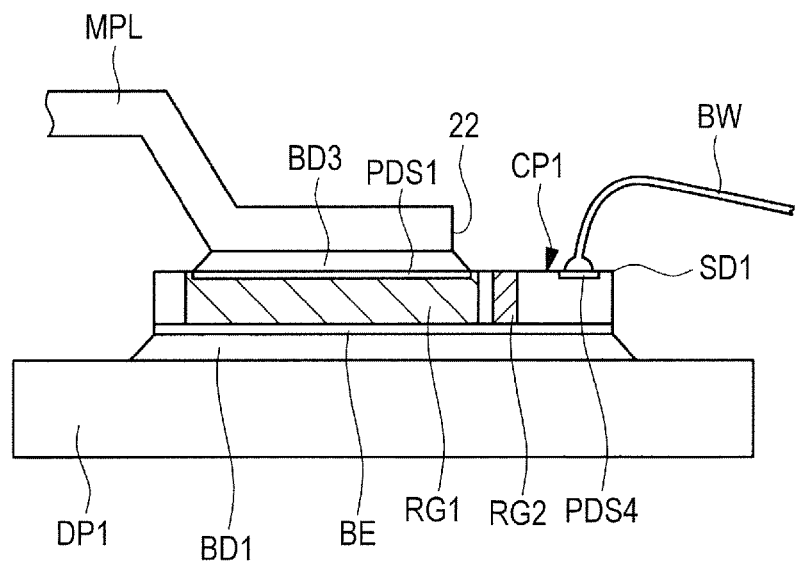
FIG. 25 is an illustrative view of the semiconductor device as the embodiment of the present invention.

FIG. 22 is an illustrative view of the semiconductor device PKG of the present embodiment, and shows a plan view (top view) showing a state in which the metal plate MPL is bonded to the semiconductor chip CP1. In FIG. 22, if the semiconductor device PKG is viewed through the metal plate MPL (if the metal plate MPL is removed), the same view as FIG. 13 described above is obtained. It can also be said that FIG. 22 is a view showing only the semiconductor chip CP1 and the metal plate MPL of FIG. 7 described above under magnification, and FIG. 13 described above is a view showing only the semiconductor chip CP1 of FIG. 8 described above under magnification. Note that FIG. 22 also shows the sense MOSFET region RG2 but, actually, the sense MOSFET region RG2 is covered with the uppermost-layer protective film (corresponding to the foregoing protective film 12) of the semiconductor chip CP1. FIG. 23 is a partially enlarged plan view obtained by enlarging a region 20 enclosed by the two-dot-dash line in FIG. 22, and shows the layout of the metal plate MPL, the sense MOSFET region RG2, the pad electrode PDS1, and the pad electrode PDS4. FIGS. 24 and 25 are illustrative views of the semiconductor device PKG of the present embodiment, and show a state in which the semiconductor chip CP1 is mounted over the die pad DP1 via the adhesive layer BD1 and bonded thereto and, in addition, the bonding wires BW and the metal plate MPL have been coupled to the semiconductor chip CP1. Actually, resin sealing has been performed (sealing portion MR has been formed), and the semiconductor device PKG as shown in FIGS. 1 to 9 described above has been formed. However, in FIGS. 24 and 25, illustration of the foregoing sealing portion MR is omitted. Note that FIGS. 24 and 25 are cross-sectional views but, for improved clarity of illustration, hatching of the regions other than the main MOSFET region RG1 and the sense MOSFET region RG2 is omitted. Since FIG. 24 corresponds to a cross-sectional view at a position along the line A1-A1 in FIGS. 7 and 22 described above and FIG. 25 corresponds to a cross-sectional view at a position along the line A2-A2 in FIGS. 7 and 22 described above, FIG. 24 corresponds to FIG. 3 described above and FIG. 25 corresponds to FIG. 4 described above. In FIG. 22, the lines A3-A3 and A4-A4 are shown at the same positions as the lines A3-A3 and A4-A4 in FIG. 7 described above. Accordingly, it can also be said that FIG. 5 described above corresponds to a cross-sectional view at the position along the line A3-A3 in each of FIGS. 7 to 22 described above, and FIG. 6 described above corresponds to a cross-sectional view at the position along the line A4-A4 in each of FIGS. 7 to 22 described above. Note that the lines A2-A2 and A4-A4 in FIGS. 7 and 22 described above extend through (traverse) the sense MOSFET regions RG2, and the lines A1-A1 and A3-A3 in FIGS. 7 and 22 described above do not extend through (do not traverse) the sense MOSFET regions RG2.

The semiconductor chip CP1 of the present embodiment is formed not only with the power MOSFET QH, but also with the sense MOSFET QS for sensing the current flowing in the power MOSFET QH. That is, the semiconductor chip CP1 of the present embodiment is formed with the power MOSFET QH and the sense MOSFET QS, and has the main MOSFET region RG1 where the vertical MOSFETs corresponding to the power MOSFET QH are formed, and the sense MOSFET region RG2 where the vertical power MOSFETs corresponding to the sense MOSFET QS are formed, as shown in FIG. 14 described above or the like.

Over the main surface (top surface) of the semiconductor chip CP1, the plurality of pad electrodes PD including the source pad electrodes PDS1, PDS2, PDS3, and PDS4 and the gate pad electrode PDG are formed. Among them, the pad electrode PDS1 is bonded (coupled) to the metal plate MPL, and the pad electrodes PD (including the pad electrodes PDS2, PDS3, PDS4, and PDG) other than the pad electrode PDS1 are coupled to the bonding wires BW.

When attention is focused on the two-dimensional positional relationship between the metal plate MPL and the sense MOSFET region RG2, as also shown in FIGS. 22, 23, and the like, in the plan view, the metal plate MPL and the sense MOSFET region RG2 do not overlap each other, and the three sides of the sense MOSFET region RG2 are surrounded by the metal plate MPL. That is, in the plan view, the sense MOSFET region RG2 has a generally rectangular two-dimensional shape, and the three sides (three sides of the sense MOSFET region RG2) of the four sides of the rectangle oppose the metal plate MPL.

When attention is also focused on the two-dimensional positional relationship between the pad electrode PDS1 and the sense MOSFET region RG2, as also shown in FIGS. 13, 16, 22, 23, and the like, in the plan view, the pad electrode PDS1 and the sense MOSFET region RG2 do not overlap, and the pad electrode PDS1 surrounds the three sides of the sense MOSFET region RG2. In other words, the three sides of the sense MOSFET region RG2 oppose the pad electrode PDS1.

The metal plate MPL is bonded to the pad electrode PDS1 of the semiconductor chip CP1. Specifically, the portion of the metal plate MPL two-dimensionally overlapping the pad electrode PDS1 of the semiconductor chip CP1 (in the plan view) is bonded (coupled or adhesively bonded) to the pad electrode PDS1 via the conductive adhesive layer (bonding material) BD. Accordingly, in the plan view, the bonded portion (bonded region) between the metal plate MPL and the pad electrode PDS1 does not overlap the sense MOSFET region RG2, and the bonded portion (bonded region) between the metal plate MPL and the pad electrode PDS1 surrounds the three sides of the sense MOSFET region RG2. In other words, the three sides of the sense MOSFET region RG2 oppose the bonded portion (portion bonded with the adhesive layer BD) between the metal plate MPL and the pad electrode PDS1. Note that FIG. 23 is a plan view but, in FIG. 23, a bonded portion (bonded region) MPLa between the metal plate MPL and the pad electrode PDS1 is shown by hatching.

Note that, when the wording "in the plan view" is used, it means that something is viewed in a plane parallel with the main surface (top surface) of the semiconductor chip CP1. The wording "when viewed in the plan view" is also synonymous to the wording "in the plan view".

To obtain such a positional relationship, the semiconductor chip CP1 and the metal plate MPL are specifically designed as follows.

First, for the semiconductor chip CP1, a side SD7 (more specifically, in the vicinity of substantially the middle of the side SD7) of the pad electrode PDS1 opposing the side SD1 of the semiconductor chip CP1 is provided with a retracted portion (pad retracted portion, recessed portion, or two-dimensional recessed portion) 21 which is a region where the pad electrode PDS1 is locally (partially) retracted (retracted in the plan view) in a direction away from the side SD1 of the semiconductor chip CP1. Then, in the retracted portion 21, the sense MOSFET region RG2 is disposed (see FIGS. 13, 22, 23, and the like). On the other hand, for the metal plate MPL, a front end side (side) SD8 of the metal plate MPL closer to the semiconductor chip CP2 is provided with a retracted portion (metal-plate retracted portion, recessed portion, or two-dimensional recessed portion) 22 which is a region locally (partially) retracted (retracted in the plan view) in a direction away from the semiconductor chip CP2. Then, the metal plate MPL is bonded to the source pad electrode PDS1 such that the sense MOSFET region RG2 is located (disposed) in the retracted portion 22. This can provide a state in which the three sides of the sense MOSFET region RG2 are surrounded by the metal plate MPL, by the pad electrode PDS1, and by the bonded portion between the metal plate MPL and the pad electrode PDS1 (in other words, the three sides of the sense MOSFET region RG2 oppose the metal plate MPL, the pad electrode PDS1, and the bonded portion between the metal plate MPL and the pad electrode PDS1). Here, the foregoing three sides of the sense MOSFET region RG2 are three sides 23a, 23b, and 23c denoted by the reference numerals 23a, 23b, and 23c in FIG. 23.

The purpose for providing such a state is to minimize, even when a crack corresponding to the foregoing crack 113 is formed in the adhesive layer BD1 bonding the die pad DP1 to the semiconductor chip CP1, the possibility of extension of the crack to a position under the sense MOSFET region RG2 in the adhesive layer BD1, which will be described with reference to FIG. 26.

Figure 26:
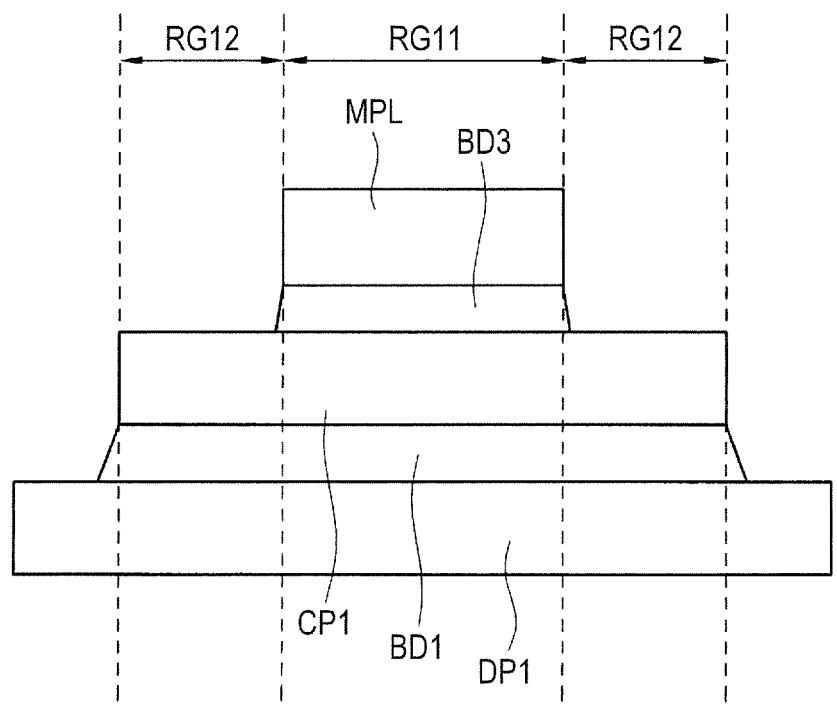
FIG. 26 is a schematic cross-sectional view of the semiconductor device as the embodiment of the present invention.

FIG. 26 is a schematic cross-sectional view of the semiconductor device PKG. FIG. 26 schematically shows a state in which the semiconductor chip CP1 is mounted over (bonded to the upper surface of) the die pad DP1 via the adhesive layer BD1, and the metal plate MPL is bonded to the semiconductor chip CP1 (to the pad electrode PDS1 thereof) with the adhesive layer BD3, but illustration of the sealing portion MR is omitted therein. Note that FIG. 26 is a cross-sectional view, but hatching is omitted therein for improved clarity of illustration.

In FIG. 26, the region where the semiconductor chip CP1 is vertically interposed between the metal plate MPL and the die pad DP1 (i.e., region where the metal plate MPL is present over the semiconductor chip CP1) is denoted by the mark RG11, and the region where the semiconductor chip CP1 is not vertically interposed between the metal plate MPL and the die pad DP1 (i.e., region where the metal plate MPL is not present over the semiconductor chip CP1) is denoted by the mark RG12.

The semiconductor chip CP1 is vertically interposed between the metal plate MPL and the die pad DP1. In the plan view, the semiconductor chip CP1 is included in the upper surface of the die pad DP1 so that the die pad DP1 is present under the entire semiconductor chip CP1. However, the top surface of the semiconductor chip CP1 has the region (portion) overlapping the metal plate MPL and the region (portion) not overlapping the metal plate MPL in the plan view. Accordingly, the top surface of the semiconductor chip CP1 has the region where the metal plate MPL is present thereover (i.e., region to which the metal plate MPL is bonded) and the region where the metal plate MPL is not present thereover (i.e., region to which the metal plate MPL is not bonded). Therefore, a two-dimensional region corresponding to the entire semiconductor chip CP1 in the plan view is a combination of the region RG11 where the semiconductor chip CP1 is vertically interposed between the metal MPL and the die pad DP1 and the region RG12 where the ° semiconductor chip CP1 is not vertically interposed between the metal MPL and the die pad DP1.

When a thermal stress (such as, e.g., a thermal load during the use of the semiconductor device PKG or a temperature cycle test) is applied to the semiconductor device PKG, a crack (crack corresponding to the foregoing crack 113) may occur in the adhesive layer BD1 bonding the semiconductor chip CP1 to the die pad DP1. One of major causes of the occurrence of the crack in the adhesive layer BD1 is the difference between the amount of thermal expansion (thermal expansion length) of the die pad DP1 and the amount of thermal expansion (thermal expansion length) of the semiconductor chip CP1, which is produced due to the difference between the thermal expansion coefficient (coefficient of thermal expansion) of the die pad DP1 and the thermal expansion coefficient (coefficient of thermal expansion) of the semiconductor chip CP1 when a thermal stress is applied. This causes a stress in the adhesive layer BD1 interposed between the semiconductor chip CP1 and the die pad DP1 and a crack in the adhesive layer BD1. Specifically, the thermal expansion coefficient of the die pad DP1 comprised of a metal is larger than the thermal expansion coefficient of the semiconductor chip (mainly comprised of Si) so that, when a thermal stress is applied, the amount of thermal expansion of the die pad DP1 is large and, compared thereto, the amount of thermal expansion of the semiconductor chip CP1 is small. This causes a large stress in the adhesive layer BD1 interposed between the die pad DP1 having the relatively large amount of thermal expansion and the semiconductor chip CP1 having the relatively small amount of thermal expansion, resulting in the occurrence of the crack.

However, the experiment conducted by the present inventors has confirmed that the crack in the adhesive layer BD1 is less likely to be formed in the region RG11 where the semiconductor chip CP1 is vertically interposed between the metal plate MPL and the die pad DP1 (i.e., region where the metal plate MPL is present thereover) than in the region RG12 where the semiconductor chip CP1 is not vertically interposed between the metal plate MPL and the die pad DP1 (i.e., region where the metal plate MPL is not present thereover). The following is a conceivable reason for this.

That is, in the region RG11 where the semiconductor chip CP1 is vertically interposed between the metal plate MPL and the die pad DP1, when a thermal stress is applied, the semiconductor chip CP1 is not only pulled in the direction of thermal expansion by the die pad DP1 located thereunder, but also pulled in the direction of thermal expansion by the metal plate MPL located thereover. Accordingly, the semiconductor chip CP1 is more likely to undergo thermal expansion in the region RG11 than in the region RG12 (i.e., the amount of thermal expansion increases therein). As a result, the difference between the amount of thermal expansion of the die pad DP1 and that of the semiconductor chip CP1 is smaller in the region RG11 than in the region RG12. That is, the difference between the amount of thermal expansion of the die pad DP1 and that of the semiconductor chip CP1 is smaller in the region RG11 than in the region RG12, and therefore the stress produced in the adhesive layer BD1 is smaller in the region RG11 than in the region RG12. In other words, because the thermal expansion coefficients of the metal plate MPL and the die pad DP1 are larger than that of the semiconductor chip CP1, when a thermal stress is applied, in the region RG11, both the metal plate MPL over the semiconductor chip CP1 and the die pad DP1 under the semiconductor chip CP1 operate to pull the semiconductor chip CP1 in the direction of thermal expansion. As a result, the difference between the amount of thermal expansion of the semiconductor chip CP1 and that of the die pad DP1 is smaller in the region RG11 than in the region RG12, and the stress produced in the adhesive layer BD1 is also smaller in the region RG11. Since the crack in the adhesive layer BD1 is more likely to occur in a place where the stress produced in the adhesive layer BD1 is large, and is less likely to occur in a place where the stress is small, the crack in the adhesive layer BD1 is less likely to occur in the region RG11 than in the region RG12.

In view of this, in the present embodiment, the sense MOSFET region RG2 is disposed in a place corresponding to the region RG11 where the semiconductor chip CP1 is vertically interposed between the metal plate MPL and the die pad DP1 (i.e., region where the metal plate MPL is present over the semiconductor chip CP1) to thereby inhibit a crack from occurring in the adhesive layer BD1 immediately under the sense MOSFET region RG2. In other words, the sense MOSFET region RG2 is disposed at a position in the semiconductor chip CP1 which allows a reduction in the difference between the amount of thermal expansion of the semiconductor chip CP1 and that of the die pad DP1 to thereby inhibit a crack from occurring in the adhesive layer BD1 immediately under the sense MOSFET region RG2.

That is, as described above, when attention is focused on the two-dimensional positional relationship between the metal plate MPL and the sense MOSFET region RG2, the three sides (23a, 23b, and 23c) of the sense MOSFET region RG2 are surrounded by the metal plate MPL (in other words, the three sides of the sense MOSFET region RG2 oppose the metal plate MPL). When attention is also focused on the two-dimensional positional relationship between the pad electrode PDS1 and the sense MOSFET region RG2, in the plan view, the three sides (23a, 23b, and 23c) of the sense MOSFET region RG2 are surrounded by the pad electrode PDS1 (in other words, the three sides of the sense MOSFET region RG2 oppose the pad electrode PDS1). Briefly, in the plan view, the bonded portion (MPLa) between the metal plate MPL and the pad electrode PDS1 surrounds the three sides (23a, 23b, and 23c) of the sense MOSFET region RG2 (in other words, the three sides of the sense MOSFET region RG2 oppose the bonded portion between the metal plate MPL and the pad electrode PDS1).

When viewed from another perspective, in the plan view, the pad electrode PDS1, the metal plate MPL, and the bonded portion MPLa between the metal plate MPL and the pad electrode PDS1 exist in a direction (direction parallel with the side SD1) of approach from the sense MOSFET region RG2 to the side SD2, in a direction (direction perpendicular to the side SD1) of approach from the sense MOSFET region RG2 to the side SD3, and in a direction (direction parallel with the side SD1) of approach from the sense MOSFET region RG2 to the side SD4.

In addition, over the sense MOSFET region RG2, not the source wire 10S1 (source wire 10S1 for the power MOSFET QH), but the source wire 10S2 (source wire 10S2 for the sense MOSFET QS) needs to be disposed. Therefore, it is difficult to extend the source pad electrode PDS1 of the power MOSFET QH to a region immediately over the sense MOSFET region RG2. As a result, the source pad electrode PDS1 of the power MOSFETA QH does not overlap the sense MOSFET region RG2 in the plan view. Consequently, the bonded portion MPLa between the metal plate MPL and the pad electrode PDS1 does not overlap the sense MOSFET region RG2 in the plan view, and the metal plate MPL also does not overlap the sense MOSFET region RG2 in the plan view.

Such a position at which the sense MOSFET region RG2 is disposed is a place corresponding to the region RG11 described above where the semiconductor chip CP1 is vertically interposed between the metal plate MPL and the die pad DP1 and, in the adhesive layer BD1 located thereunder, a crack is less likely to occur. Therefore, by disposing the sense MOSFET region RG2 at such a position, it is possible to inhibit or prevent a crack from occurring in the adhesive layer BD1 immediately under the sense MOSFET region RG2 (i.e., it is possible to inhibit or prevent a crack corresponding to the foregoing crack 113 from being formed at a position under the sense MOSFET region RG2 in the adhesive layer BD1). As a result, it becomes possible to inhibit or prevent the accuracy of sensing a current flowing in the power MOSFET QH by means of the sense MOSFET QS from being degraded by the foregoing crack 113. This allows an improvement in the accuracy of sensing the current flowing in the power MOSFET QH by means of the sense MOSFET QS. Therefore, the reliability of the semiconductor device can be improved.

If the source pad electrode PDS4 of the sense MOSFET QS is disposed at a position close to the outer peripheral portion (side SD1) rather than at an inner position over the main surface of the semiconductor chip CP1, it is easier to couple a conductive member such as the bonding wire BW thereto. Therefore, in the present embodiment, over the main surface (top surface) of the semiconductor chip CP1, the sense MOSFET region RG2 and the source pad electrode PDS4 of the sense MOSFET QS are not disposed at the same two-dimensional positions (vertically overlapping positions), but the source pad electrode PDS4 of the sense MOSFET QS is disposed outside the sense MOSFET region RG2 (closer to the side SD1). In other words, over the main surface of the semiconductor chip CP1, the sense MOSFET region RG2 and the pad electrode PDS4 are disposed such that the pad electrode PDS4 is closer to the outer peripheral portion (side SD1) of the main surface of the semiconductor chip CP1 than the sense MOSFET region RG2. Briefly, over the main surface of the semiconductor chip CP1, a distance (interval) L2 from the outer periphery (side SD1) of the main surface of the semiconductor chip CP1 to the pad electrode PDS4 is adjusted to be smaller (shorter) than a distance (interval) L1 from the outer periphery (side SD1) of the main surface of the semiconductor chip CP1 to the sense MOSFET region RG2 (i.e., L1>L2 is satisfied. See FIG. 23). That is, in the present embodiment, over the main surface of the semiconductor chip CP1, the source pad electrode PDS4 of the sense MOSFET QS is disposed closer to the side SD1 of the main surface of the semiconductor chip CP1 than the sense MOSFET region RG2.

Note that, to determine which one of two positions is located externally of the other over the main surface of the semiconductor chip CP1, it is assumed that the position at a smaller distance (interval) from the outer periphery of the main surface of the semiconductor chip CP1 is regarded as the outer position. In other words, to determine which one of two positions is located internally over the main surface of the semiconductor chip CP1, it is assumed that the position at a larger distance (interval) from the outer periphery of the main surface of the semiconductor chip CP1 is regarded as the inner position.

By disposing the sense MOSFET region RG2 at the position as described above, a crack is inhibited or prevented from being formed at a position under the sense MOSFET region RG2 in the adhesive layer BD1 to improve the accuracy of sensing a current flowing in the power MOSFET QH by means of the sense MOSFET QS. Additionally, by disposing the pad electrode PDS4 outside the sense MOSFET region RG2 (i.e., disposing the pad electrode PDS4 closer to the side SD1 than the sense MOSFET region RG2), it is possible to easily couple a conductive member such as the bonding wire BW to the source pad electrode PDS4 of the sense MOSFET QS. Note that the source region (corresponding to the foregoing semiconductor region 4 of the sense MOSFET region RG2) of the sense MOSFET QS formed in the sense MOSFET region RG2 is electrically coupled to the source pad electrode PDS4 of the sense MOSFET QS via (through) the foregoing source wire (wire for source) 10S2 formed in the semiconductor chip CP1.

In the plan view, between the one side (side 23d shown in FIG. 23) of the sense MOSFET region RG2 other than the foregoing three sides (23a, 23b, and 23c) thereof and the side SD1 of the semiconductor chip CP1, the pad electrode PDS1, the metal plate MPL, and the bonded portion MPLa between the metal plate MPL and the pad electrode PDS1 are not located (do not exist). When viewed from another perspective, in planar view, the pad electrode PDS1, the metal plate MPL, and the bonded portion MPLa between the metal plate MPL and the pad electrode PDS1 do not exist in a direction (direction perpendicular to the side SD1) of approach from the sense MOSFET region RG2 to the side SD1. This allows the source wire 10S2 to extend in the direction of approach from the sense MOSFET region RG2 to the side SD1 over the main surface of the semiconductor chip CP1. Therefore, it is possible to easily dispose the source pad electrode PDS4 of the sense MOSFET QS closer to the side SD1 than the sense MOSFET region RG2.

Also, the semiconductor chip CP1 is disposed between the lead L1 and the semiconductor chip CP2, and the main surface (top surface) of the semiconductor chip CP1 has the side (chip side) SD1 closer to the semiconductor chip CP2 and the side (chip side) SD3 opposing the side (chip side) SD1 (see FIGS. 7 and 8 described above). Over the main surface (top surface) of the semiconductor chip CP1, the sense MOSFET region RG2 is disposed to be closer to the side SD1 than to the side SD3. However, in the plan view, a distance (interval) L3 between a front end side (side) SD8 of the metal plate MPL opposing the semiconductor chip CP2 and the side (chip side) SD1 thereof is not more than the distance (interval) L1 between the sense MOSFET region RG2 and the side (chip side) SD1 (i.e., L1≧L3 is satisfied. See FIG. 23). Here, the distances L1, L2, and L3 and distances L4 and L5 described later correspond to distances along a direction perpendicular to the side SD1.

Figure 27:
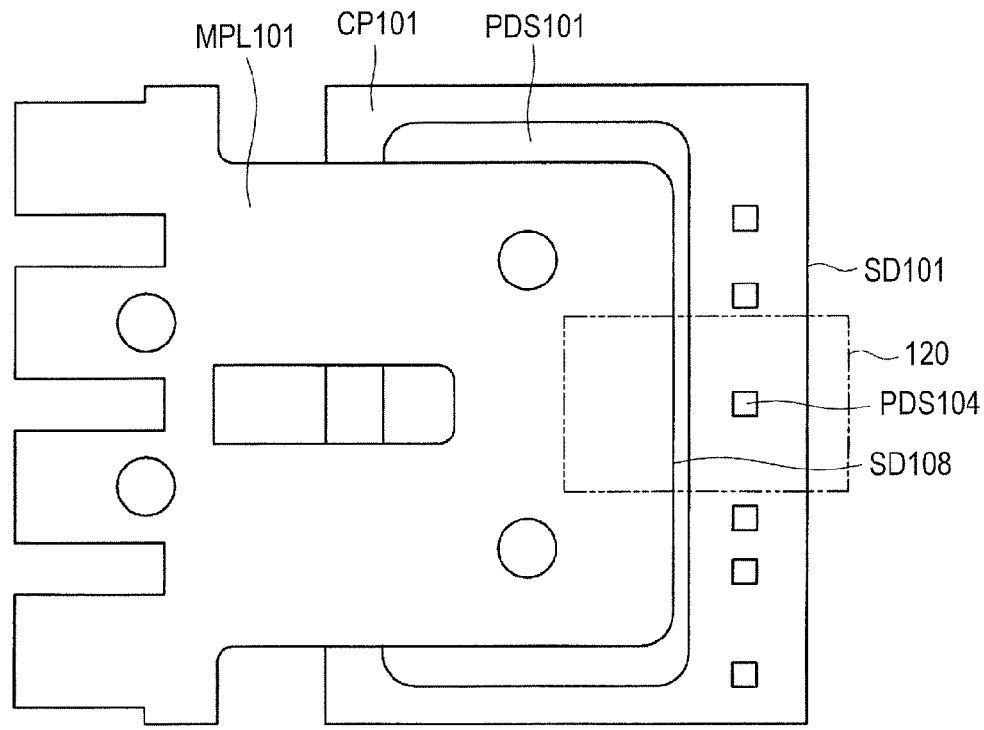
FIG. 27 is a plan view of the structure of FIG. 20.
Figure 28:
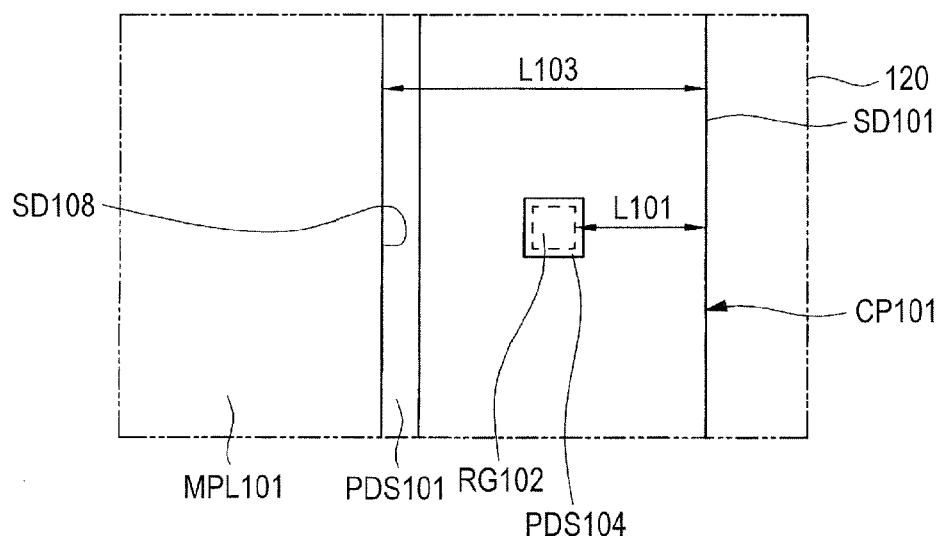
FIG. 28 is a partially enlarged plan view of FIG. 27.

FIG. 27 is a plan view of the structure of FIG. 20 described above, and shows a plan view corresponding to FIG. 22 described above. FIG. 28 is a partially enlarged plan view obtained by enlarging a region 120 enclosed by the two-dot-dash line in FIG. 27, and shows the position of the sense MOSFET region RG102 by the dotted line.

In the case of FIGS. 27 and 28, unlike in the present embodiment, a distance L101 between the sense MOSFET region RG102 and a side (chip side) SD101 of the semiconductor chip CP101 is smaller (shorter) than a distance L103 between a front end side SD108 of the metal plate MPL101 and the side (chip side) SD101 of the semiconductor chip CP101 (i.e., L101<L103 is satisfied). Here, the side SD101 corresponds to the foregoing side SD1, and the front end side SD108 corresponds to the foregoing front end side SD8.

Over the main surface (top surface) of the semiconductor chip CP101, a region closer to the side SD101 than to the front end side SD108 of the metal plate MPL is located outside the foregoing region RG11 where the semiconductor chip CP101 is vertically interposed between the metal plate MP101 and the die pad DP1. Accordingly, a crack is more likely to occur in the foregoing solder 111 located thereunder than in the region RG11. Therefore, in the case of FIGS. 27 and 28 (when the distance L101 between the sense MOSFET region RG102 and the side (chip side) SD101 is smaller than the distance L101 between the front end side SD108 of the metal plate MPL101 and the side (chip side) SD101), a crack is likely to occur in the foregoing solder 111 immediately under the sense MOSFET region RG102.

By contrast, in the present embodiment, in the plan view, the distance L3 between the front end side SD8 of the metal plate MPL and the side (chip side) SD1 of the semiconductor chip CP1 is not more than the distance L1 between the sense MOSFET region RG2 and the side (chip side) SD1 (i.e., L3>L1 is satisfied). That is, in the present embodiment over the main surface (top surface) of the semiconductor chip CP1, the sense MOSFET region RG2 is disposed at a position inward of the front end side SD8 of the metal plate MPL. This allows a reduction in the difference between the amount of thermal expansion of the semiconductor chip CP1 and that of the die pad DP1 at the position at which the sense MOSFET region RG2 is formed. Accordingly, it is possible to more reliably inhibit or prevent a crack from occurring in the adhesive layer BD1 immediately under the sense MOSFET region RG2. Therefore, it is possible to more reliably improve the accuracy of sensing a current flowing in the power MOSFET QH by means of the sense MOSFET QS, and more reliably improve the reliability of the semiconductor device.

In the present embodiment, it is preferable that the metal plate MPL and the die pad DP1 between which the semiconductor chip CP1 is interposed are formed of the same material. This is because, if the metal plate MPL and the die pad DP1 are formed of the same material, the thermal expansion coefficient (coefficient of thermal expansion) of the metal plate MPL and the thermal expansion coefficient (coefficient of thermal expansion) of the die pad DP1 are the same so that, when a thermal stress is applied, the metal plate MPL located over the semiconductor chip CP1 and the die pad DP1 located thereunder operate to pull the semiconductor chip CP1 to the same degree in the direction of thermal expansion. As a result, it is possible to more reliably obtain the effect of inhibiting or preventing a crack from occurring in the adhesive layer BD1 immediately under the sense MOSFET region RG2.

Therefore, when the metal plate MPL is formed of aluminum (Al) or an aluminum (Al) alloy, the die pad DP1 is also preferably formed of aluminum (Al) or an aluminum (Al) alloy, which is the same material as that of the metal plate MPL. When the metal plate MPL is formed of copper (Cu) or a copper (Cu) alloy, the die pad DP1 is also preferably formed of copper (Cu) or a copper (Cu) alloy, which is the same material as that of the metal plate MPL. In terms of its excellent workability, high thermal conductivity, and relatively low price, copper (Cu) or a copper (Cu) alloy is particularly preferred as the materials of the metal plate MPL and the die pad DP1. If each of the die pad DP2 and the leads LD is also formed of the same material as those of the die pad DP1 and the metal plate MPL, the die pad DP1, the die pad DP2, and the leads LD can be formed using a lead frame, which more desirably facilitates the manufacturing of the semiconductor device PKG.

More preferably, not only the metal plate MPL and the die pad DP1, but also the adhesive layer BD3 bonding the metal plate MPL to the pad electrode PDS1 of the semiconductor chip CP1 is formed of the same material as that of the adhesive layer BD1 bonding the semiconductor chip CP1 to the die pad DP1. That is, in the case of using a solder for the adhesive layer BD1 bonding the semiconductor chip CP1 to the die pad DP1, it is preferable to use a solder also for the adhesive layer BD3 bonding the metal plate MPL to the pad electrode PDS1 of the semiconductor chip CP1. This allows, when a thermal stress is applied, the operation of pulling the semiconductor chip CP1 in the direction of thermal expansion by the metal plate MPL located thereover and the operation of pulling the semiconductor chip CP1 in the direction of thermal expansion by the die pad DP1 located thereunder to be more equalized. Therefore, it is possible to more reliably obtain the effect of inhibiting or preventing a crack from occurring in the adhesive layer BD1 immediately under the sense MOSFET region RG2.

Next, a description will be given to various modifications of the present embodiment.

<About First Modification of Semiconductor Chip CP1>

It is assumed that the semiconductor chip CP1 of the first modification will be hereinafter denoted by the mark CP1a and referred to as a semiconductor chip CP1a.

Figure 29:
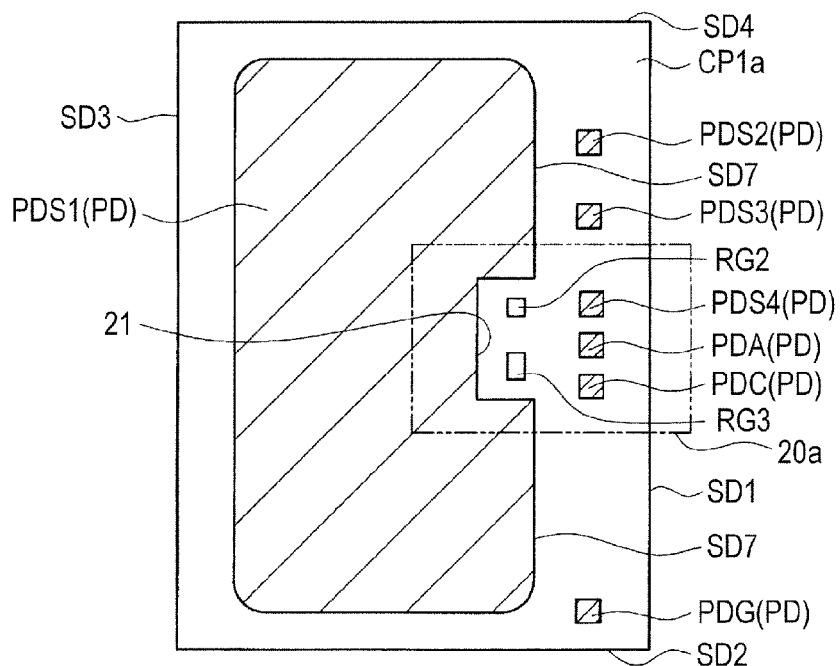
FIG. 29 is a plan view showing a chip layout of a semiconductor chip of a first modification.
Figure 30:
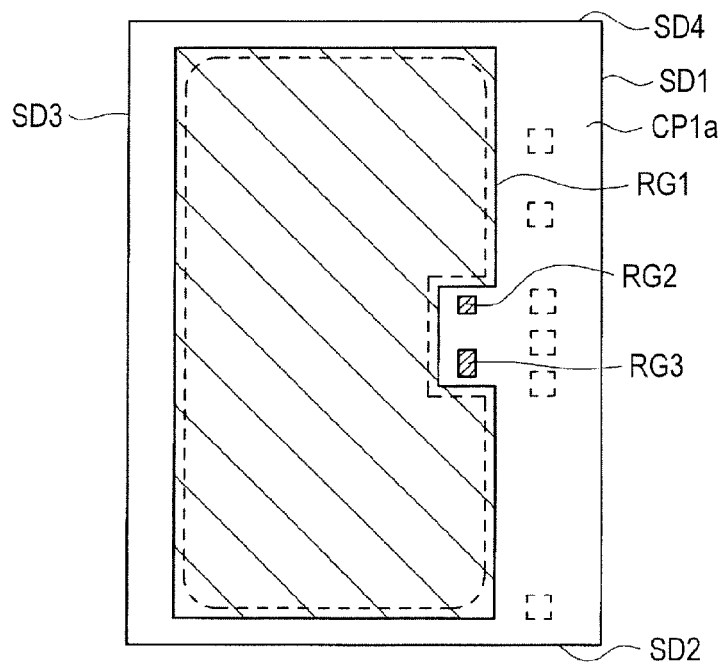
FIG. 30 is a plan view showing the chip layout of the semiconductor chip of the first modification.
Figure 31:
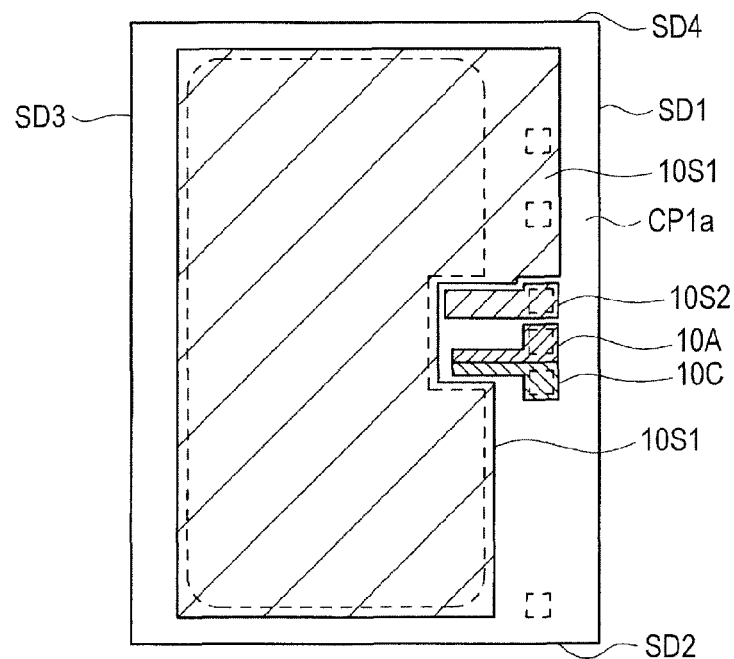
FIG. 31 is a plan view showing the chip layout of the semiconductor chip of the first modification.
Figure 32:
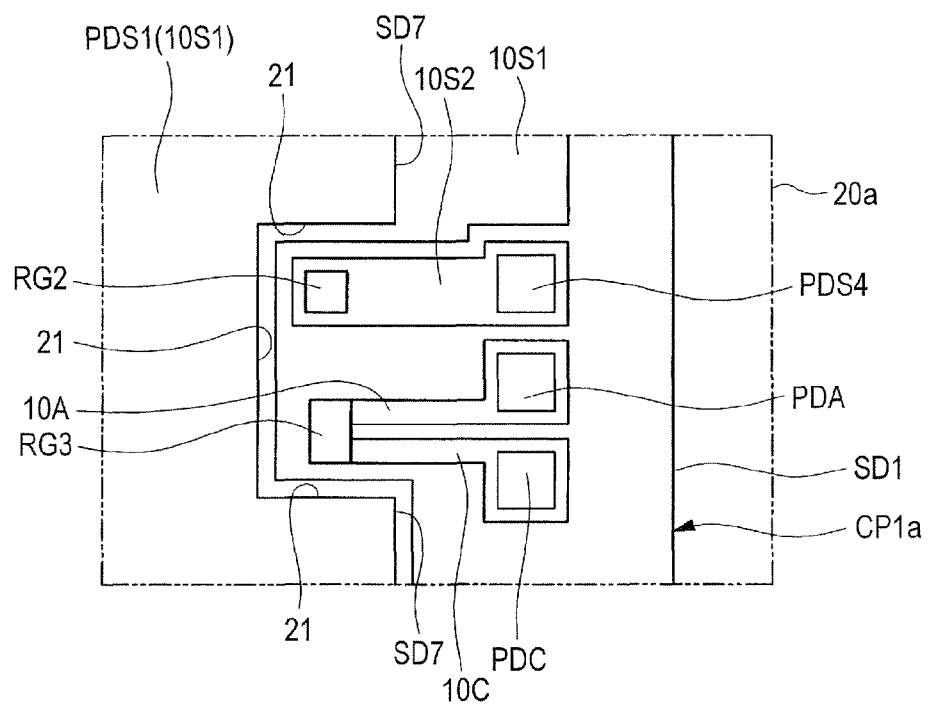
FIG. 32 is a main-portion plan view of the semiconductor chip of the first modification.
Figure 33:
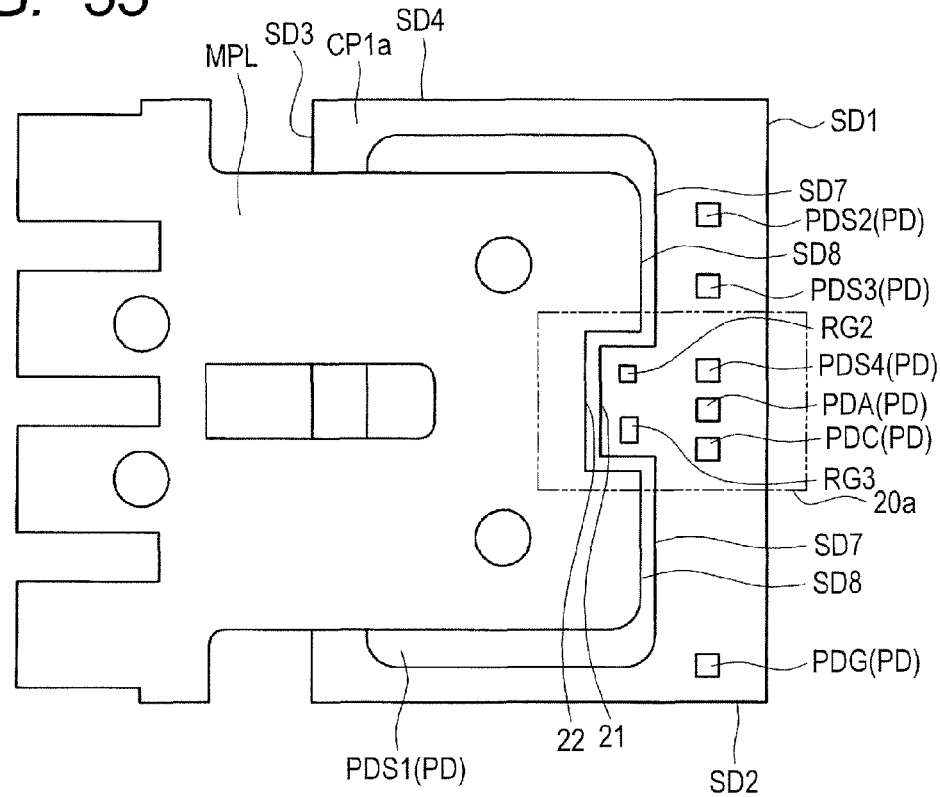
FIG. 33 is a plan view showing a state in which a metal plate is bonded to the semiconductor chip of the first modification.
Figure 34:
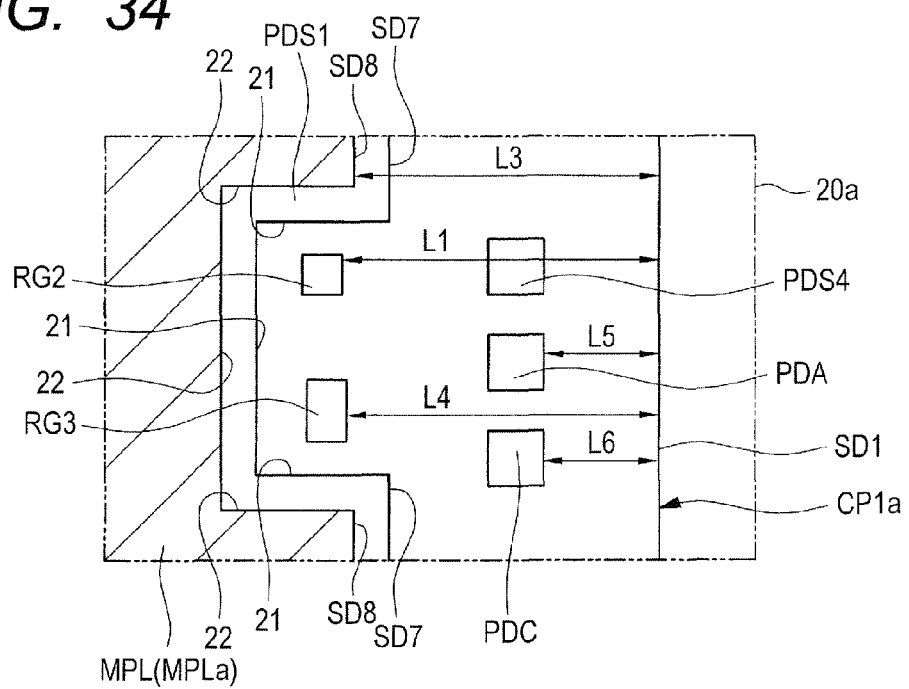
FIG. 34 is a partially enlarged plan view of FIG. 33.
Figure 35:
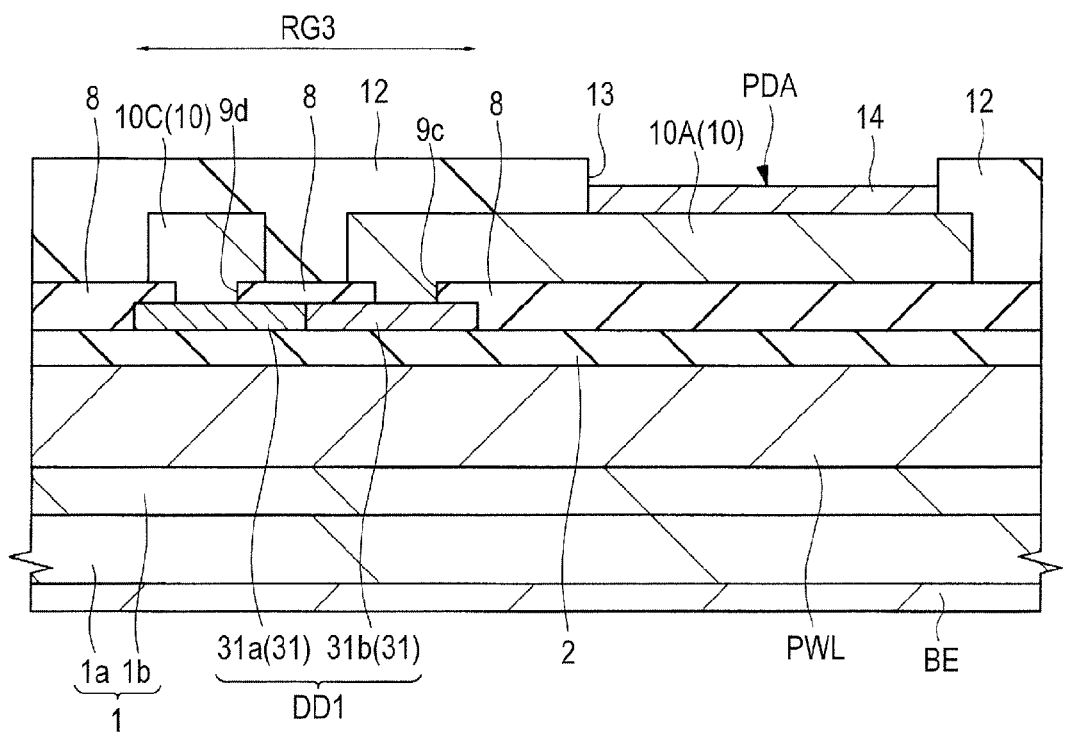
FIG. 35 is a main-portion cross-sectional view of the semiconductor chip of the first modification.

FIGS. 29 to 31 are plan views each showing the chip layout of the semiconductor chip CP1a, and respectively correspond to FIGS. 13 to 15 described above. Among them, FIG. 29 corresponds to a top view of the semiconductor chip CP1a, and shows the top surface side (i.e., main surface formed with the pad electrodes PD) of the semiconductor chip CP1a. Note that FIG. 29 is a plan view but, for easier understanding, the bonding pads (pad electrodes PD including the pad electrodes PDG, PDS1, PDS2, PDS3, PDS4, PDA, and PDC) are hatched therein. Note that, for easier understanding, FIG. 29 also shows the sense MOSFET region RG2 and a diode region (diode formation region) RG3 but, actually, the sense MOSFET region RG2 and the diode region RG3 are covered with the uppermost-layer protective film (corresponding to the foregoing protective film 12) of the semiconductor chip CP1. FIG. 30 is a plan view, but shows the main MOSFET region RG1, the sense MOSFET region RG2, and the diode region RG3 in the semiconductor chip CP1a by hatching, and shows the positions of the bonding pads (pad electrodes PDG, PDS1, PDS2, PDS3, PDS4, PDA, and PDC) by the dotted lines. FIG. 31 is a plan view, but shows the layout of the source wires 10S1 and 10S2, an anode wire 10A, and a cathode wire 10O in the semiconductor chip CP1a by the hatched regions, and shows the positions of the bonding pads (pad electrodes PDG, PDS1, PDS2, PDS3, PDS4, PDA, and PDC) by the dotted lines. Note that the positions of the bonding pads (pad electrodes PDG, PDS1, PDS2, PDS3, PDS4, PDA, and PDC) shown by the dotted lines in FIGS. 30 and 31 correspond to the regions shown by hatching in FIG. 29. FIG. 32 is a partially enlarged plan view (main-portion plan view) of the semiconductor chip CP1a, which is obtained by enlarging a region 20a enclosed by the two-dot-dash line in FIG. 29, and shows the layout of the main MOSFET region RG1, the sense MOSFET region RG2, the diode region RG3, the pad electrodes PDS1, PDS4, PDA, and PDC, the source wires 10S1 and 10S2, the anode wire 10A, and the cathode wire 10C. FIG. 33 is a plan view (top view) showing a state in which the metal plate MPL is bonded to the semiconductor chip CP1a, and corresponds to FIG. 22 described above. Note that FIG. 33 also shows the sense MOSFET region RG2 and the diode region RG3 but, actually, the sense MOSFET region RG2 and the diode region RG3 are covered with the uppermost-layer protective film (corresponding to the foregoing protective film 12). FIG. 34 is a partially enlarged plan view obtained by enlarging the region 20a enclosed by the two-dot-dash line in FIG. 33, corresponds to FIG. 23 described above, and shows the layout of the metal plate MPL, the sense MOSFET region RG2, the diode region RG3, and the pad electrodes PDS1, PDS4, PDA, and PDC. Note that FIG. 34 is a plan view, but shows the bonded portion (bonded region) MPLa between the metal plate MPL and the pad electrode PDS1 by hatching. FIG. 35 is a main-portion cross-sectional view of the semiconductor chip CP1a, and shows a cross section passing through (traversing) the diode region RG3 and the pad electrode PDA.

In the semiconductor chip CP1a, not only the foregoing power MOSFET QH (main MOSFET region RG1) and the sense MOSFET QS (sense MOSFET region RG2), but also a temperature sensing diode (diode element) is formed, and the region where the diode is formed is the diode region RG3. Thus, as can be also seen from FIG. 30, the semiconductor chip CP1a has the main MOSFET region RG1 where the foregoing power MOSFET QH is formed, the sense MOSFET region RG2 where the foregoing sense MOSFET QS is formed, and the diode region RG3 where the temperature sensing diode (diode element) is formed.

The diode formed in the diode region RG3 is a diode (circuit) for sensing the temperature of the power MOSFET QH. The diode can also be regarded as a diode (circuit) for sensing heat generated from the power MOSFET QH, and is disposed in the vicinity of the power MOSFET QH in the semiconductor chip CP1a to allow the temperature of the power MOSFET QH (heat generated therefrom) to be sensed. The diode formed in the diode region RG3 can also be regarded as a temperature sensing circuit.

The anode of the diode formed in the diode region RG3 is electrically coupled to an anode pad electrode PDA via the anode wire 10A, while the cathode of the diode formed in the diode region RG3 is electrically coupled to a cathode pad electrode PDC via the cathode wire 10C. The anode wire 10A and the cathode wire 10C are each formed of the foregoing patterned conductor film 10. Accordingly, the anode wire 10A and the cathode wire 10C are wires in the same layer as the foregoing source wires and the foregoing gate wire 10G. The semiconductor chip CP1a has, as pad electrodes, the anode pad electrode PDA for the diode formed in the diode region RG3 and the cathode pad electrode PDC for the diode formed in the diode region RG3 in addition to the source pad electrodes PDS1, PDS2, PDS3, and PDS4 and the gate pad electrode PDG. To the anode pad electrode PDA and the cathode pad electrode PDC, the foregoing bonding wires BW are coupled and, via the foregoing bonding wires BW (each having one end thereof coupled to the pad electrode PDA or the pad electrode PDC and the other end thereof coupled to the pad electrode PD2 of the semiconductor chip CP2), the anode pad electrode PDA and the cathode pad electrode PDC are electrically coupled to the control circuit CLC formed in the foregoing semiconductor chip CP2.

Since the diode has a voltage-current characteristic which changes in accordance with the temperature, by sensing (monitoring) the voltage-current characteristic of the diode formed in the diode region RG3, it is possible to sense the temperature of the diode in the semiconductor chip CP1a. Therefore, by disposing the diode region RG3 (diode) in the vicinity of the power MOSFET QH in the semiconductor chip CP1a, it is possible to sense the temperature of the power MOSFET QH (heat generated therefrom) by means of the diode.

For example, it is possible to sense (monitor) the voltage of the diode (voltage between the anode and cathode thereof) formed in the diode region RG3 in a state in which a constant current is allowed to flow in the diode, and obtain the temperature of the diode from the resulting voltage value. That is, the voltage when the constant current is allowed to flow in the diode is lower as the temperature is higher, and therefore it is possible to sense the temperature of the diode using the voltage. The supply of the constant current to the diode formed in the diode region RG3 and the sensing of the voltage of the diode (voltage between the anode and cathode thereof) can be performed using the control circuit CLC of the foregoing semiconductor chip CP2. It is also possible to sense (monitor) the current in the diode (current between the anode and cathode thereof) formed in the diode region RG3 in a state in which the constant voltage is applied to the diode, and obtain the temperature of the diode from the resulting current value.

Therefore, when the power MOFSET QH generates excessive heat to increase the temperature of the diode formed in the diode region RG3 to a temperature higher than a predetermined upper-limit temperature, the foregoing driver circuit DR of the foregoing control circuit CLC supplies the OFF signal to the gate of the power MOSFET QH (or stops the supply of the ON signal) to thereby switch the power MOSFET QH into the OFF state. In this manner, when the power MOSFET QH generates excessive heat, it is possible to sense the generation of the excessive heat by means of the diode in the diode region RG3, and swiftly switch the power MOSFET QH into the OFF state.

For example, if the foregoing load LA is short-circuited in a state in which the power MOSFET QH has been turned ON and a voltage is applied from the foregoing power source BT to the foregoing load LA, a large current (current larger than during normal operation) undesirably flows in the power MOSFET QH so that the power MOSFET QH generates excessive heat. By sensing a temperature rise due to the generation of the excessive heat from the power MOSFET QH by means of the diode formed in the diode formation region RG3, when the foregoing load LA is short-circuited, the power MOSFET QH can be swiftly switched into the OFF state.

Thus, the semiconductor chip CP1 has the diode region RG3 where the temperature sensing diode (diode element) is formed. The diode (diode formed in the diode region RG3) can be formed of a diode DD1 using a PN junction as shown in FIG. 35.

That is, as shown in FIG. 35, in the diode region RG3, a polysilicon film 31 for forming the diode is formed over the field insulating film (isolation region) 2. The polysilicon film 31 has an n-type silicon portion (n-type silicon region) 31a into which an n-type impurity (e.g., phosphorus) has been introduced, and a p-type silicon portion (p-type silicon region) 31b into which a p-type impurity (e.g., boron) has been introduced. The n-type silicon portion 31a and the p-type silicon portion 31b are adjacent to each other, and a PN junction is formed at the interface between the p-type silicon portion 31b and the n-type silicon portion 31a. The polysilicon film 31 can also be formed of the conductive film in the same layer as the gate electrodes and the wiring portions 7a for gate extraction, but the polysilicon film 31 and the gate electrodes 7 (and the wiring portions 7a for gate extraction) are isolated from each other and are not electrically coupled to each other. By the formation of the PN junction (at the interface) between the p-type silicon portion 31b and the n-type silicon portion 31a, the diode DD1 is formed. That is, the p-type silicon portion 31b of the polysilicon film 31 formed in the diode region RG3 serves as the anode of the diode DD1, and the n-type silicon portion 31a of the polysilicon film 31 formed in the diode region RG3 serves as the cathode of the diode DD1. The anode wire 10A is electrically coupled to the p-type silicon portion 31b of the polysilicon film 31 through a contact hole (opening or through hole) 9c formed in the insulating film 8, while the cathode wire 10C is electrically coupled to the n-type silicon portion 31a of the polysilicon film 31 through a contact hole (opening or through hole) 9d formed in the insulating film 8. The anode wire 10A and the cathode wire 10C are formed in the same layer as the foregoing gate wire 10G and the source wires 10S1 and 10S2 (i.e., formed of the foregoing patterned conductor film 10). The anode wire 10A exposed from the opening 13 in the protective film 12 forms the anode pad electrode PDA of the foregoing diode DD1, while the cathode wire 10C exposed from the opening 13 of the protective film 12 forms the cathode pad electrode PDC of the foregoing diode DD1.

In the foregoing semiconductor chip CP1, the sense MOSFET region RG2 is disposed in the retracted portion 21 in which the pad electrode PDS1 is locally (partially) retracted in the direction away from the side SD1 of the semiconductor chip CP1. By contrast, in the semiconductor chip CP1a, as can be also seen from FIGS. 29 to 34, the sense MOSFET region RG2 and the diode region RG3 are disposed in the retracted portion 21. In addition, the metal plate MPL is bonded to the source pad electrode PDS1 such that the sense MOSFET region RG2 and the diode region RG3 are located (disposed) in the retracted portion 22 of the front end side SD8 of the metal plate MPL.

Consequently, in the case of using the semiconductor chip CP1a instead of the semiconductor chip CP1, when attention is focused on the two-dimensional positional relationship among the metal plate MPL, the sense MOSFET region RG2, and the diode region RG3, in the plan view, the three sides of the sense MOSFET region RG2 and the three sides of the diode region RG3 are surrounded by the metal plate MPL (in other words, the three sides of the sense MOSFET region RG2 and the three sides of the diode region RG3 oppose the metal plate MPL). When attention is also focused on the two-dimensional positional relationship among the pad electrode PDS1, the sense MOSFET region RG2, and the diode region RG3, in the plan view, the three sides of the sense MOSFET region RG2 and the three sides of the diode region RG3 are surrounded by the pad electrode PDS1 (in other words, the three sides of the sense MOSFET region RG2 and the three sides of the diode region RG3 oppose the pad electrode PDS1). That is, in the plan view, the bonded portion (MPLa) between the metal plate MPL and the pad electrode PDS1 surrounds the three sides of the sense MOSFET region RG2 and the three sides of the diode region RG3 (in other words, the three sides of the sense MOSFET region RG2 and the three sides of the diode region RG3 oppose the bonded portion between the metal plate MPL and the pad electrode PDS1).

When viewed from another perspective, in the plan view, the pad electrode PDS1, the metal plate MPL, and the bonded portion MPLa between the metal plate MPL and the pad electrode PDS1 exist in the direction (direction parallel with the side SD1) of approach from the sense MOSFET region RG2 to the side SD2, in the direction (direction perpendicular to the side SD1) of approach from the sense MOSFET region RG2 to the side SD3, and in the direction (direction parallel with the side SD1) of approach from the sense MOSFET region RG2 to the side SD4. Also, in the plan view, the pad electrode PDS1, the metal plate MPL, and the bonded portion MPLa between the metal plate MPL and the pad electrode PDS1 exist in a direction (direction parallel with the side SD1) of approach from the diode region RG3 to the side SD2, in a direction (direction perpendicular to the side SD1) of approach from the diode region RG3 to the side SD3, and in a direction (direction parallel with the side SD1) of approach from the diode region RG3 to the side SD4. On the other hand, in the plan view, the pad electrode PDS1, the metal plate MPL, and the bonded portion MPLa between the metal plate MPL and the pad electrode PDS1 do not exist in the direction (direction perpendicular to the side SD1) of approach from the sense MOSFET region RG2 to the side SD1. Also, in the plan view, the pad electrode PDS1, the metal plate MPL, and the bonded portion MPLa between the metal plate MPL and the pad electrode PDS1 do not exist in a direction (direction perpendicular to the side SD1) of approach from the diode region RG3 to the side SD1.

Over the main surface (top surface) of the semiconductor chip CP1, the sense MOSFET region RG2 and the diode region RG3 are disposed to be closer to the side SD1 than to the side SD3. In addition, in the plan view, the distance (interval) L3 between the front end side SD8 of the metal plate MPL and the side SD1 thereof is adjusted to be not more than the distance (interval) L1 between the sense MOSFET region RG2 and the side SD1, and not more than the distance (interval) L4 between the diode region RG3 and the side SD1 (i.e., L1≥L3 and L4≥L3 are satisfied. See FIG. 34).

With the arrangement, even when the semiconductor chip CP1a is used, in the same manner as when the foregoing semiconductor chip CP1 is used, it is possible to inhibit or prevent a crack from occurring in the adhesive layer BD1 immediately under the sense MOSFET region RG2. As a result, it is possible to inhibit or prevent the accuracy of sensing the current flowing in the power MOSFET QH by means of the sense MOSFET QS from being degraded by the foregoing crack 113. This allows an improvement in the accuracy of sensing the current flowing in the power MOSFET QH by means of the sense MOSFET QS. Therefore, the reliability of the semiconductor device can be improved.

In the case of using the semiconductor chip CP1a, it is also possible to inhibit or prevent a crack from occurring in the adhesive layer BD1 immediately under the diode region RG3 (i.e., it is possible to inhibit or prevent a crack corresponding to the foregoing crack 113 from being formed at a position under the diode region RG3 in the adhesive layer BD1). As a result, the effect of being able to inhibit a resistance increase resulting from the degradation of the adhesive layer BD1 can be obtained.

In the semiconductor chip CP1a, the anode pad electrode PDA and the cathode pad electrode PDC are disposed outside the diode region RG3 (closer to the side SD1). In other words, over the main surface of the semiconductor chip CP1a, the anode pad electrode PDA and the cathode pad electrode PDC are disposed closer to the side SD1 of the main surface of the semiconductor chip CP1a than the diode region RG3. That is, over the main surface of the semiconductor chip CP1, the distance (interval) L5 from the side SD1 of the semiconductor chip CP1a to the pad electrode PDA and a distance (interval) L6 from the side SD1 of the semiconductor chip CP1a to the pad electrode PDC are adjusted to be smaller (shorter) than the distance (interval) L4 from the side SD1 of the semiconductor chip CP1a to the diode region RG3 (i.e., L4>L5 and L4>L6 are satisfied. See FIG. 34). This allows the anode pad electrode PDA and the cathode pad electrode PDC to be disposed at positions close to the side SD1 over the main surface of the semiconductor chip CP1a. As a result, it becomes easy to couple a conductive member such as the bonding wire BD to the pad electrodes PDA and PDC.

The configuration of the semiconductor chip CP1a is otherwise basically the same as that of the foregoing semiconductor chip CP1, and the configuration of the semiconductor device PKG using the semiconductor chip CP1a is otherwise basically the same as that of the semiconductor device PKG of FIGS. 1 to 9 described above. Therefore, a description thereof is omitted herein.

Next, a modification of the semiconductor chip CP1a of the first modification will be described with reference to FIGS. 36 and 37.

Figure 36:
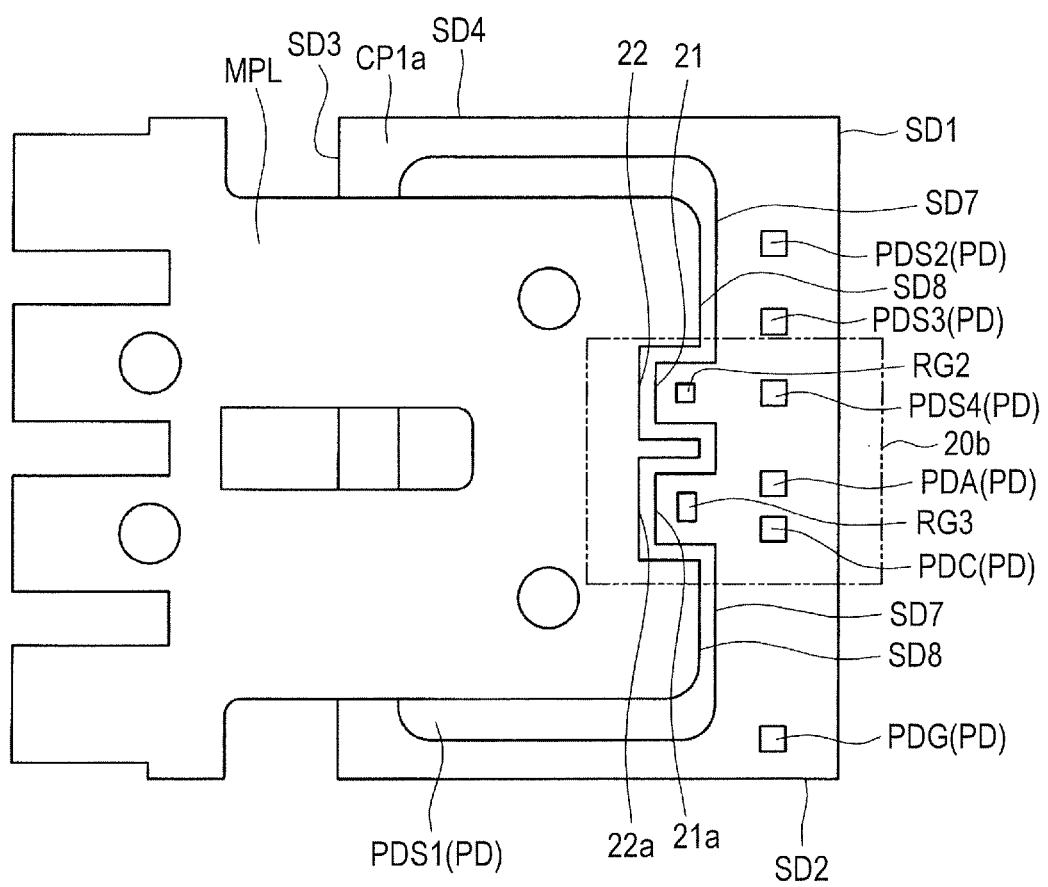
FIG. 36 is a plan view showing a modification of the semiconductor chip of the first modification.

FIG. 36 is a plan view showing the modification of the semiconductor chip CP1a of the first modification, which corresponds to FIG. 33 described above and shows a state in which the metal plate MPL is bonded to the semiconductor chip CP1. Note that FIG. 36 also shows the sense MOSFET region RG2 and the diode region RG3 but, actually, the sense MOSFET region RG2 and the diode region RG3 are covered with the uppermost-layer protective film (corresponding to the foregoing protective film 12) of the semiconductor chip CP1a. FIG. 37 is a partially enlarged plan view obtained by enlarging a region 20b enclosed by the two-dot-dash line in FIG. 36, corresponds to FIG. 34 described above, and shows the layout of the metal plate MPL, the sense MOSFET region RG2, the diode region RG3, and the pad electrodes PDS1, PDS4, PDA, and PDC. Note that FIG. 37 is a plan view but, in FIG. 37, the bonded portion (bonded region) MPLa between the metal plate MPL and the pad electrode PDS1 is shown by hatching.

Figure 37:
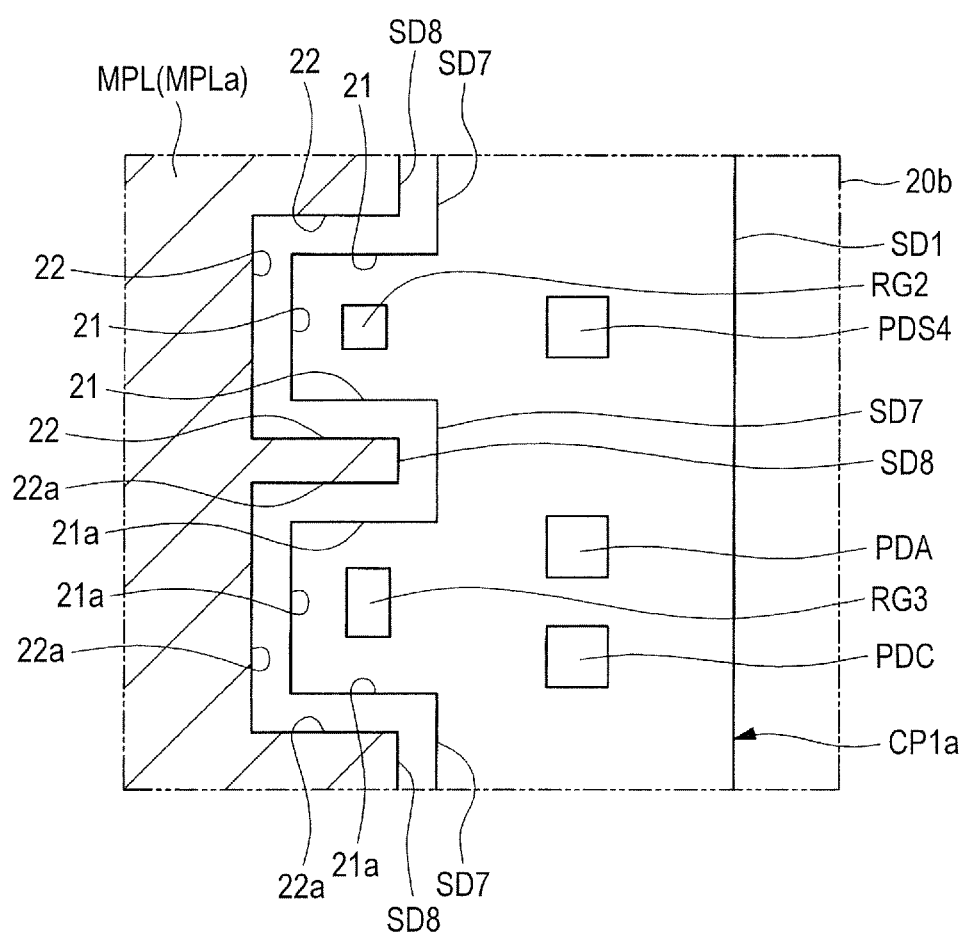
FIG. 37 is a partially enlarged plan view of FIG. 36.

The following is the difference between the semiconductor chip CP1a of FIGS. 33 and 34 and the semiconductor chip CP1a of FIGS. 36 and 37. In the case of FIGS. 33 and 34, in the plan view, the pad electrode PDS1 and the metal plate MPL do not extend (are not disposed) between the sense MOSFET region RG2 and the diode region RG3. On the other hand, in the case of FIGS. 36 and 37, in the plan view, the pad electrode PDS1 and the metal plate MPL extend (are disposed) between the sense MOSFET region RG2 and the diode region RG3. That is, in the case of FIGS. 33 and 34, in the plan view, the bonded portion MPLa between the pad electrode PDS1 and the metal plate MPL does not extend (is not disposed) between the sense MOSFET region RG2 and the diode region RG3 while, in the case of FIGS. 36 and 37, in the plan view, the bonded portion MPLa between the pad electrode PDS1 and the metal plate MPL extends (is disposed) between the sense MOSFET region RG2 and the diode region RG3.

That is, in the case of FIGS. 33 and 34, the side SD7 of the pad electrode PDS1 is provided with the one retracted portion 21 in which the pad electrode PDS1 is locally retracted in the direction away from the side SD1 of the semiconductor chip CP1 and, in the same retracted portion 21, the sense MOSFET region RG2 and the diode region RG3 are disposed. As for the metal plate MPL, the front end side SD8 thereof is provided with the one retracted portion 22 which is locally retracted in the direction away from the semiconductor chip CP2. The metal plate MPL is bonded to the source pad electrode PDS1 such that the sense MOSFET region RG2 and the diode region RG3 are located in the retracted portion 22.

On the other hand, in the case of FIGS. 36 and 37, the side SD7 of the pad electrode PDS1 is provided with two retracted portions 21 and 21a in each of which the pad electrode PDS1 is locally retracted in the direction away from the side SD1 of the semiconductor chip CP1. In the one retracted portion 21, the sense MOSFET region RG2 is disposed while, in the other retracted portion 21a, the diode region RG3 is disposed. As for the metal plate MPL, the front end side SD8 thereof is provided with two retracted portions 22 and 22a each of which is locally retracted in the direction away from the semiconductor chip CP2. The metal plate MPL is bonded to the source pad electrode PDS1 such that the sense MOSFET region RG2 is located in the one retracted portion 22 and the diode region RG3 is located in the other retracted portion 22a.

In the case of FIGS. 36 and 37 also, the configuration is otherwise the same as in the case of FIGS. 29 to 34 described above so that a description thereof is omitted.

In the case of FIGS. 36 and 37, in the plan view, the pad electrode PDS1 and the metal plate MPL extend (accordingly, the bonded portion MPLa between the pad electrode PDS1 and the metal plate MPL extends) between the sense MOSFET region RG2 and the diode region RG3. This allows the bonded portion MPLa between the pad electrode PDS1 and the metal plate MPL to be disposed at positions close to the sense MOSFET region RG2 and the diode region RG3. Therefore, in the case of FIGS. 36 and 37, the effect of being able to inhibit or prevent a crack from occurring in the adhesive layer BD1 immediately under the sense MOSFET region RG2 and the diode region RG3 can be further enhanced than in the case of FIGS. 33 and 34.

On the other hand, in the case of FIGS. 33 and 34, in the plan view, the pad electrode PDS1 and the metal plate MPL do not extend between the sense MOSFET region RG2 and the diode region RG3, which is advantageous in terms of the workability of the metal plate.

<About Second Modification of Semiconductor Chip CP1>

It is assumed that the semiconductor chip CP1 of the second modification is denoted by the mark CP1b and referred to as a semiconductor chip CP1b. It is also assumed that the semiconductor device PKG using the semiconductor chip CP1b instead of the semiconductor chip CP1 is denoted by the mark PKGb and referred to as a semiconductor device PKGb.

Figure 38:
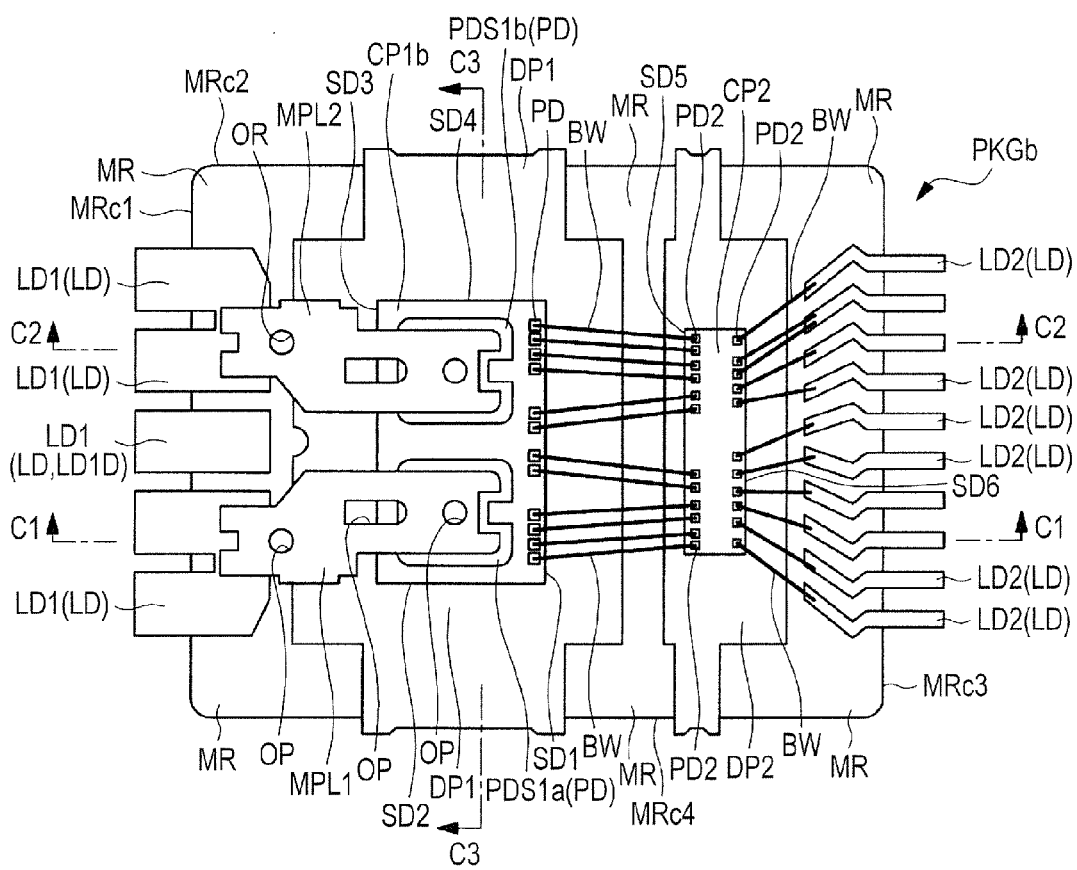
FIG. 38 is a perspective plan view of a semiconductor device of a second modification.
Figure 39:
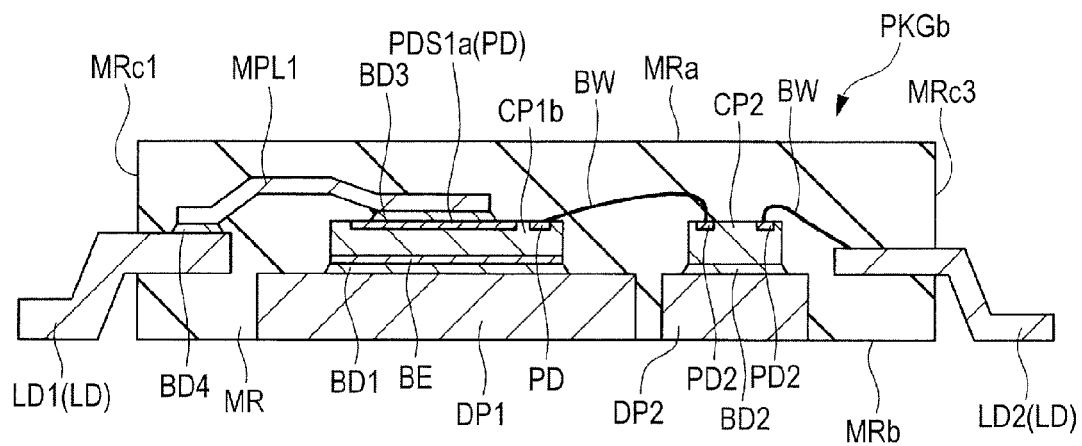
FIG. 39 is a cross-sectional view of the semiconductor device of the second modification.
Figure 40:
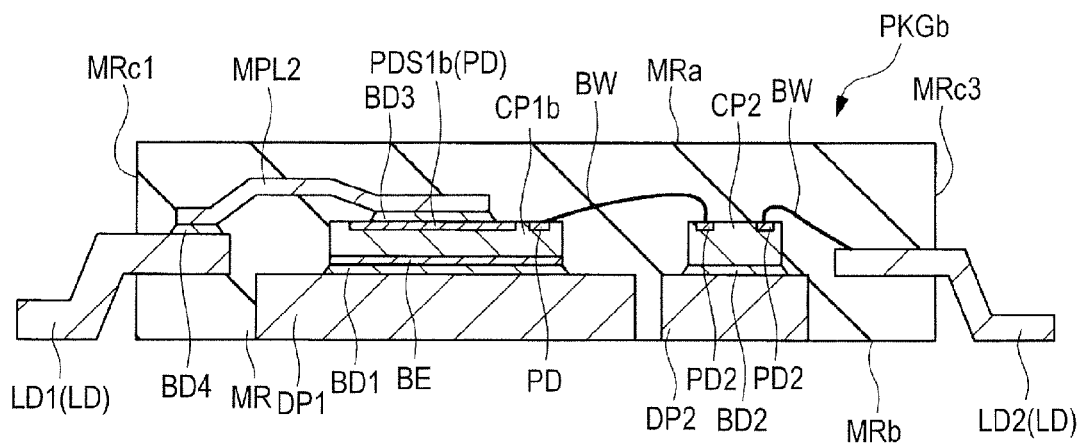
FIG. 40 is a cross-sectional view of the semiconductor device of the second modification.
Figure 41:
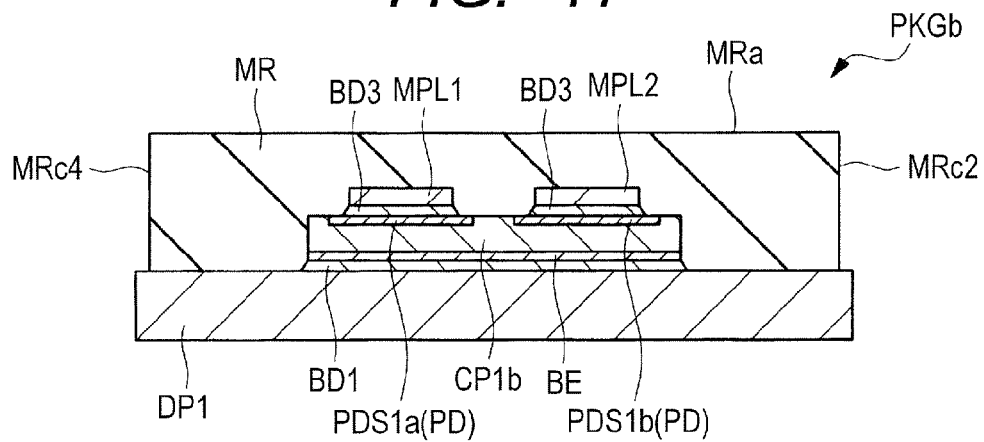
FIG. 41 is a cross-sectional view of the semiconductor device of the second modification.
Figure 42:
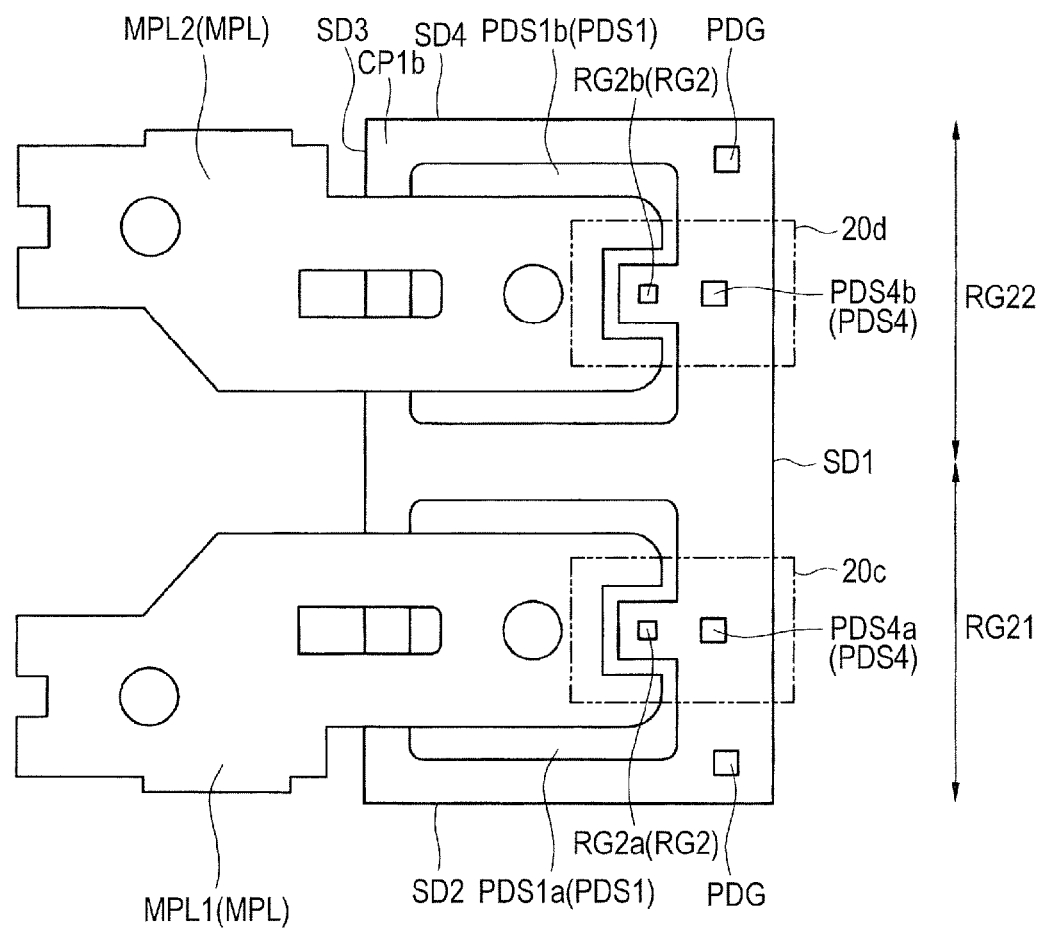
FIG. 42 is a plan view showing a state in which a metal plate is bonded to a semiconductor chip of the second modification.
Figure 43:
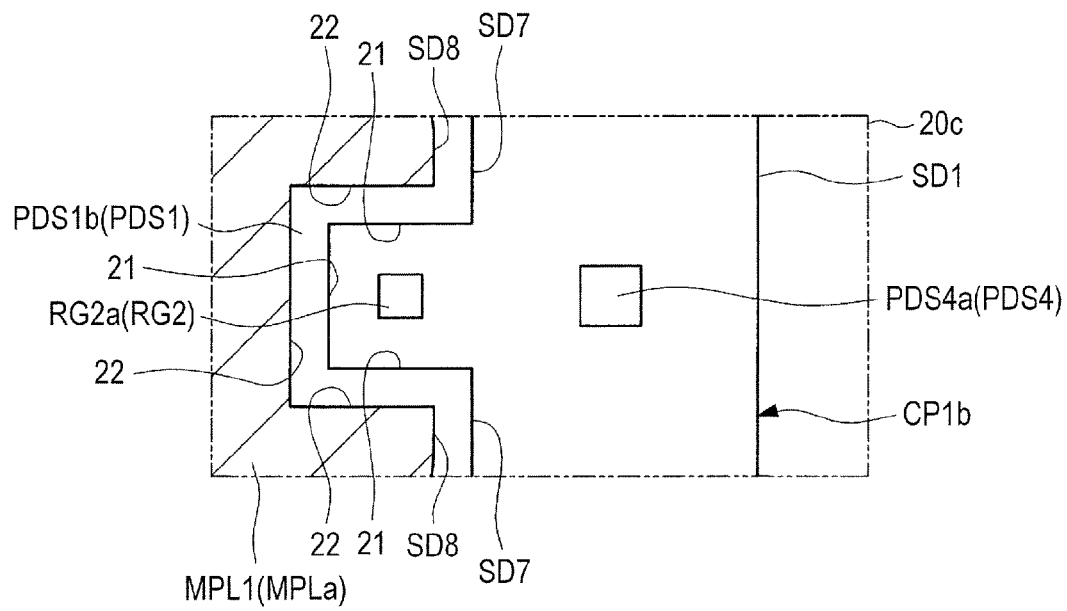
FIG. 43 is a partially enlarged plan view of FIG. 42.
Figure 44:
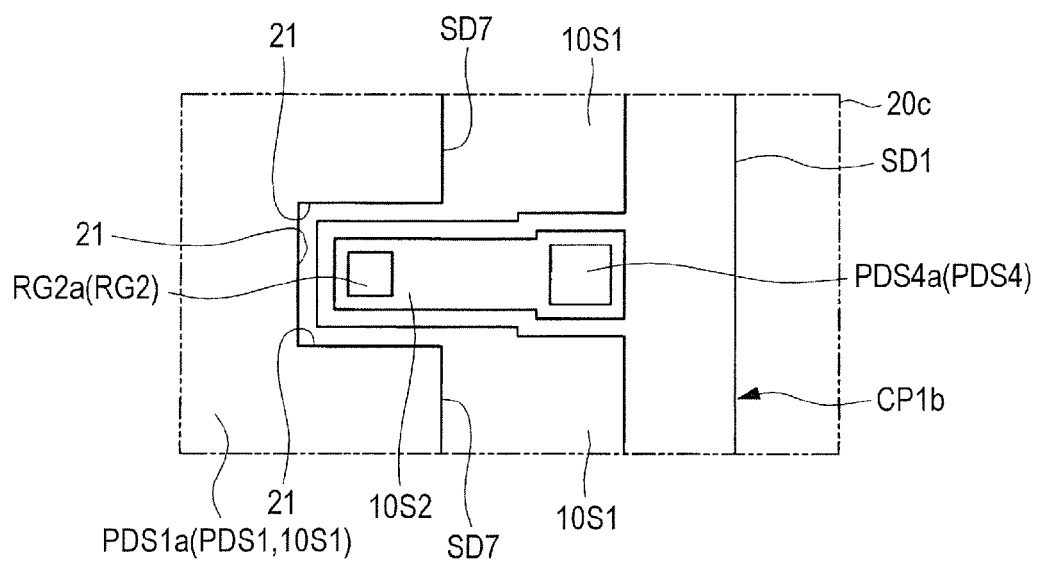
FIG. 44 is a main-portion plan view of the semiconductor chip of the second modification.
Figure 45:
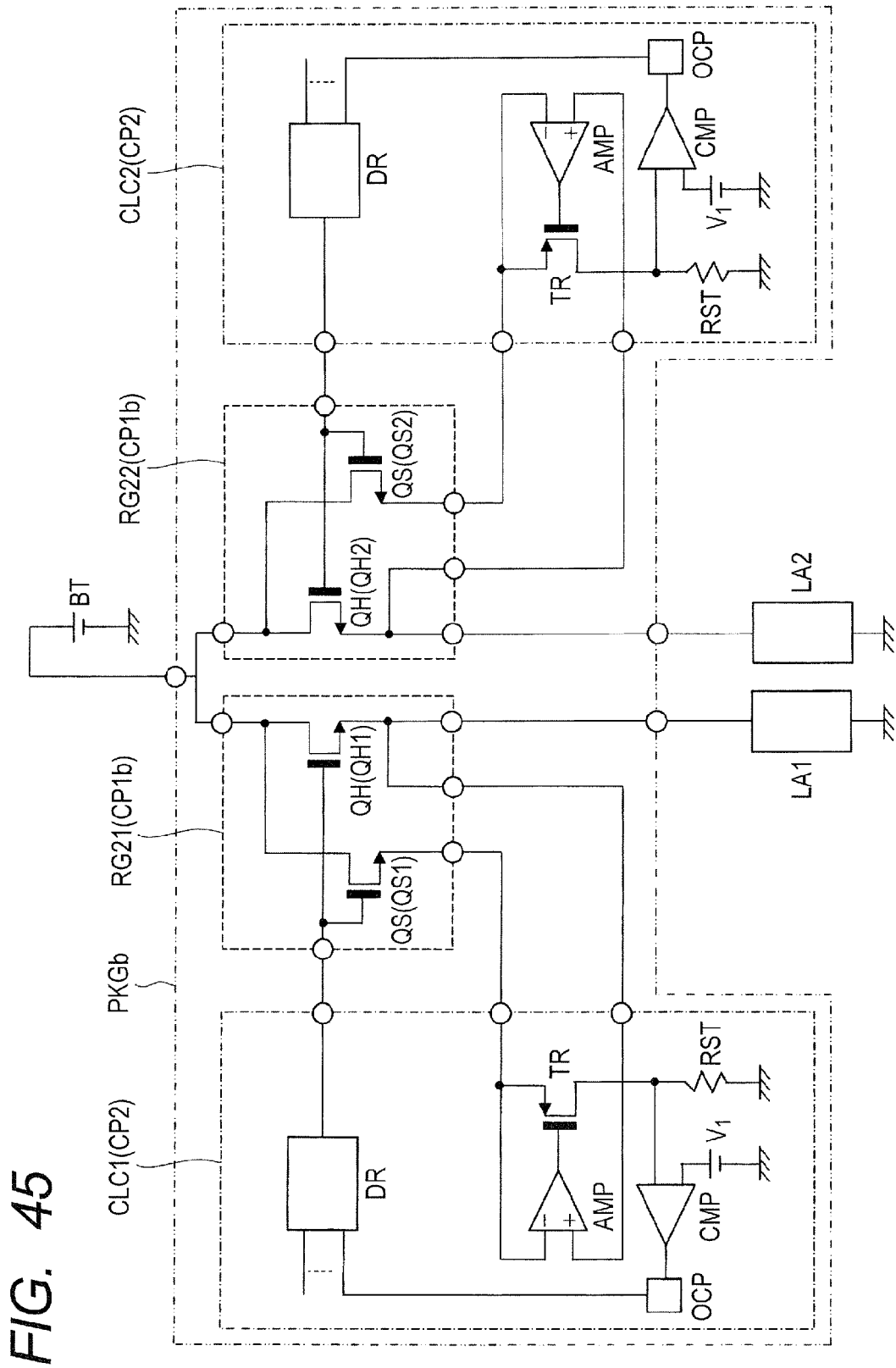
FIG. 45 is a circuit block diagram showing an example of use of the semiconductor device of the second modification.

FIG. 38 is a perspective plan view (top view) of the semiconductor device PKGb, and shows a perspective plan view of the top surface side of the semiconductor device PKGb when the semiconductor device PKGb is viewed through the sealing portion MR. FIGS. 39 to 41 are cross-sectional views of the semiconductor device PKGb. The cross-sectional view of the semiconductor device PKGb at the position along the line C1-C1 of FIG. 38 substantially corresponds to FIG. 39. The cross-sectional view of the semiconductor device PKGb at the position along the line C2-C2 of FIG. 38 substantially corresponds to FIG. 40. The cross-sectional view of the semiconductor device PKGb at the position along the line C3-C3 of FIG. 38 substantially corresponds to FIG. 41. FIG. 42 is a plan view (top view) showing a state in which metal plates MPL1 and MPL2 are bonded to the semiconductor chip CP1b, and corresponds to FIG. 22 described above. It can also be said that FIG. 42 is a view showing only the semiconductor chip CP1b and the metal plates MPL1 and MPL2 in FIG. 38 under magnification. Note that FIG. 42 also shows sense MOSFET regions RG2a and RG2b but, actually, the sense MOSFET regions RG2a and RG2b are covered with the uppermost-layer protective film (corresponding to the foregoing protective film 12) of the semiconductor chip CP1b. FIG. 43 is a partially enlarged plan view obtained by enlarging a region 20c enclosed by the two-dot-dash line in FIG. 42, and corresponds to FIG. 23 described above. FIG. 43 is a plan view but, in FIG. 43, the bonded portion (bonded region) MPLa between the metal plate MPL1 and the pad electrode PDS1 is shown by hatching. Note that a partially enlarged plan view obtained by enlarging a region 20d enclosed by the two-dot-dash line is also the same as FIG. 43. FIG. 44 is a partially enlarged plan view (main-portion plan view) of the semiconductor chip CP1b, and corresponds to FIG. 16 described above. FIG. 44 shows the same two-dimensional region as shown in FIG. 43 but, in FIG. 44, the layout of the sense MOSFET region RG2a, the pad electrode PDS1a, a pad electrode PDS4a, and the source wires 10S1 and 10S2 is shown. FIG. 45 is a circuit diagram (circuit block diagram) of the semiconductor device PKGb. In FIG. 45, the portion enclosed by the two-dot-dash line is formed of the semiconductor device PKGb, the portion enclosed by the dotted line denoted by the mark RG21 is formed of a first MOSFET region RG21 of the semiconductor chip CP1, and the portion enclosed by the dotted line denoted by the mark RG22 is formed of a second MOSFET region RG22 of the semiconductor chip CP1.

The semiconductor device PKGb has 2-channel outputs, and the semiconductor chip CP1b includes the first MOSFET region RG21 and the second MOSFET region RG22. The first MOSFET region RG21 and the second MOSFET region RG22 are disposed to be arranged on both sides (both sides in a direction parallel with the side SD1) of the semiconductor chip CP1b, and electrically isolated from each other by an isolation insulating film (corresponding to the foregoing field insulating film 2). That is, when viewed in two dimensions, about a half of the semiconductor chip CP1b corresponds to the first MOSFET region RG21, and the remaining half thereof corresponds to the second MOSFET region RG22. More specifically, when the semiconductor chip CP1b is equally divided into two sections (regions) between the opposing two sides SD2 and SD4 of the semiconductor chip CP1b in two dimensions, one of the sections corresponds to the first MOSFET region RG21, while the other section corresponds to the second MOSFET region RG22.

The first MOSFET region RG21 has basically the same structure as that of the foregoing semiconductor chip CP1, and the second MOSFET region RG22 also has basically the same structure as that of the foregoing semiconductor chip CP1. That is, the semiconductor chip CP1b has such a configuration as obtained by joining the side SD2 of the foregoing semiconductor chip CP1 and the side SD4 of another of the same semiconductor chip CP1, and integrating the two semiconductor chips CP1 with each other. The first MOSFET region RG21 and the second MOSFET region RG22 have basically the same configurations, but it is also possible to provide the first MOSFET region RG21 and the second MOSFET region RG22 with mirror-symmetrical (mirror-symmetrical with respect to a virtual boundary line between the first MOSFET region RG21 and the second MOSFET region RG22) configurations.

As can be also seen from FIG. 45, the circuit configuration of the semiconductor device PKGb has two systems of the circuit configuration of FIG. 12 described above.

In the first MOSFET region RG21 of the semiconductor chip CP1b, one switch power MOSFET QH (hereinafter referred to as a power MOSFET QH1) and a sense MOSFET QS for sensing a current flowing in the power MOSFET QH1 (hereinafter referred to as a sense MOSFET QS1) are formed. In the second MOSFET region RG22 of the semiconductor chip CP1b, one switch power MOSFET QH (hereinafter referred to as a power MOSFET QH2) and a sense MOSFET QS for sensing a current flowing in the power MOSFET QH2 (hereinafter referred to as a sense MOSFET QS2) are formed. The semiconductor chip CP2 has a control circuit CLC1 for controlling the power MOSFET QH1 and the sense MOSFET QS1 which are formed in the first MOSFET region RG21 of the semiconductor chip CP1b, and a control circuit CLC2 for controlling the power MOSFET QH2 and the sense MOSFET QS2 which are formed in the second MOSFET region RG22 of the semiconductor chip CP1b.

The circuit configuration of the power MOSFET QH1, the sense MOSFET QS1, and the control circuit CLC1 of FIG. 45 is basically the same as the circuit configuration of the power MOSFET QH, the sense MOSFET QS, and the control circuit CLC of FIG. 12 described above. Also, the circuit configuration of the power MOSFET QH2, the sense MOSFET QS2, and the control circuit CLC2 of FIG. 45 is basically the same as the circuit configuration of the power MOSFET QH, the sense MOSFET QS, and the control circuit CLC of FIG. 12 described above.

The drain of the power MOSFET QH1 and the drain of the power MOSFET QH2, which are electrically coupled to the foregoing back-side electrode BE of the semiconductor chip CP1b, are electrically coupled to each other. Therefore, the foregoing back-side electrode BE of the semiconductor chip CP1b is for the drains of the power MOSFETs QH1 and QH2. The drains (common drain) of the power MOSFET QH1 and QH2 are coupled to the power source (such as a battery) BT disposed outside the semiconductor device PKGb. On the other hand, the source of the power MOSFET QH1 and the source of the power MOSFET QH2 are not short-circuited. The source of the power MOSFET QH1 is coupled to a load LA1 disposed outside the semiconductor device PKGb, while the source of the power MOSFET QH2 is coupled to a load LA2 disposed outside the semiconductor device PKGb. The gate of the power MOSFET QH1 is coupled to the driver circuit DR of the control circuit CLC1, while the gate of the power MOSFET QH2 is coupled to the driver circuit DR of the control circuit CLC2.

When the power MOSFET QH1 is brought into the ON state by supplying an ON signal from the driver circuit DR of the control circuit CLC1 to the gate of the power MOSFET QH1, the voltage of the power source BT is outputted from the power MOSFET QH1 and supplied to the load LA1. When the power MOSFET QH1 is brought into the OFF state by supplying an OFF signal from the driver circuit DR of the control circuit CLC1 to the gate of the power MOSFET QH1 (or by stopping the supply of the ON signal), the supply of the voltage from the power source BT to the load LA1 is stopped. When the power MOSFET QH2 is brought into the ON state by supplying an ON signal from the driver circuit DR of the control circuit CLC2 to the gate of the power MOSFET QH2, the voltage of the power source BT is outputted from the power MOSFET QH2 and supplied to the load LA2. When the power MOSFET QH2 is brought into the OFF state by supplying an OFF signal from the driver circuit DR of the control circuit CLC2 to the gate of the power MOSFET QH2 (or by stopping the supply of the ON signal), the supply of the voltage from the power source BT to the load LA2 is stopped. Since the power MOSFETs QH1 and QH2 are independently controlled by the control circuits CLC1 and CLC2, the ON/OFF switching of the power MOSFET QH1 and the ON/OFF switching of the power MOSFET QH2 can be independently controlled.

Thus, the semiconductor device PKGb can function as a switch semiconductor device which performs the ON/OFF switching of the application of the voltage from the power source BT to the load LA1 and the ON/OFF switching of the application of the voltage from the power source BT to the load LA2. The semiconductor chip CP1 can also be regarded as a semiconductor device having 2-system output circuits (i.e., power MOSFET QH1 and power MOSFET QH2).

As the loads LA1 and LS2, any electronic devices (or electronic components) desired to be coupled to the power source BT via the switch semiconductor device PKGb can be used appropriately. At this time, if a pair of electronic devices (or electronic components) desired to be coupled to the same power source BT are used as the loads LA1 and LA2, the semiconductor device PKGb is particularly useful. Otherwise, if a pair of electronic devices (or electronic components) having substantially the same configurations and desired to be independently controlled are used as the loads LA1 and LA2, the semiconductor device PKGb is particularly useful.

In the semiconductor chip CP1b of the semiconductor device PKGb, the sense MOSFET QS1 for sensing a current in the power MOSFET QH1 and the sense MOSFET QS2 for sensing a current in the power MOSFET QH2 are provided. The power MOSFET QH1 and the sense MOSFET QS1 are formed in the first MOSFET region RG21 of the semiconductor chip CP1b, while the power MOSFET QH2 and the sense MOSFET QS2 are formed in the second MOSFET region RG22 of the semiconductor chip CP1b. Specifically, the power MOSFET QH1 is formed in the foregoing main MOSFET region RG1 of the first MOSFET region RG21 of the semiconductor chip CP1b, while the sense MOSFET QS1 is formed in the foregoing sense MOSFET region RG2 (hereinafter referred to as the sense MOSFET region RG2a) of the first MOSFET region RG21 of the semiconductor chip CP1b. On the other hand, the power MOSFET QH2 is formed in the foregoing main MOSFET region RG1 of the second MOSFET region RG22 of the semiconductor chip CP1b, and the sense MOSFET QS2 is formed in the foregoing sense MOSFET region RG2 (hereinafter referred to as the sense MOSFET region RG2b) of the second MOSFET region RG22 of the semiconductor chip CP1b.

In the first MOSFET region RG21 of the semiconductor chip CP1b, the source pad electrode PDS1 (hereinafter referred to as a pad electrode PDS1a) of the power MOSFET QH1 and the source pad electrode PDS4 (hereinafter referred to as a pad electrode PDS4a) of the sense MOSFET QS1 are formed. On the other hand, in the second MOSFET region RG22 of the semiconductor chip CP1b, the source pad electrode PDS1 (hereinafter referred to as a pad electrode PDS1b) of the power MOSFET QH2 and the source pad electrode PDS4 (hereinafter referred to as a pad electrode PDS4b) of the sense MOSFET QS2 are formed. As can be also seen from FIGS. 38 to 42, the same metal plate MPL1 as the foregoing metal plate MPL is coupled to the pad electrode PDS1a and the bonding wire BW is coupled to the pad electrode PDS4a, while the same metal plate MPL2 as the foregoing metal plate MPL is coupled to the pad electrode PDS1b and the bonding wire BW is coupled to the pad electrode PDS4b. In FIG. 42, illustration of the foregoing pad electrodes PDS2 and PDS3 is omitted, but the foregoing pad electrodes PDS2 and PDS3 are also formed in the first MOSFET region RG21 and the second MOSFET region RG22, respectively.

As shown in FIGS. 38 to 40, one of the leads LD1 is electrically coupled to the pad electrode PDS1a of the semiconductor chip CP1b via the metal plate MPL1, while another of the leads LD1 of the semiconductor chip CP1b is electrically coupled to the pad electrode PDS1b via the metal plate MPL2. In the case of FIGS. 38 to 41, the five leads LD1 are disposed over the side surface MRc1 of the sealing portion MR. Of the five leads LD1, two have the inner lead portions thereof that are integrally coupled to each other in the sealing portion MR such that the metal plate MPL1 is coupled thereto via the foregoing adhesive layer BD4, and other two have the inner lead portions thereof that are integrally coupled to each other in the sealing portion MR such that the metal plate MPL2 is coupled thereto via the foregoing adhesive layer BD4. However, the leads LD1 to which the metal plate MPL1 is coupled (i.e., the leads LD1 electrically coupled to the pad electrode PDS1a of the semiconductor chip CP1 through the metal plate MPL1) and the leads LD1 to which the metal plate MPL2 is coupled (i.e., the leads LD1 electrically coupled to the pad electrode PDS1b of the semiconductor chip CP1 through the metal plate MPL2) are not coupled, but are isolated by a resin material forming the sealing portion MR to be electrically insulated from each other. Also, over the side surface MRc1 of the sealing portion MR, the plurality of leads LD1 are disposed. As shown in FIG. 38, the plurality of leads LD1 may also include a dummy lead LD1D which is not electrically coupled to any of the pad electrodes of the semiconductor chips CP1 and CP2.

As can be seen from the comparison between FIGS. 44 and 16 the comparison between FIGS. 43 and 23, the two-dimensional positional relationship between the sense MOSFET region RG2a of the semiconductor chip CP1b and the source pad electrode PDS1a thereof, the two-dimensional positional relationship between the sense MOSFET region RG2a and the metal plate MPL1, and the two-dimensional positional relationship between the sense MOSFET region RG2a and the bonded portion between the metal plate MPL1 and the pad electrode PDS1a are the same as in the case of the foregoing semiconductor chip CP1 (FIGS. 16 and 23). Also, the two-dimensional positional relationship between the sense MOSFET region RG2a and the source pad electrode PDS4a is the same as in the case of the foregoing semiconductor chip CP1 (FIGS. 16 and 23). Also, the two-dimensional positional relationship between the sense MOSFET region RG2b of the semiconductor chip CP1b and the source pad electrode PDS1b thereof, the two-dimensional positional relationship between the sense MOSFET region RG2b and the metal plate MPL2, and the two-dimensional positional relationship between the sense MOSFET region RG2b and the bonded portion between the metal plate MPL2 and the pad electrode PDS1b are the same as in the case of the foregoing semiconductor chip CP1 (FIGS. 16 and 23). Also, the two-dimensional positional relationship between the sense MOSFET region RG2b and the source pad electrode PDS4b is the same as in the case of the foregoing semiconductor chip CP1 (FIGS. 16 and 23). The following is a brief description of a part thereof.

That is, when attention is focused on the two-dimensional positional relationship between the metal plate MPL1 and the sense MOSFET region RG2a, in the plan view, the three sides of the sense MOSFET region RG2a are surrounded by the metal plate MPL1 (in other words, the three sides of the sense MOSFET region RG2a oppose the metal plate MPL1). When attention is also focused on the two-dimensional positional relationship between the pad electrode PDS1a and the sense MOSFET region RG2a, in the plan view, the three sides of the sense MOSFET region RG2a are surrounded by the pad electrode PDS1a (in other words, the three sides of the sense MOSFET region RG2a oppose the pad electrode PDS1a). Briefly, in the plan view, the bonded portion between the metal plate MPL1 and the pad electrode PDS1a surrounds the three sides of the sense MOSFET region RG2a (in other words, the three sides of the sense MOSFET region RG2a oppose the bonded portion between the metal plate MPL1 and the pad electrode PDS1a).

The same holds true for the second MOSFET region RG22. When attention is focused on the two-dimensional positional relationship between the metal plate MPL2 and the sense MOSFET region RG2b, in the plan view, the three sides of the sense MOSFET region RG2b are surrounded by the metal plate MPL2 (in other words, the three sides of the sense MOSFET region RG2b oppose the metal plate MPL2). When attention is also focused on the two-dimensional positional relationship between the pad electrode PDS1b and the sense MOSFET region RG2b, in the plan view, the three sides of the sense MOSFET region RG2b are surrounded by the pad electrode PDS1b (in other words, the three sides of the sense MOSFET region RG2b oppose the pad electrode PDS1b). Briefly, in the plan view, the bonded portion between the metal plate MPL2 and the pad electrode PDS1b surrounds the three sides of the sense MOSFET region RG2b (in other words, the three sides of the sense MOSFET region RG2b oppose the bonded portion between the metal plate MPL2 and the pad electrode PDS1b).

With the arrangement, even when the semiconductor chip CP1b is used, in the same manner as when the foregoing semiconductor chip CP1 is used, it is possible to inhibit or prevent a crack from occurring in the adhesive layer BD1 immediately under each of the sense MOSFET regions RG2a and RG2b. As a result, it is possible to inhibit or prevent the accuracy of sensing the current flowing in the power MOSFET QH1 by means of the sense MOSFET QS1 and the accuracy of sensing the current flowing in the power MOSFET QH2 by means of the sense MOSFET QS2 from being degraded by the foregoing crack 113. This allows an improvement in the accuracy of sensing the current flowing in the power MOSFET QH1 by means of the sense MOSFET QS1 as well as an improvement in the accuracy of sensing the current flowing in the power MOSFET QH2 by means of the sense MOSFET QS2. Therefore, the reliability of the semiconductor device can be improved.

Also, in the same manner as in the foregoing semiconductor chip CP1a, in the first MOSFET region RG21 and the second MOSFET region RG22 of the semiconductor chip CP1b, it is possible to provide the diode region RG3, the anode pad electrode PDA, and the cathode pad electrode PDC.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The present invention is effective when applied to a semiconductor device.

What is claimed is:
1. A semiconductor device, comprising:
a first chip mounting portion having electrical conductivity;
a first semiconductor chip having a first main surface, and a first back surface opposite to the first main surface and bonded to the first chip mounting portion;
a second chip mounting portion;

a second semiconductor chip having a second main surface, and a second back surface opposite to the second main surface and bonded to the second chip mounting portion;

a first lead portion; and a sealing portion sealing therein the first and second semiconductor chips, at least a part of each of the first and second chip mounting portions, and at least a part of the first lead portion, wherein the first semiconductor chip is formed with a first MOSFET and a second MOSFET which have respective drains thereof electrically coupled to each other, and respective gates thereof electrically coupled to each other, wherein the first MOSFET is formed in a first region of the first main surface of the first semiconductor chip, while the second MOSFET is an element for detecting a current flowing in the first MOSFET and is formed in a second region of the first main surface of the first semiconductor chip, wherein a first gate pad electrically coupled to the gates of the first and second MOSFETs, a first source pad electrically coupled to a source of the first MOSFET, and a second source pad electrically coupled to a source of the second MOSFET are formed over the first main surface of the first semiconductor chip, wherein a drain electrode electrically coupled to the drains of the first and second MOSFETs is formed over the first back surface of the first semiconductor chip, wherein the first source pad is electrically coupled to the first lead portion via a conductor plate, and wherein, in the first main surface of the first semiconductor chip, the second region has an area smaller than that of the first region, the conductor plate does not overlap the second region in a plan view, and the conductor plate is bonded to the first source pad of the first semiconductor chip so as to surround three sides of the second region in the plan view.

2. A semiconductor device according to claim 1, wherein the second semiconductor chip is formed with a control circuit for controlling the first and second MOSFETs, and wherein each of the first gate pad and the second source pad is electrically coupled to a pad of the second semiconductor chip via a wire.

3. A semiconductor device according to claim 2, wherein the first semiconductor chip is disposed between the first lead portion and the second semiconductor chip, wherein the first main surface of the first semiconductor chip has a first chip side closer to the second semiconductor chip, and a second chip side opposing the first chip side, wherein, in the first main surface of the first semiconductor chip, the second region is disposed so as to be closer to the first chip side than to the second chip side, and wherein, in the plan view, a first distance between a front end side of the conductor plate opposing the second semiconductor chip and the first chip side is not more than a second distance between the second region and the first chip side.

4. A semiconductor device according to claim 3, wherein the second source pad is disposed closer to the first chip side than the second region.

5. A semiconductor device according to claim 4, wherein a source region of the second MOSFET formed in the second region is electrically coupled to the second source pad via a source wire formed in the first semiconductor chip.

6. A semiconductor device according to claim 5, wherein, in the plan view, the conductor plate is not located between one of the sides of the second region other than the three sides thereof and the first chip side.

7. A semiconductor device according to claim 6, wherein, in the plan view, a part of the conductor plate opposing the second semiconductor chip has a retracted portion which is locally retracted in a direction away from the second semiconductor chip, and wherein the second region is disposed in the retracted portion.

8. A semiconductor device according to claim 7, wherein, in the plan view, the three sides of the second region are surrounded by the first source pad.

9. A semiconductor device according to claim 8, wherein, in the plan view, the three sides of the second region are surrounded by a bonded portion between the first source pad and the conductor plate.

10. A semiconductor device according to claim 9, wherein the first semiconductor chip is bonded to the first chip mounting portion via a conductive first bonding material.

11. A semiconductor device according to claim 10, wherein the first bonding material is comprised of a solder.

12. A semiconductor device according to claim 11, wherein the conductor plate and the first chip mounting portion are each formed of the same material.

13. A semiconductor device according to claim 12, wherein the conductor plate and the first chip mounting portion are each formed of copper or a copper alloy.

14. A semiconductor device according to claim 13, wherein the conductor plate is bonded to the first source pad of the first semiconductor chip via a solder.

15. A semiconductor device according to claim 14, wherein, in a third region of the first main surface of the first semiconductor chip, a diode for sensing heat generated from the first MOSFET is formed, and wherein, in the plan view, the second region and the third region are each disposed in the retracted portion.

* * * * *